United States Patent [19]
Itoi et al.

[11] Patent Number: 5,511,080
[45] Date of Patent: Apr. 23, 1996

[54] PLAYBACK DATA DETECTING METHOD FOR IMPROVING BIT ERROR RATE FOR RANDOM ERROR

[75] Inventors: Satoshi Itoi; Shigeru Araki, both of Tokyo, Japan

[73] Assignee: NEC Corporation, Japan

[21] Appl. No.: 70,103

[22] Filed: May 28, 1993

[30] Foreign Application Priority Data

May 29, 1992 [JP] Japan .................................. 4-164352

[51] Int. Cl.⁶ .............................. H03M 5/14; H03M 5/18; H03M 7/46; H03M 13/00
[52] U.S. Cl. ................................. 371/43; 341/57; 341/59; 341/68; 371/30
[58] Field of Search .......................... 371/43, 30; 341/57, 341/59, 68

[56] References Cited

U.S. PATENT DOCUMENTS

| | | | |
|---|---|---|---|
| 4,847,871 | 7/1989 | Matsushita et al. | 375/94 |
| 5,243,605 | 9/1993 | Lekmine et al. | 371/43 |
| 5,257,272 | 10/1993 | Fredrickson | 371/43 |
| 5,291,499 | 3/1994 | Behrens et al. | 371/43 |

OTHER PUBLICATIONS

G. Ungerboeck, *Channel Coding with Multilevel/Phase Signals*, IEEE Transactions on Information Theory, vol. IT–28, Jan. 1983.

S. Aikawa, et al., *Design Schemes for a High–Speed/Multi–Level Trellis Coded Modulation Viterbi Decoder*, Journal of the Electronic Information Communication Society, vol. J73–A, No. 2, Feb. 1990.

S. Aikawa, et al., *150 KGate General–Purpose High–Coding–Gain TCM VLSIs for High–Speed Multi–Level QAM Systems*, IEEE GLOBECOM '90, vol. 3, 1990.

Primary Examiner—Stephen M. Baker
Attorney, Agent, or Firm—Ostrolenk, Faber, Gerb & Soffen

[57] ABSTRACT

In a Viterbi decoding method, there are four playback states which are state S0, state S1, state S2, and state S3. When the signal e(t) that violates the predetermined state transition rules is inputted, bit error correction is performed by detecting the incorrect state and determined the original state. According to the predetermined state transition rules, for example, when the signal e(t) of "−1" is inputted during state S0, it makes a transition to state S0 and the value of the output signal f(t) is made "0".

25 Claims, 22 Drawing Sheets

FIG. 12
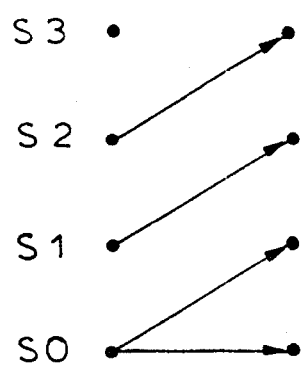
FIG. 14
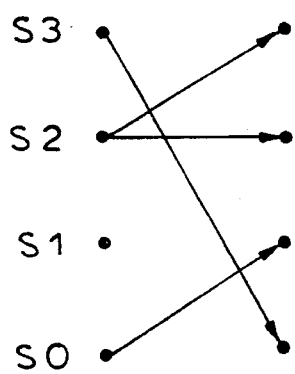
FIG. 13
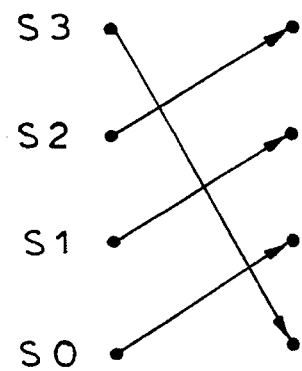
FIG. 15
FIG. 16
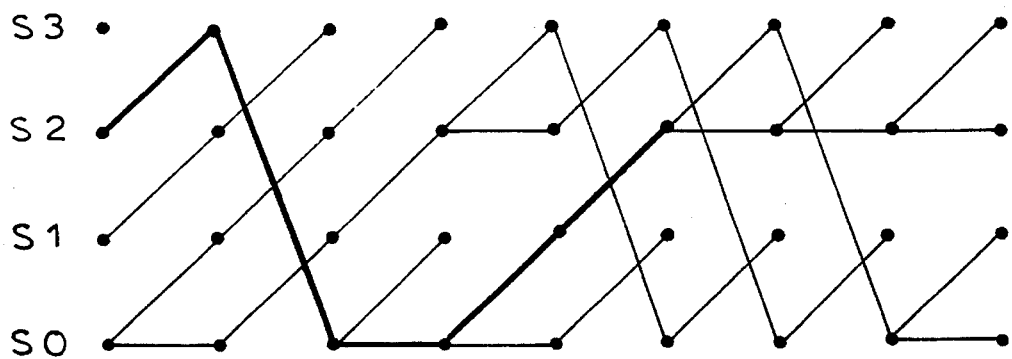

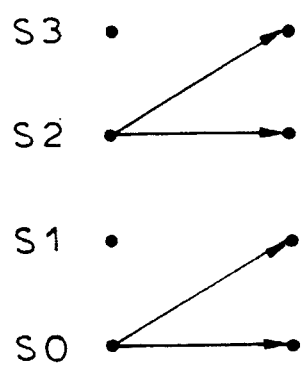
FIG. 26
FIG. 28
FIG. 27
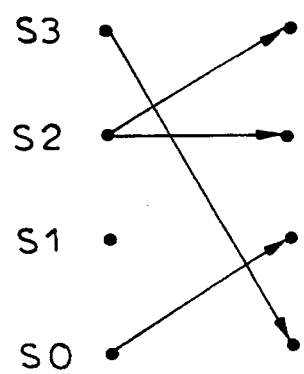
FIG. 29
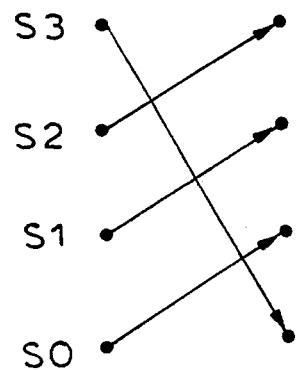
FIG. 30
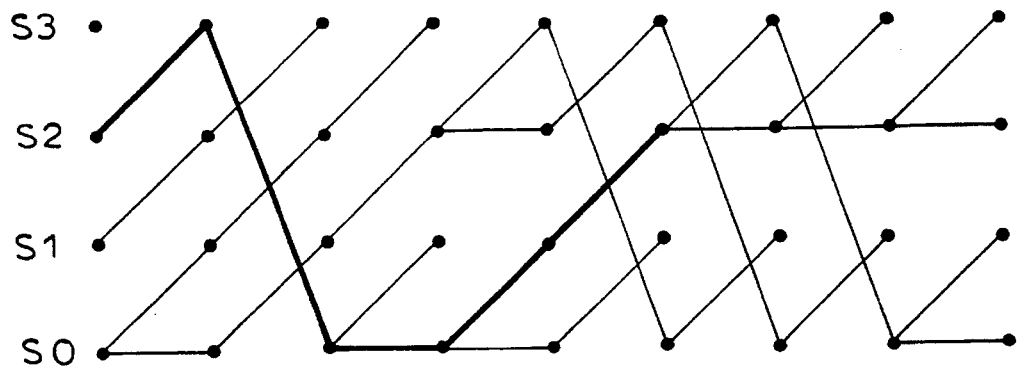

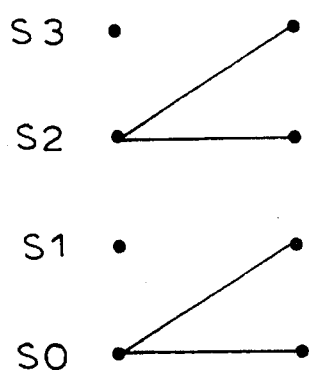
FIG. 43
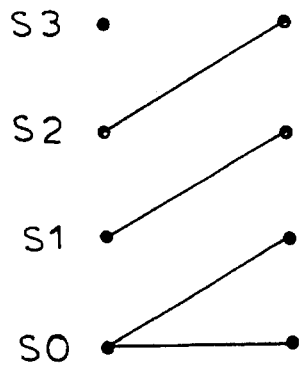
FIG. 45
FIG. 44
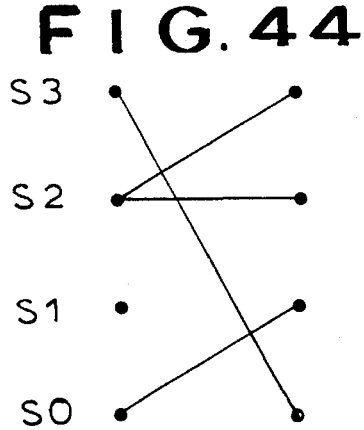
FIG. 46
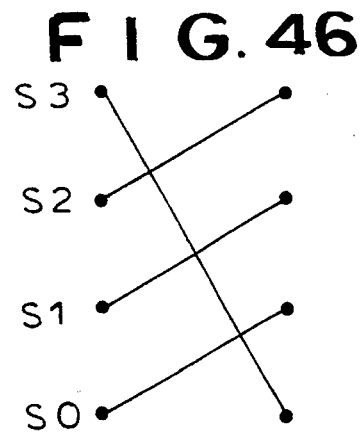
FIG. 47
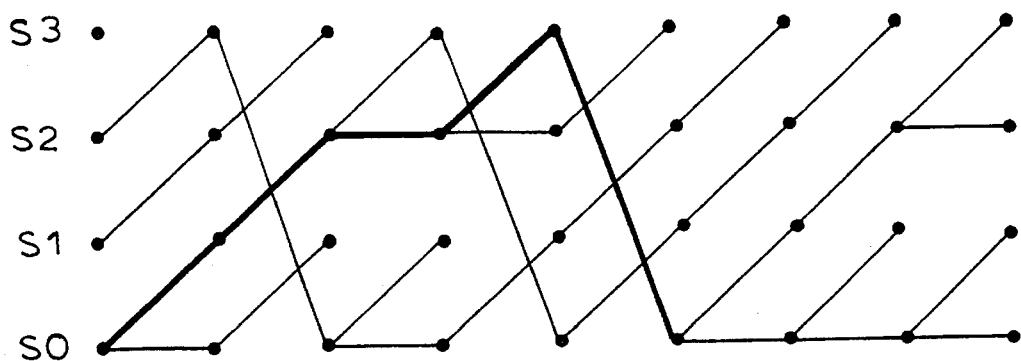

PLAYBACK DATA DETECTING METHOD FOR IMPROVING BIT ERROR RATE FOR RANDOM ERROR

BACKGROUND OF THE INVENTION

The present invention relates to a bit error correcting method employing state transitions in a digital VTR or digital optical disk apparatus and particularly to a playback data detecting method for improving bit error rate for random error.

Generally, in a digital VTR and digital optical disk storage device, the discrimination of digital playback data is carried out by assigning a value of "1" when a playback voltage level exceeds a prescribed threshold voltage and assigning a value of "0" when the playback voltage level does not exceed the prescribed threshold level.

In a digital optical disk apparatus, a detecting method known as a partial response (1, 1)+Viterbi decoding method is employed. As shown in FIG. 1, in the digital optical disk apparatus based on the partial response (1, 1)+Viterbi decoding method, an input signal a(t) shown in FIG. 2(a) is converted to a recording signal b(t) shown in FIG. 2(b) in a pre-coder 10 provided on the recording side. Here, the input signal a(t) is an NRZ (non return to zero recording) signal and the recording signal b(t) is an NRZI (non return to zero inverted recording) signal. The recording signal b(t) is recorded on a tape 11. A playback signal c(t) played back from the tape 11, as shown in FIG. 2(c), consists of positive pulses indicating the leading edges of the recording signal b(t) and negative pulses indicating the trailing edges of the recording signal b(t). After noise is added to the playback signal c(t), it is inputted to a partial response (1, 1) equalizer 12. In the partial response (1, 1) equalizer 12, the detection of the playback data is carried out using the correlations between the encoded data of the playback signal c(t) which is digital playback data. In other words, the partial response (1, 1) equalizer 12 is a conventional device for converting the binary playback signal c(t) to a three-value playback equalized output signal d(t) using a conventional partial response (1, 1) encoding method (also known as a duo-binary encoding method). The playback equalized output signal d(t), after being converted to a signal e(t) shown in FIG. 2(d) by passing through a high-pass filter 13, is inputted to a Viterbi decoder 14.

As shown in FIGS. 3 and 4, the Viterbi decoder 14, taking the playback states as state S0 and state S1, makes a transition to state S0 when the signal e(t) of "–1" is inputted during state S0 and makes the value of the output signal f(t) "0." When the signal e(t) of "0" is inputted during state S0, it makes a transition to state S1 and makes the value of the output signal f(t) a value "1." When the signal e(t) of "1" is inputted during state S1, it makes a transition to state S1 and makes the value of the output signal f(t) "0." When the signal e(t) of "0" is inputted during state S1, it makes a transition to state S0 and makes the value of the output signal f(t) "1." When the signal e(t) violating the above-described state transition rules is inputted, bit error correction is performed by detecting an incorrect state and judging an original state. As a result, the error rate for random errors is improved.

When playing back the signal e(t) of "1" in state S1, the probability $P_{11}$ of detecting a tiny offset $\Delta y$ can be expressed:

$$P_{11}=\Delta y/\{(2\pi)^{1/2}\sigma\}\times\exp\{-y_k^2/(2\sigma^2)\}$$

When playing back the signal e(t) of "0" in State S1, the probability $P_{10}$ of detecting a tiny offset $\Delta y$ can be expressed:

$$P_{10}=\Delta y/\{(2\pi)^{1/2}\}\times\exp\{-(y_k-1)^2/(2\sigma2)\}$$

When playing back the signal e(t) of "1" in State S0, the probability $P_{01}$ of detecting a tiny offset $\Delta y$ can be expressed:

$$P_{01}=\Delta y/\{(2\pi)^{1/2}\sigma\}\times\exp\{-y_k^2/(2\sigma^2)\}$$

When playing back the signal e(t) of "0" in State S0, the probability $P_{00}$ of detecting a tiny offset $\Delta y$ can be expressed:

$$P_{00}=\Delta y/\{(2\pi)^{1/2}\}\times\exp\{-(y_k+1)^2/(2\sigma^2)\}$$

Because the length of the metric can be indicated by the logarithm of the negative value of the probabilities, the product of the probability can be expressed as the sum of the logarithm of the negative value of the probability (in other words, the sum of the lengths of the metrics).

$$\begin{aligned}-\log_e(P_{11}) &= -\log_e(P_{01}) \\ &= y_k^2/(2\sigma^2) - \log_e[\Delta y/\{(2\pi)^{1/2}\sigma\}]\end{aligned}$$

$$-\log_e(P_{10})=(y_k-1)^2/(2\sigma^2)-\log_e[\Delta y/\{(2\pi)^{1/2}\sigma\}]$$
$$-\log_e(P_{00})=(y_k+1)^2/(2\sigma^2)-\log_e[\Delta y/\{(2\pi)^{1/2}\sigma\}]$$

The metric will hereinafter be dealt with not as an absolute value but a relative value of length, and the standardized metrics $l_{00}, l_{01}, l_{10}, l_{11}$ are defined as shown in the following formulas:

$$\begin{aligned}l_{11} &= l_{01} \\ &= [2\sigma^2\{-\log_e(P_{11})+\log_e(\Delta y/((2\pi)^{1/2}\sigma))\}-y_k^2]/2\end{aligned}$$

$$l_{10}=[2\sigma^2\{-\log_e(p_{10})+\log_e(\Delta y/((2\pi)^{1/2}\sigma))\}-y_k^2]/2$$
$$l_{00}=[2\sigma^2\{-\log_e(P_{00})+\log_e(\Delta y/((2\pi)^{1/2}\sigma))\}-y_k^2]/2$$

and as a result:

$$l_{11}=l_{01}=0$$
$$l_{10}=y_k+0.5$$
$$l_{00}=y_k+0.5$$

Here, if a sample value of the playback signal at time n is $y_n$ and the state metrics of state S1 and state S0 at time n are $m_n(S1)$ and $m_n(S0)$, respectively, then:

$$\begin{aligned}m_n(S1) &= \min[m_{n-1}(S1)+l_{10}, m_{n-1}(S0)+l_{01}] \\ &= \min[m_{n-1}(S1)-y_n+0.5, m_{n-1}(S0)] \\ m_n(S0) &= \min[m_{n-1}(S1)-l_{11}, m_{n-1}(S0)+l_{00}] \\ &= \min[m_{n-1}(S1), m_{n-1}(S0)+y_n+0.5]\end{aligned}$$

At this time, merge 0, merge 1, and merge 2 are defined as follows:

<merge 0>
when $m_{n-1}(S1)-m_{n-1}(S0) > y_n+0.5$,
$$\begin{aligned}m_n(S1) &= m_{n-1}(S0) \\ &= m_{n-1}(S0)+l_{01} \text{ and} \\ m_n(S0) &= m_{n-1}(S0)+y_n+0.5 \\ &= m_{n-1}(S0)+l_{00};\end{aligned}$$

and the trellis diagram is as shown in FIG. 6:

<merge 1>
when $y_n + 0.5 \geq m_{n-1}(S1) - m_{n-1}(S0) \geq y_n - 0.5$,
$m_n(S1) = m_{n-1}(S0)$
$= m_{n-1}(S0) + l_{01}$ and
$m_n(S0) = m_{n-1}(S1)$
$= m_{n-1}(S1) + l_{11}$;

and the trellis line figure is as shown in FIG. 7:

<merge 2>
when $y_n - 0.5 > m_{n-1}(S1) - m_{n-1}(S0)$,
$m_n(S1) = m_{n-1}(S1) - y_n + 0.5$
$= m_{n-1}(S1) + l_{10}$ and
$m_n S0) = m_{n-1}(S1)$
$= m_{n-1}(S1) + l_{11}$;

and the trellis line figure is as shown in FIG. 8.

When the playback data is "y" ($-1 \leq y \leq 1$), "y+0.5" and "−y+0.5" are calculated from the playback data and merges are judged as follows:

(1) merge 0
when m(S1)−m(S0)≧y+0.5,
m(S1)=m(S0) and
m(S0)=m(S0)+y+0.5:
(2) merge 1
when y−0.5<m(S1)−m(S0)<y+0.5,
m(S1)=m(S0) and
m(S0)=m(S1):
(3) merge 2
when m(S1)−m(S0 <y−0.5,
m(S1)=m(S0)−y+0.5 and
m(S0)=m(S1).

The path is then merged and the most apparently definite path is judged beginning from the point in time of merging the path and progressing towards the past. In the field of communications engineering, this method of path determination is known as the "Viterbi decoding method." Here, in merge 1, even if the path configuration is sought at time n, because the path is not merged at the point of time preceding, the path is not merged at that point in time and the value of the output signal cannot be obtained. However, when merge 0 or merge 2 are generated, the path is merged and the corresponding output signal can be obtained. FIG. 9 is a diagram showing one series of path merging for two states of Viterbi decoding. When the path is merged in this series, the value of the output signal is made "0" for a transition from state S0 to state S0 and a transition from state S1 to state S1, and the value of the output signal is made "1" for a transition from state S0 to state S1 and a transition from state S1 to state S0, and in this manner, the output signal is produced.

This type of conventional, generally-used bit-by-bit determination gives rise to the special characteristics of digital recording and has the advantages of straightforward logic and simple circuitry. Nevertheless, when errors occur in which the threshold in the playback voltage is barely exceeded, bit errors are generated. In addition, once an error has occurred, it is corrected in an error-correcting circuit block, and it not possible to correct it in a discrimination playback circuit block. Further, a partial response (1, 1) detection+two-state Viterbi decoding method that uses the relation of the encoding interval of the playback signal carries out correction of bit errors by using relations based on the three values of the playback signal. Accordingly, in an encoding conversion method that records by converting data bits to channel bits while constraining the number of continuous non-inverse bits within a range of a minimum of "2," an improvement in error rate is achieved by bit error correction when comparing the determination bit by bit, but because this method does not take advantage of the correlation that is generated by constraining the number of continuous non-inverse bits within a range of a minimum of "2," it cannot be said that the potential of the originally recorded codes is being fully used, and there is consequently room for further improvement of the bit error rate. The term "non-inverse bits" as used in the specification and claims means any sequence of bits in which the bits do not change. For example, with regard to "0011100011", inverse bits means "--01--" or "-10--" and non-inverse bits means "--00--" or "--11--". Non-inverse bits within a range of a minimum of 2 means to continue the same bit ("0" or "1") within a range of a minimum of 2.

SUMMARY OF THE INVENTION

The object of the present invention is to provide a playback data detecting method that allows further improvement of bit error rate.

Other objects of the present invention will become obvious from the following description.

In accordance with an aspect of the present invention, there is provided a playback data detecting method for producing a playback data according to a Viterbi decoding method using a playback signal from a recording medium, for a recording data recorded to the recording medium after having been converted to channel bits while constraining the number of continuous non-inverse bits within a range of a minimum of "2" comprising: a step of decoding the playback signal using four playback states.

BRIEF DESCRIPTION OF THE DRAWINGS

The features and advantages of the present invention will become apparent from the following description when taken in conjunction with the accompanying drawings in which:

FIG. 12 is a trellis diagram of merge 0;

FIG. 13 is a trellis diagram of merge 1;

FIG. 14 is a trellis diagram of merge 2;

FIG. 15 is a trellis diagram of merge 3;

FIG. 16 is a diagram showing one series of path merging illustrating the Viterbi decoding method according to a first embodiment of the playback data detecting method of the present invention;

FIG. 26 shows a trellis diagram of merge 0;

FIG. 27 shows a trellis diagram of merge 1;

FIG. 28 shows a trellis diagram of merge 2;

FIG. 29 shows a trellis diagram of merge 3;

FIG. 30 shows a series of path merges for the purpose of illustrating the Viterbi decoding method according to the second embodiment of a playback data detecting method of the present invention;

FIG. 43 shows a trellis diagram of merge 0;

FIG. 44 shows a trellis diagram of merge 1;

FIG. 45 shows a trellis diagram of merge 2;

FIG. 46 shows a trellis diagram of merge 3;

FIG. 47 shows a series of path merges for the purpose of illustrating the Viterbi decoding method according to the fourth embodiment of a playback data detecting method of the present invention.

DETAILED DESCRIPTION OF THE PREFERRED EMBODIMENTS

Figure 1:
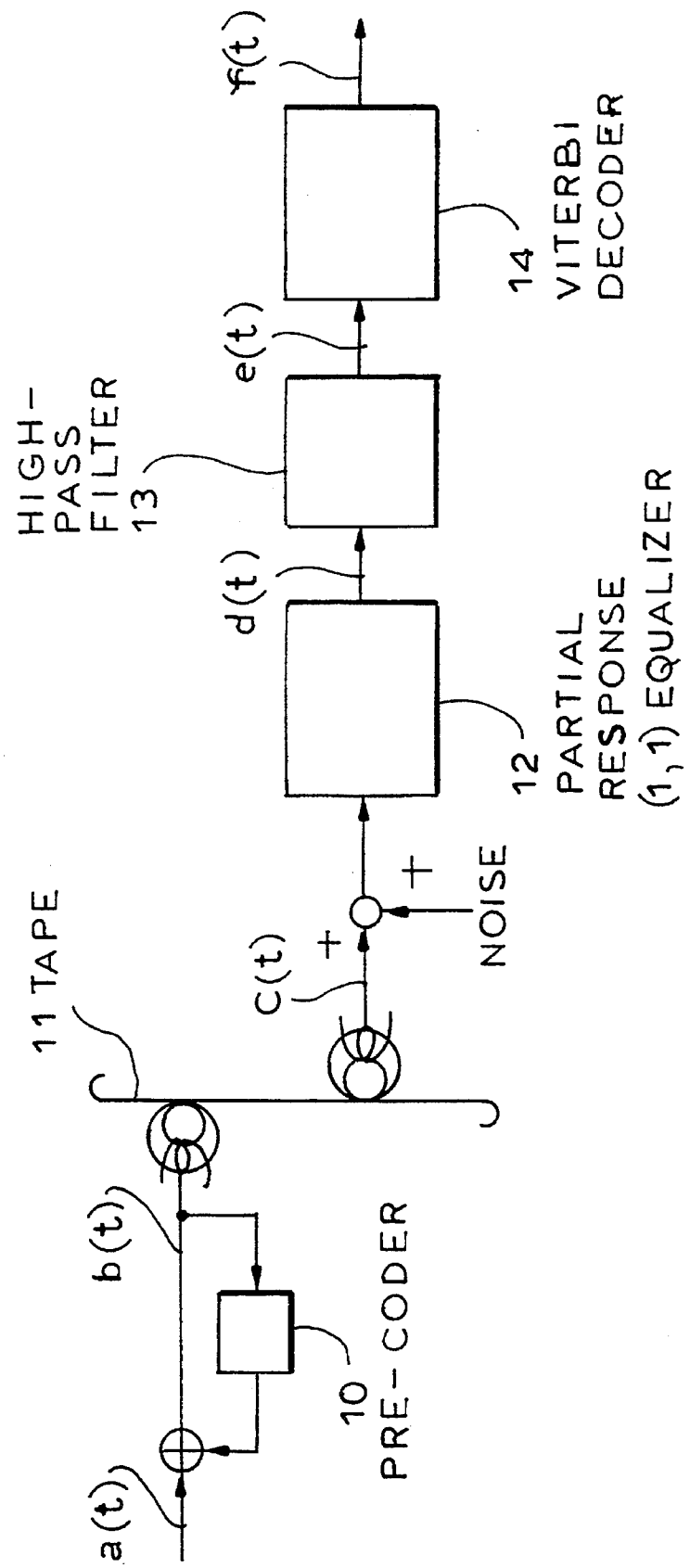
FIG. 1 is a block diagram showing one example of the composition of a digital optical disk apparatus based on a partial response (1, 1)+Viterbi decoding method.
Figure 2:
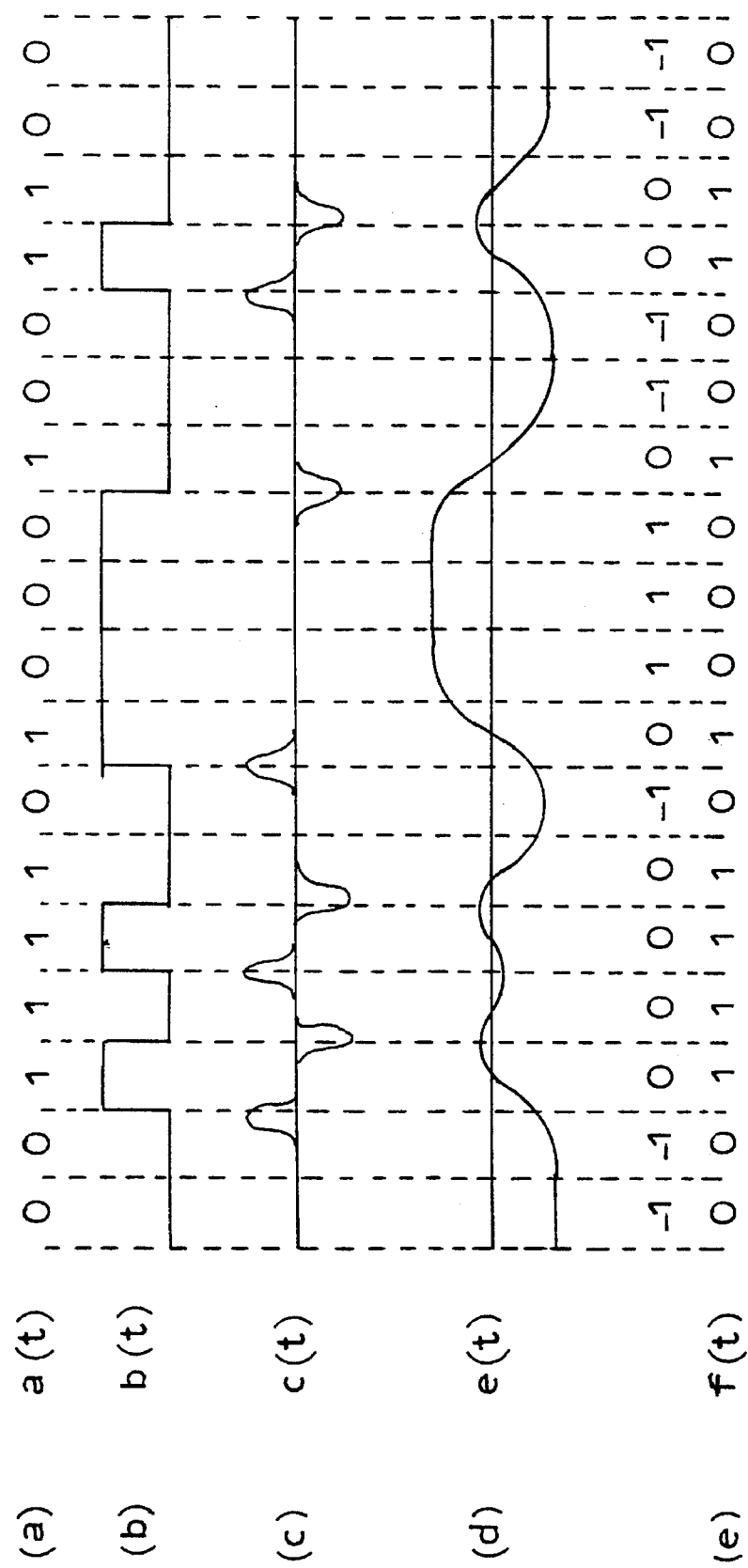
FIG. 2 is a timing chart illustrating the operation of the digital optical disk apparatus shown in FIG. 1.
Figure 3:
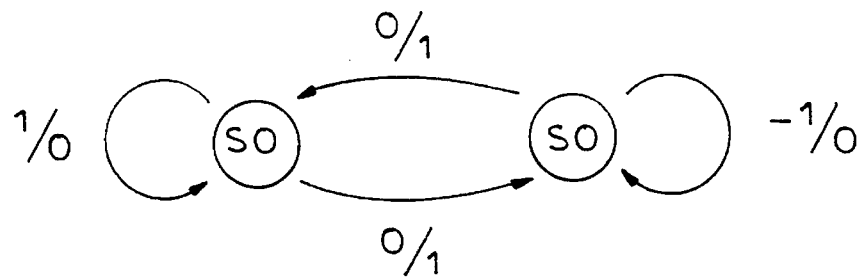
FIG. 3 is a state transition diagram illustrating the operation of the Viterbi decoder shown in FIG. 1.
Figure 4:
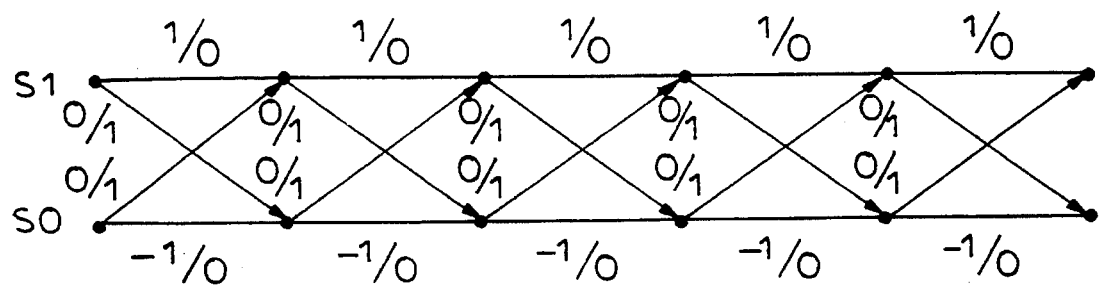
FIG. 4 is a trellis diagram illustrating the operation of the Viterbi decoder shown in FIG. 1.
Figure 5:
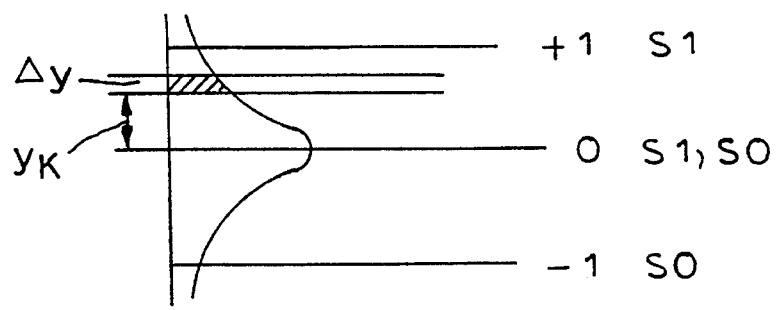
FIG. 5 shows the probability of playback of data.
Figure 6:
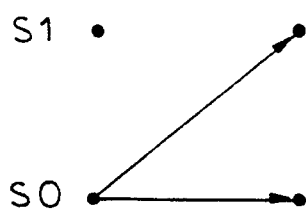
FIG. 6 shows the trellis diagram of merge 0.
Figure 7:
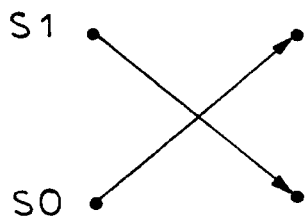
FIG. 7 shows the trellis diagram of merge 1.
Figure 8:
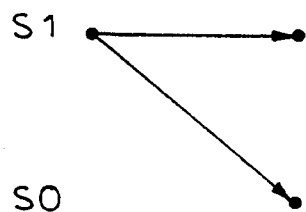
FIG. 8 shows the trellis diagram of merge 2.
Figure 9:
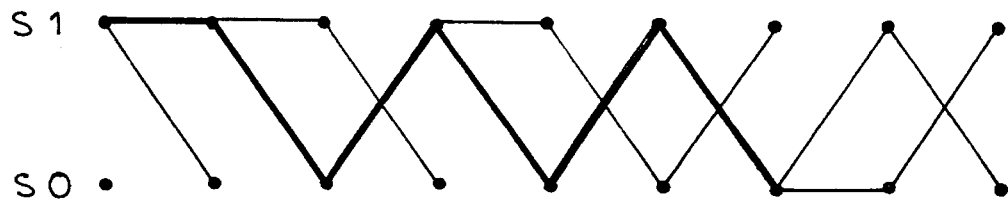
FIG. 9 shows one series of path merging in a two-state Viterbi decoder.
Figure 10:
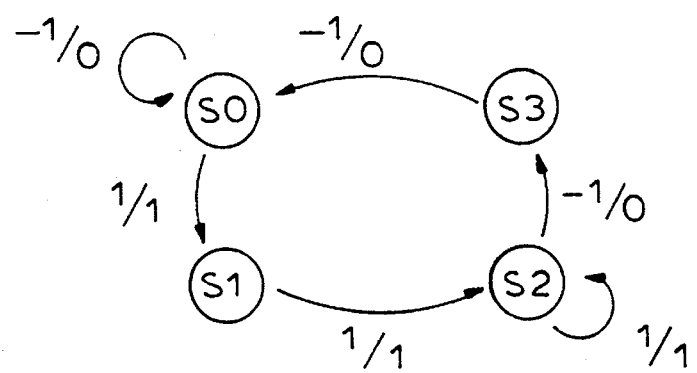
FIG. 10 is a state transition diagram illustrating the Viterbi decoding method according to a first embodiment of the playback data detecting method of the present invention.
Figure 11:
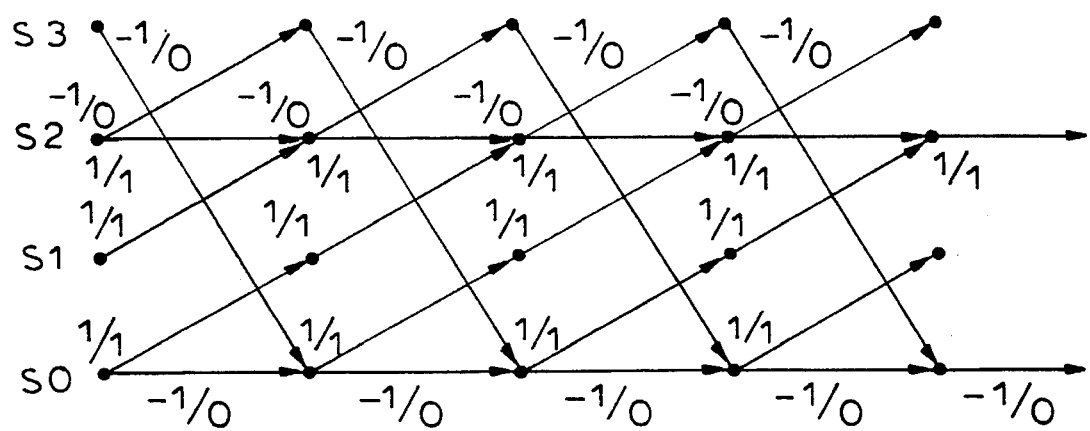
FIG. 11 is a trellis diagram illustrating the Viterbi decoding method according to a first embodiment of the playback data detecting method of the present invention.

A Viterbi decoding method according to the first embodiment of the playback data detecting method of the present invention takes as its object producing the playback data according to an NRZI method. As shown in the state transition chart of FIG. 10 and the trellis diagram of FIG. 11, the playback states are four states which are state S0, state S1, state S2, and state S3. When the signal e(t) of "−1" is inputted during state S0, it makes a transition to state S0 and the value of the output signal f(t) is made "0." When the signal e(t) of "1" is inputted during state S0, it makes a transition to state S1 and the value of the output signal f(t) is made "1." When the signal e(t) of "1" is inputted during state S1, it makes a transition to state S2 and the value of the output signal f(t) is made "1." When the signal e(t) of "1" is inputted during state S2, it makes a transition to state S2 and the value of the output signal f(t) is made "1." When the signal e(t) of "−1" is inputted during state S2, it makes a transition to state S3 and the value of the output signal f(t) is made "0." When the signal e(t) of "−1" is inputted during state S3, it makes a transition to state S0 and the value of the output signal f(t) is made "0." When the signal e(t) violating the above-described state transition rules is inputted, bit error correction is performed by detecting an incorrect state and judging an original state. As a result, the error rate of random errors is improved. The state transition chart shown in FIG. 10 and the trellis diagram shown in FIG. 11 are, respectively, a state transition chart and a trellis diagram corresponding to the recording data for which the number of continuous non-inverse bits is constrained within a range of a minimum of "2."

In the same manner as for the method described in FIGS. 1 through 9, standardized metrics $l_{00}, l_{01}, l_{12}, l_{22}, l_{23}, l_{30}$ are found to be as follows:

$l_{00} = y_k$ $l_{01} = y_k$ $l_{12} = y_k$ $l_{22} = y_k$ $l_{23} = y_k$ $l_{30} = y_k$

Here, when the sample value of the playback signal at time n is $y_n$ and the state metrics of states S2, S1, and S0 are $m_n(S3), m_n(S2), m_n(S1)$, and $m_n(S0)$, respectively; state metrics $m_n(S3), m_n(S2), m_n(S1)$, and $m_n(S0)$ are expressed as follows:

$$m_n(S3) = m_{n-1}(S2) + l_{23}$$
$$= m_{n-1}(S2) + y_n$$
$$m_n(S2) = \min[m_{n-1}(S2) + l_{23}, m_{n-1}(S1) + l_{12}]$$
$$= \min[m_{n-1}(S2) - y_n, m_{n-1}(S1) - y_n]$$
$$m_n(S1) = m_{n-1}(S0) + l_{01}$$
$$= m_{n-1}(S0) - y_n$$
$$m_n(S0) = \min[m_{n-1}(S0) + l_{00}, m_{n-1}(S3) + l_{30}]$$
$$= \min[m_{n-1}(S0) + y_n, m_{n-1}(S3) + y_n]$$

At this time, merge 0, merge 1, merge 2, and merge 3 are defined as follows:

<merge 0>
when $m_{n-1}(S2) < m_{n-1}(S1)$ and $m_{n-1}(S0) < m_{n-1}(S3)$,
$m_n(S3) = m_{n-1}(S2) + y_n$,
$m_n(S2) = m_{n-1}(S2) - y_n$,
$m_n(S1) = m_{n-1}(S0) - y_n$, and
$m_n(S0) = m_{n-1}(S0) + y_n$;
and the trellis diagram is as shown in FIG. 12:

<merge 1>
when $m_{n-1}(S2) < m_{n-1}(S1)$ and $m_{n-1}(S0) \geq m_{n-1}(S3)$,
$m_n(S3) = m_{n-1}(S2) + y_n$,
$m_n(S2) = m_{n-1}(S2) - y_n$,
$m_n(S1) = m_{n-1}(S0) - y_n$, and
$m_n(S0) = m_{n-1}(S3) + y_n$;
and the trellis diagram is as shown in FIG. 13:

<merge 2>
when $m_{n-1}(S2) \geq m_{n-1}(S1)$ and $m_{n-1}(S0) < m_{n-1}(S3)$,
$m_n(S3) = m_{n-1}(S2) + y_n$,
$m_n(S2) = m_{n-1}(S1) - y_n$,
$m_n(S1) = m_{n-1}(S0) - y_n$, and
$m_n(S0) = m_{n-1}(S0) + y_n$;
and the trellis diagram is as shown in FIG. 14:

<merge 3>
when $m_{n-1}(S2) \geq m_{n-1}(S1)$ and $m_{n-1}(S0) \geq m_{n-1}(S3)$,
$m_n(S3) = m_{n-1}(S2) + y_n$,
$m_n(S2) = m_{n-1}(S1) - y_n$,
$m_n(S1) = m_{n-1}(S0) - y_n$, and
$m_n(S0) = m_{n-1}(S3) + y_n$;
and the trellis diagram is as shown in FIG. 15.

Consequently, when the playback data conforms to "y" ($-1 \leq y \leq 1$), merges are judged as follows:

(1) merge 0
When $m(S2) < m(S1)$ and $m(S0) < m(S3)$,
$m(S3) = m(S2) + y$,
$m(S2) = m(S2) - y$,
$m(S1) = m(S0) - y$, and
$m(S0) = m(S0) + y$:

(2) merge 1
When $m(S2) < m(S1)$ and $m(S0) \geq m(S3)$,
$m(S3) = m(S2) + y$,
$m(S2) = m(S2) - y$,
$m(S1) = m(S0) - y$, and
$m(S0) = m(S3) + y$:

(3) merge 2
When $m(S2) \geq m(S1)$ and $m(S0) < m(S3)$,
$m(S3) = m(S2) + y$,
$m(S2) = m(S1) - y$,
$m(S1) = m(S0) - y$, and
$m(S0) = m(S0) + y$:

(4) merge 3
When $m(S2) \geq m(S1)$ and $m(S0) \geq m(S3)$,
$m(S3) = m(S2) + y$,
$m(S2) = m(S1) - y$,
$m(S1) = m(S0) - y$, and
$m(S0) = m(S3) + y$.

Subsequently, according to which of (1) or (2) below is generated, the path is merged and the output data corresponding to the playback data is obtained(1)

(1) When a path connecting three consecutive states is (merge 0 or merge 1)—merge 1—(merge 0 or merge 1), the path is merged with state S2.

(2) When a path connecting three consecutive states is (merge 0 or merge 2)—merge 2—(merge 0 or merge 2), the path is merged with state S0.

One series of path merges is shown in FIG. 16.

One state is obtained by merging the path as described above. As a result, the output data can be obtained by making the output data corresponding to state S0 or state S3 a value "0" and the output data corresponding to state S1 or state S2 a value "1." In this manner, bit error correcting for random errors can be carried out.

Next will be described a Viterbi decoder by which the above described Viterbi decoding method can be actually realized. The Viterbi decoder includes an A/D convertor circuit (not shown), a data input circuit 30 shown in FIG. 17, a merge operation circuit 40 shown in FIG. 18, a path merge operation circuit shown in FIG. 19, and a path memory circuit 60 shown in FIG. 20.

The A/D convertor circuit is provided for the purpose of analog-to-digital converting the output signal e(t) of the high-pass filter (see FIG. 1) provided on the preceding level of the Viterbi decoder and of producing 4-bit digital data. The produced 4-bit digital data is inputted to the respective input terminal of the four input terminals ADI3–ADI0 of the data input circuit 30.

Figure 17:
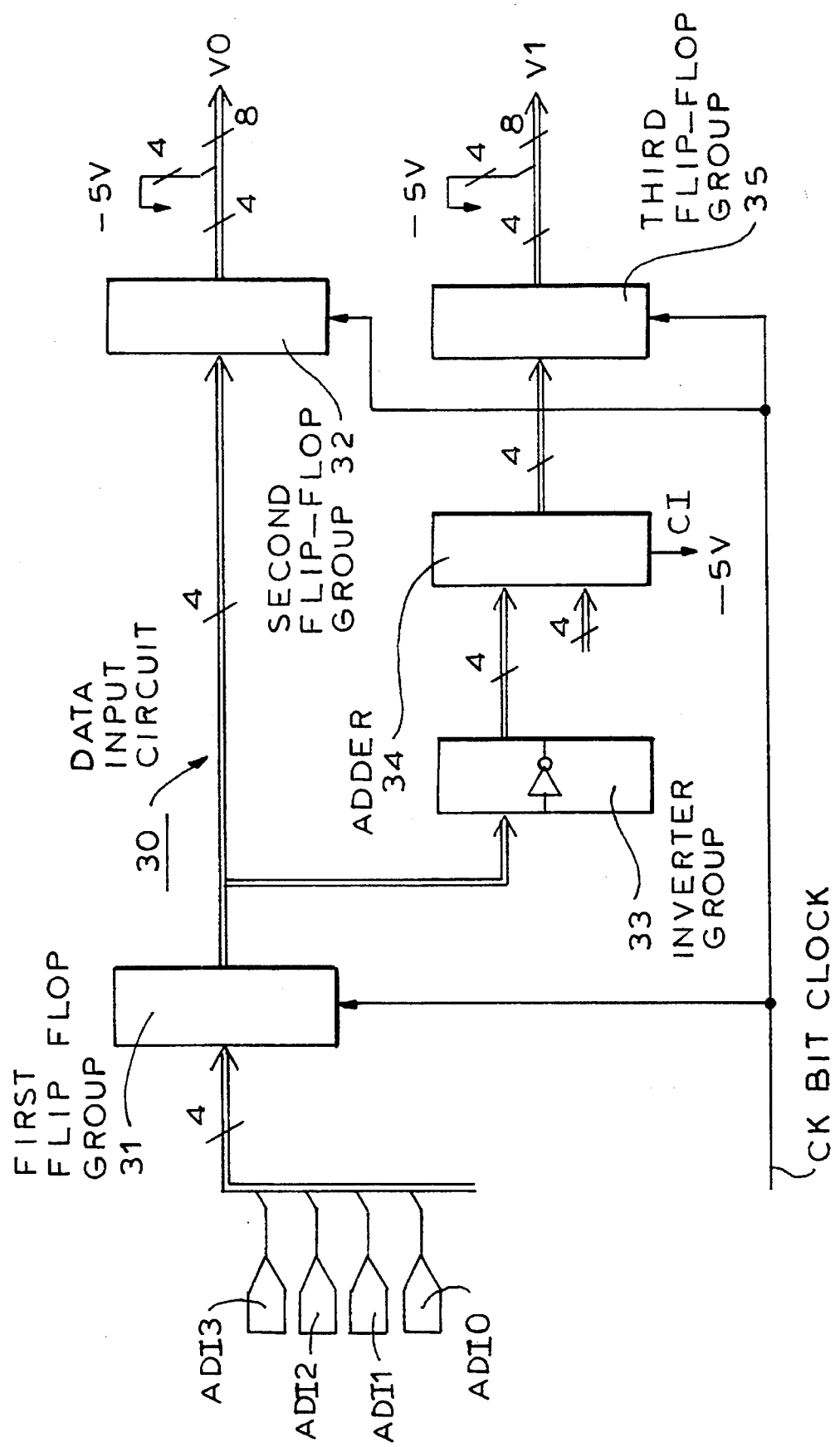
FIG. 17 is a block diagram of a data input circuit.

The data input circuit 30 is provided for the purpose of producing 8-bit playback data y and 8-bit inverted playback data −y from the 4-bit digital data and a bit clock CK. The data input circuit 30, as shown in FIG. 17, includes a first flip-flop group 31 made up of four flip-flops, a second flip-flop group 32 made up of four flip-flops, an inverter group 33 made up of four inverters, an adder 34, and a third flip-flop group 35 made up of four flip-flops. The 4-bit digital data, after being taken into the first flip-flop group 31 with the bit clock CK, is taken into the second flip-flop group 32 with the bit clock CK. The 4-bit digital data outputted from the second flip-flop group 32 makes up the lower four bits of a playback data signal V0 that indicates the 8-bit playback data y. In addition, the upper four bits of the playback data signal V0 are composed of 4-bit data of the four data lines connected to the −5 V power source (not shown).

The polarity of the 4-bit digital data outputted from the first flip-flop group 31 is inverted by the inverter group 33 and then added to 4-bit data (1111) in the adder 34. The output signal from the adder 34 is taken into the third flip-flop group 35 with the bit clock CK. The 4-bit digital data outputted from the third flip-flop group 35 makes up the lower four bits of an inverted playback data signal V1 that indicates the 8-bit inverted playback data −y. In addition, the upper four bits of the inverted playback signal V1 are composed of the 4-bit data of the respective four data lines connected to the −5 V power source (not shown).

Figure 18:
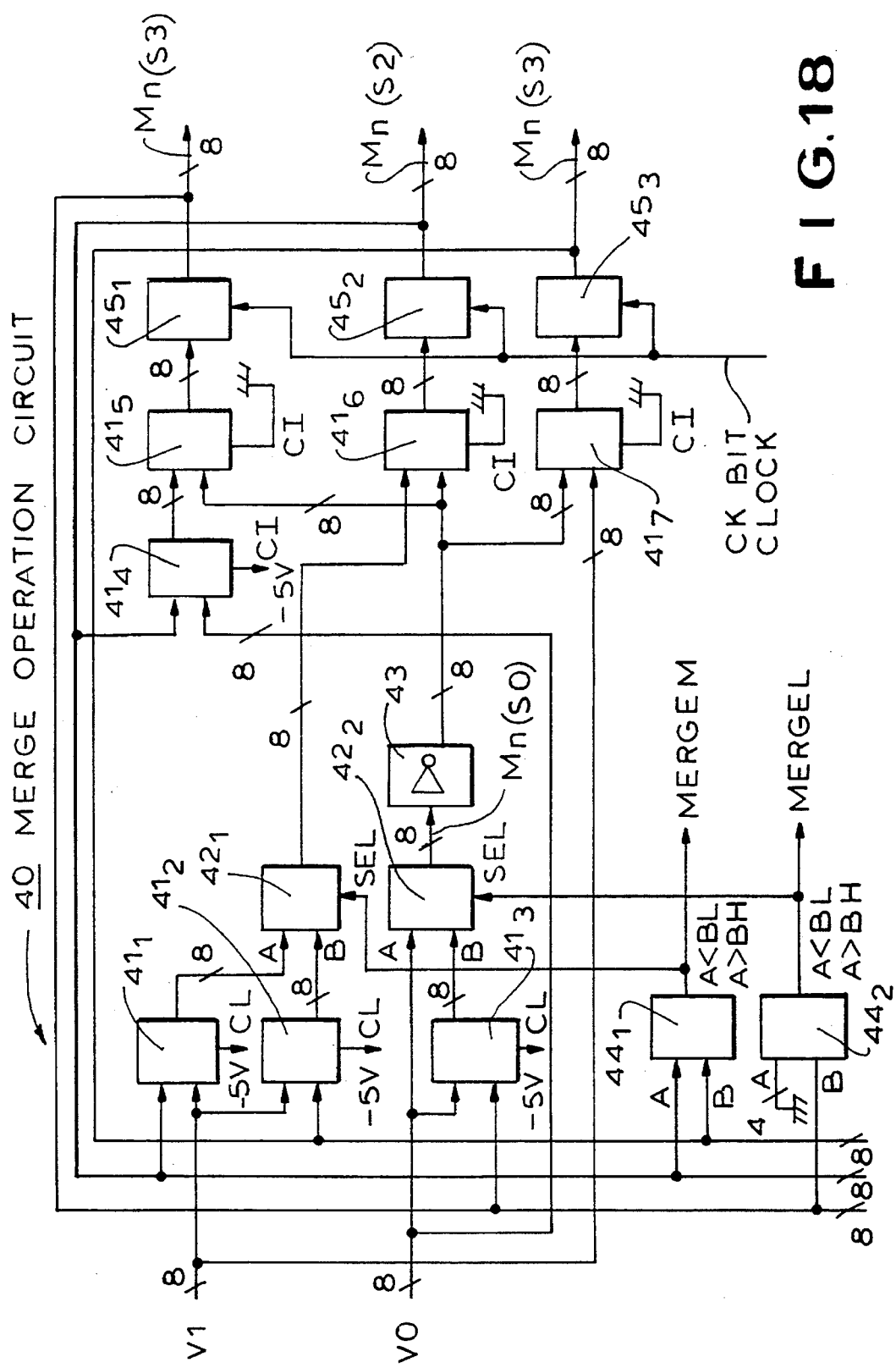
FIG. 18 is a block diagram of a merge operation circuit.

The merge operation circuit 40 is provided for the purpose of calculating each of state metrics $m_n(S3)$, $m_n(S2)$, $m_n(S1)$, $m_n(S0)$ of respective states S3, S2, S1, S0 and of determining the merge. The merge operation circuit 40, as shown in FIG. 18, includes a first adder $41_1$, a second adder $41_2$, a third adder $41_3$, a first multiplexer $42_1$, a second multiplexer $42_2$, an inverter group 43 made up of eight inverters, a first comparator $44_1$, a second comparator $44_2$, a fourth adder $41_4$, a fifth adder $41_5$, a first flip flop group $45_1$ made up of eight flip-flops, a sixth adder $41_6$, a second flip-flop group $45_2$ made up of eight flip-flops, a seventh adder $41_7$, and a third flip-flop group $45_3$ made up of eight flip-flops. Because the relative value of the state metric value is important, state metric $m_n(S0)$ of state S0 is made "0" and state metrics $m_n(S3)$, $m_n(S2)$, and $m_n(S1)$ of the remaining states S3, S2 and S1 are each found by calculating the relative value with state metric $m_n(S0)$ of state S0. In FIG. 18, the state metrics of states S3, S2, and S1 will, for the sake of convenience, be indicated by $m_n(S3)$, $m_n(S2)$, $m_n(S1)$, and $m_n(S0)$.

The output signal of the first flip-flop group $45_1$, which indicates state metric $m_{n-1}(S3)$ of state S3 at time n–1, is inputted to the first comparator $44_2$. An output signal MERGEL of the second comparator $44_2$ becomes high level when $m_{n-1}(S3) \leq 0$ (in other words, $m_{n-1}(S3) \leq m_{n-1}(S0)$) and low level when $m_{n-1}(S3) > 0$ (in other words, $m_{n-1}(S3) > m_{n-1}(S0)$). The output signal of the second flip-flop group $45_2$ which indicates state metric $m_{n-1}(S2)$ of state S2 at time n–1 and the output signal of the third flip-flop group $45_3$ which indicates state metric $m_{n-1}(S1)$ of state S1 at time n–1 are each inputted to the first comparator $44_1$. An output signal MERGEM of the first comparator $44_1$ becomes high level when $m_{n-1}(S2) \geq m_{n-1}(S1)$ and low level when $m_{n-1}(S2) < m_{n-1}(S1)$.

The playback data signal V0 sent from the data input circuit 30 to the merge operation circuit 40 is inputted to the third adder $41_3$ and by addition with state metric $m_{n-1}(S3)$ of state S3 at time n–1, "$m_{n-1}(S3)+y_n$" is found. The playback data signal V0 and the output signal of the third adder $41_3$ which indicates "$m_{n-1}(S3)+y_n$" are each inputted to the second multiplexer $42_2$. At the second multiplexer $42_2$, the playback data signal V0 ($=y_n$) is selected when the output signal MERGEL of the second comparator $44_2$ is low level (in other words, $m_{n-1}(S3) > 0$), and the output signal of the third adder $41_3$ (in other words, "$m_{n-1}(S3)+y_n$") is selected when the output signal MERGEL of the second comparator $44_2$ is high level (in other words, $m_{n-1}(S3) \leq 0$). The output signal of the second multiplexer $42_2$ becomes state metric $m_n(S0)$ of state S0 at time n.

The inverted playback data signal V1 sent from the data input circuit 30 to the merge operation circuit 40 is inputted to the seventh adder $41_7$ and added to state metric $m_n(S0)$ inputted by way of the inverter group 43 to the adder $41_7$. In this way, subtraction is carried out of the inverted playback data signal V1 and state metric $m_n(S0)$ of state S0 at the time n. The output signal of the seventh adder $41_7$ is taken into the third flip-flop group $45_3$ with the bit clock CK. The output signal of the third flip-flop group $45_3$ becomes state metric $m_n(S1)$ of state S1 at time n.

The inverted playback data signal V1 is inputted to the first adder $41_1$ and the second adder $41_2$. At the first adder $41_1$, addition is performed of the inverted playback data signal V1 and state metric $m_{n-1}(S2)$ of state S2 at time n–1, and in this way "$m_{n-1}(S2)-y_n$" can be found. At the second adder $41_2$, addition is performed of the inverted playback data signal V1 and state metric $m_{n-1}(S1)$ of state S1 at time n–1, and in this way "$m_{n-1}(S1)-y_n$" can be found. The output signal of the first adder $41_1$ and the output signal of the second adder $41_2$ are each inputted to the first multiplexer $42_1$. At the first multiplexer $42_1$, when the output signal MERGEM of the first comparator $44_1$ is high level (in other words, $m_{n-1}(S2) \geq m_{n-1}(S1)$), the output signal of the second adder $41_2$ (in other words, "$m_{n-1}(S1)-y_n$") is selected, and when the output signal MERGEM of the first comparator $44_1$ is low level (in other words, $m_{n-1}(S2) < m_{n-1}(S1)$), the output signal of the first adder $41_1$ (in other words, "$m_{n-1}(S2)-y_n$") is selected. The output signal of the first multiplexer $42_1$ is inputted to the sixth adder $41_6$ and added to state metric $m_n(S0)$ of state S0 at the time n which is inputted to the adder $41_6$ by way of the inverter group 43. The output signal of the sixth adder $41_6$ is taken into the second flip-flop group $45_2$ with the bit clock CK. The output signal of the second flip-flop group $45_2$ becomes state metric $m_n(S2)$ of state S2 at time n.

The playback data signal V0 is inputted to the fourth adder $41_4$, and by addition with state metric $m_{n-1}(S2)$ of state S2 at time n–1, "$m_{n-1}(S2)+y_n$" can be found. The output signal of the fourth adder $41_4$ is inputted to the fifth adder $41_5$, and through addition with state metric $m_n(S0)$ of state S0 at the time n which is inputted to the fifth adder $41_5$ by way of the inverter group 43, "$m_{n-1}(S2)+y_n-m_n(S0)$" can be found. The output signal of the fifth adder $41_5$ is taken into the first flip-flop group $45_1$ with the bit clock CK. The output signal of the first flip-flop group $45_1$ becomes state metric $m_n(S3)$ of state S3 at time n.

In other words, in the merge operation circuit 40, the following operations are carried out:

<merge 0>
when $m_{n-1}(S2) < m_{n-1}(S1)$ and $0 < m_{n-1}(S3)$, after $m_n(S0) = y_n$,
$m_n(S3) = m_{n-1}(S2) + y_n - m_n(S0)$,
$m_n(S2) = m_{n-1}(S2) - y_n - m_n(S0)$, and
$m_n(S1) = -y_n - m_n(S0)$:

<merge 1>
when $m_{n-1}(S2) < m_{n-1}(S1)$ and $0 \geq m_{n-1}(S3)$,
after $m_n(S0) = m_n(S3) + y_n$,
$m_n(S3) = m_{n-1}(S2) + y_n - m_n(S0)$,
$m_n(S2) = m_{n-1}(S2) - y_n - m_n(S0)$, and
$m_n(S1) = -y_n - m_n(S0)$:

<merge 2>
when $m_{n-1}(S2) \geq m_{n-1}(S1)$ and $0 < m_{n-1}(S3)$, after $m_n(S0) = y_n$,
$m_n(S3) = m_{n-1}(S2) + y_n - m_n(S0)$,
$m_n(S2) = m_{n-1}(S2) - y_n - m_n(S0)$, and
$m_n(S1) = m_{n-1}(S0) - y_n - m_n(S0)$:

<merge 3>
when $m_{n-1}(S2) \geq m_{n-1}(S1)$ and $0 \geq m_{n-1}(S3)$, after $m_n(S0) = m_n(S3) + y_n$,
$m_n(S3) = m_{n-1}(S2) + y_n - m_n(S0)$,
$m_n(S2) = m_{n-1}(S1) - y_n - m_n(S0)$, and
$m_n(S1) = m_{n-1}(S0) - y_n - m_n(S0)$.

In this manner, merge 0, merge 1, merge 2, and merge 3 can be realized in the Viterbi decoding method according to the first embodiment of the playback data detecting method of the present invention described above.

Figure 19:
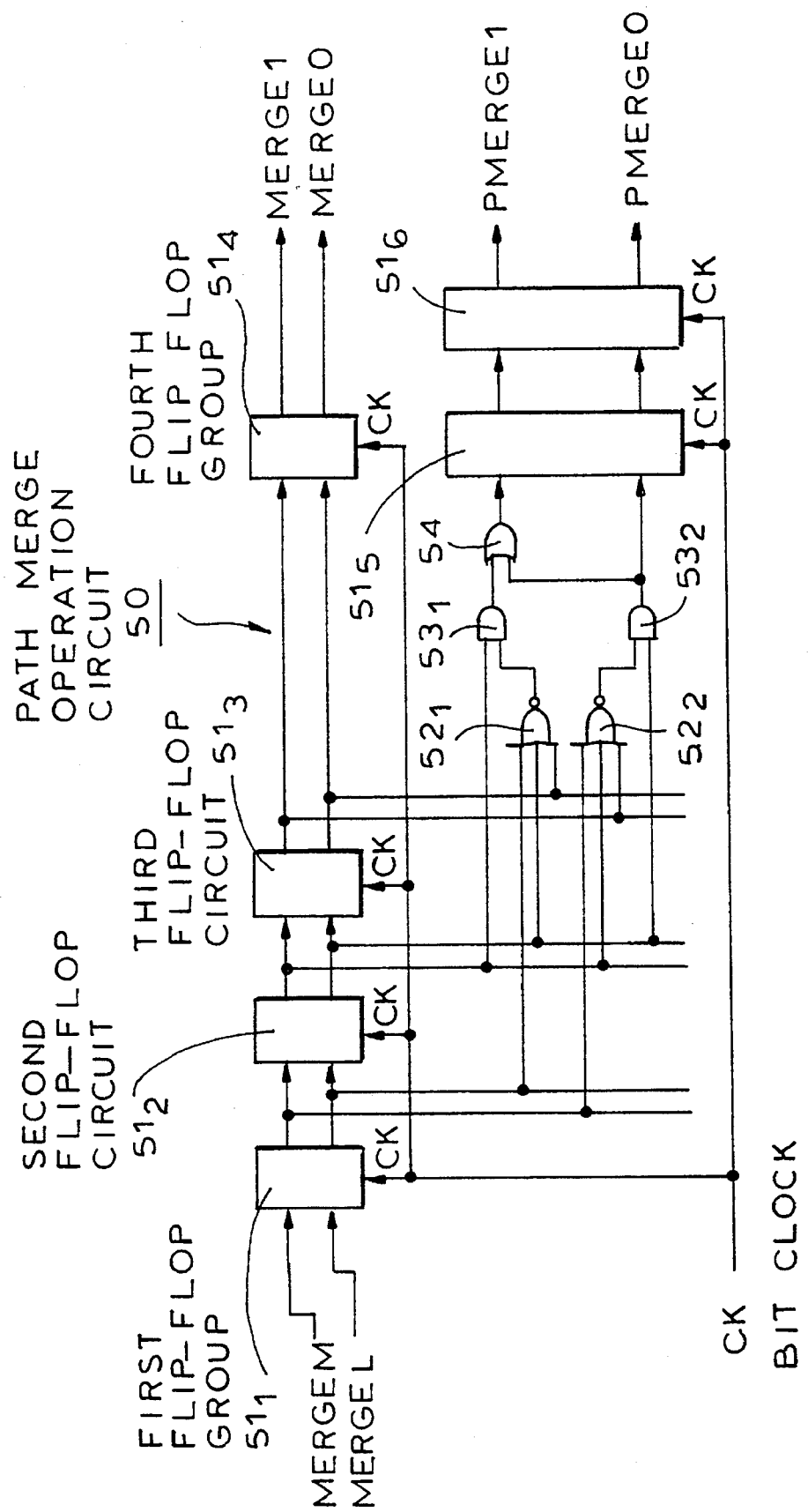
FIG. 19 is block diagram of a path merge operation circuit.

As shown in FIG. 19, the path merge operation circuit 50 includes a first flip-flop group $51_1$ made up of two flip-flops, a second flip-flop group $51_2$ made up of two flip-flops, a third flip-flop group $51_3$ made up of two flip-flops, a fourth flip-flop group $51_4$ made up of two flip-flops, a first 3NOR circuit $52_1$, a second 3NOR circuit $52_2$, a first 2AND circuit $53_1$, a second 2AND circuit $53_2$, a 2OR circuit 54, a fifth flip-flop group $51_5$ made up of two flip-flops, and a sixth flip-flop group $51_6$ made up two flip flops.

The signal MERGEM and the signal MERGEL sent from the merge operation circuit 40 to the path merge operation circuit 50 are sequentially taken into the first flip-flop group $51_1$, the second flip-flop group $51_2$, the third flip-flop group $51_3$, and the fourth flip-flop group $51_4$ with the bit clock CK, following which they are sent from the fourth flip-flop group $51_4$ to the path memory circuit 60 as the signal MERGE1 and the signal MERGE0. The output signals corresponding to the signal MERGEM of the first flip-flop group $51_1$, the second flip-flop group $51_2$, and the third flip-flop group $51_3$ are each inputted to the second 3NOR circuit $52_2$ and the logical sum of these signals is taken. The output signal of the second 3NOR circuit $52_2$ is inputted to the second 2AND circuit $53_2$, and the logical product is taken with the output signal corresponding to the signal MERGEL of the second flip-flop group $51_2$. The output signal of the second 2AND circuit $53_2$ is sequentially taken into the fifth flip-flop group $51_5$ and the sixth flip-flop group $51_6$ with the bit clock CK, following which they are sent from the sixth flip-flop group $51_6$ to the next level path memory circuit 60 as the signal PMERGE0.

The output signals corresponding to the signal MERGEL of the first flip-flop group $51_1$, the second flip-flop group $51_2$ and the third flip-flop group $51_3$ are each inputted to the first 3NOR circuit $52_1$ and the logical sum of these signals is taken. The output signal of the first 3NOR circuit $52_1$ is inputted to the first 2AND circuit $53_1$ and the logical product is taken with the output signal corresponding to the signal MERGEM of the second flip-flop group $51_2$. The output signal of the first 2AND circuit $53_1$ is inputted to the 2OR circuit $5_4$ and the logical sum is taken with the output signal of the second 2AND circuit $53_2$. The output signal of the 2OR circuit 54 is sequentially taken into the fifth flip-flop group $51_5$ and the sixth flip-flop group $51_6$ with the bit clock CK, following which it is sent to the path memory circuit 60 as the signal PMERGE1.

The signal PMERGE1 and the signal PMERGEL0 have the values shown in Table 1 that accord with the values of the output signals corresponding to the signal MERGEM and the signal MERGEL of the first flip-flop group $51_1$, the second flip-flop group $51_2$, and the third flip-flop group $51_3$. In addition, in Table 1, the values of the output signals corresponding to the signal MERGEM and the signal MERGEL of the first flip-flop group $51_1$, the second flip-flop group $51_2$, and the third flip-flop group $51_3$ are represented as "transitions of the signal MERGE1, MERGE0."

TABLE 1

| TRANSITIONS OF SIGNAL MERGE1, MERGE0 | | TRANSITION OF MERGE | PMERGE1 | PMERGE0 | PATH MERGE |
| --- | --- | --- | --- | --- | --- |
| MERGE1 | X 1 X | merge(0,2) - merge(2) - merge(0,2) | 1 | 0 | S0 |
| MERGE0 | 0 0 0 | | | | merge |
| MERGE1 | 0 0 0 | merge(0,1) - merge(1) - merge(0,1) | 1 | 1 | S2 |
| MERGE0 | X 1 X | | | | merge |
| Other Cases | | Other Cases | 0 | 0 | through |
| Inhibit | | Inhibit | 0 | 1 | Inhibit |

Note 1: Merge (0,2) indicates merge (0) or merge (2)
Note 2: Merge (0,1) indicates merge (0) or merge (1)

According to Table 1, when the merges make the transitions (merge 0, 2)—merge 2—(merge 0, 2), the value of the signal PMERGE1 is "1" (high level) and the value of the signal PMERGE0 is "0" (low level). At this time, the path merge in the path memory circuit 60 on the next level is made S0 merge. When the merges make the transitions (merge 0, 1)—merge 1—(merge 0, 1), the value of the signal PMERGE1 and the value of the signal PMERGE0 are both "1" (high level). At this time, the path merge in the path memory circuit 60 on the next level is made S2 merge. When the merges make transitions other than those shown above, the value of the signal PMERGE1 and the value of the signal PMERGE0 are both "0" (low level). At this time, the path merge in the path memory circuit 60 is made "through." However, when the merges make inhibited transitions, the value of the signal PMERGE1 is "0" (low level) and the value of the signal PMERGE0 is "1" (high level). At this time, the path merge in the path memory circuit 60 is inhibited.

Figure 20:
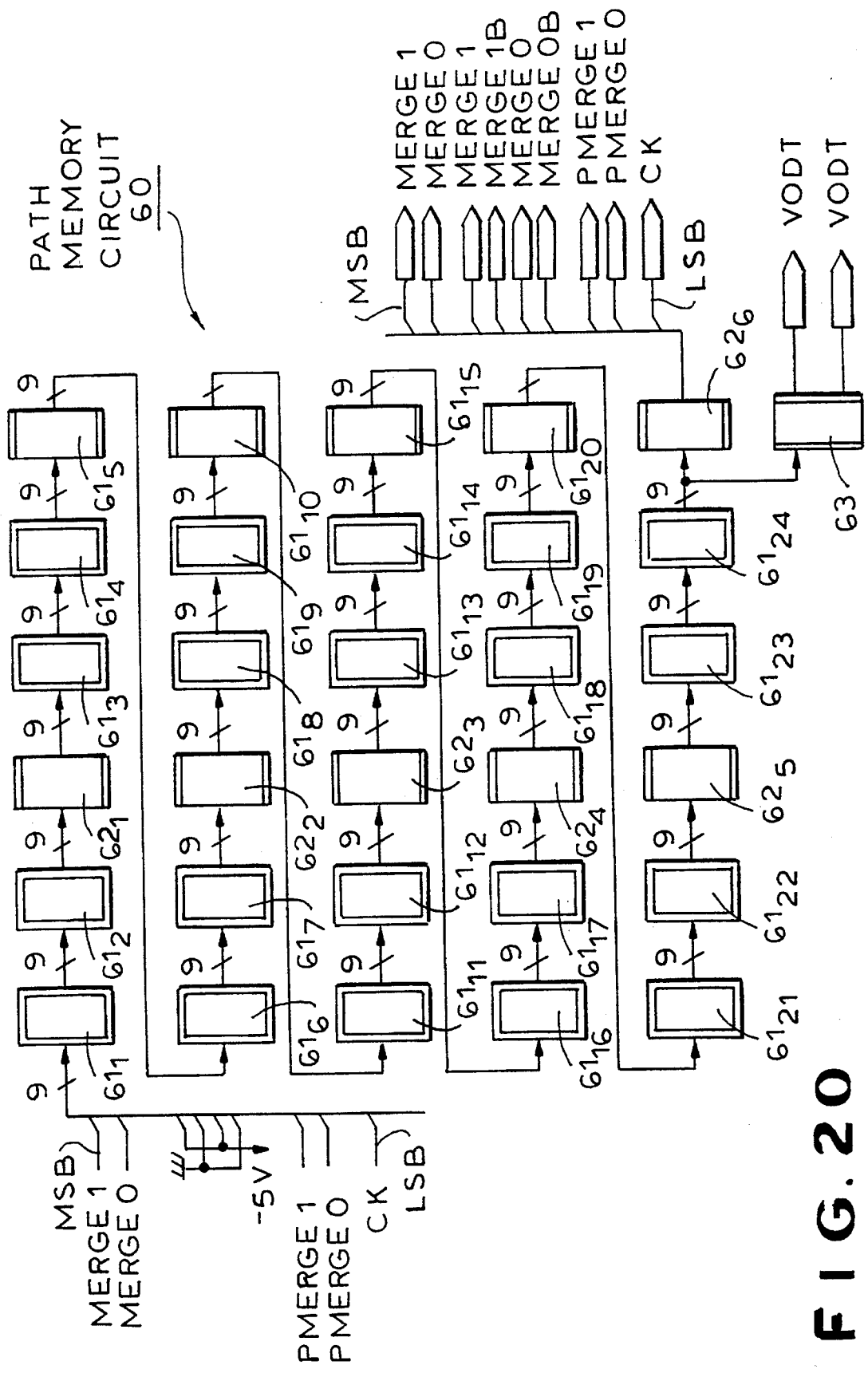
FIG. 20 is a block diagram of a path memory circuit.

As shown in FIG. 20, the path memory circuit 60 is made up of 24 path memory cells (first to 24th path memory cells $61_1$–$61_{24}$) and six data delay cells (first to sixth data delay cells $62_1$–$61_6$) connected together alternately in a series, and one final data judging cell 63. The first data delay cell $62_1$ is connected between the second path memory cell $61_2$ and the third path memory cell $61_3$. The second data delay cell $62_2$ is connected between the seventh path memory cell 617 and the eighth path memory cell $61_8$. The third data delay cell $62_3$ is connected between the twelfth path memory cell $61_{12}$ and the thirteenth path memory cell $61_{13}$. The fourth data delay cell $62_4$ is connected between the seventeenth path memory cell $61_{17}$ and the eighteenth path memory cell $61_{18}$. The fifth data delay cell $62_5$ is connected between the twenty-second path memory cell $61_{21}$ and the twenty-third path memory cell $61_{23}$. The sixth data delay cell $62_6$ and the final data judging cell 63 are each connected after the twenty-fourth path memory cell $61_{24}$.

A 9-bit signal is inputted to the first path memory cell $61_1$. The signal of the highest order bit (MSB) of the 9-bit signal is the signal MERGE1 sent from the path merge operation circuit 50 to the first path memory cell $61_1$. The signal of the second highest bit of the 9-bit signal is the signal MERGE0 sent from the path merge operation circuit 50 to the first path memory cell $61_1$. The signals of the third highest bit and fifth highest bit of the 9-bit signal are each signals (the signals METRK1 and METRK1B shown in FIG. 21) on the data line connected to the −5 V power source (not shown). The signals of the fourth highest bit and sixth highest bit of the 9-bit signal are each signals (the signals METRK0 and METRK0B shown in FIG. 21) on the data line connected to the earth. The signal of the seventh highest bit of the 9-bit signal is the signal PMERGE1 sent from the path merge operation circuit 50 to the first path memory cell $61_1$. The signal of the eighth highest bit of the 9-bit signal is the signal PMERGE0 sent from the path merge operation circuit 50 to the first path memory cell $61_1$. The signal of the lowest bit (LSB) of the 9-bit signal is the bit clock CK sent from the path merge operation circuit 50 to the first path memory cell $61_1$.

Figure 21:
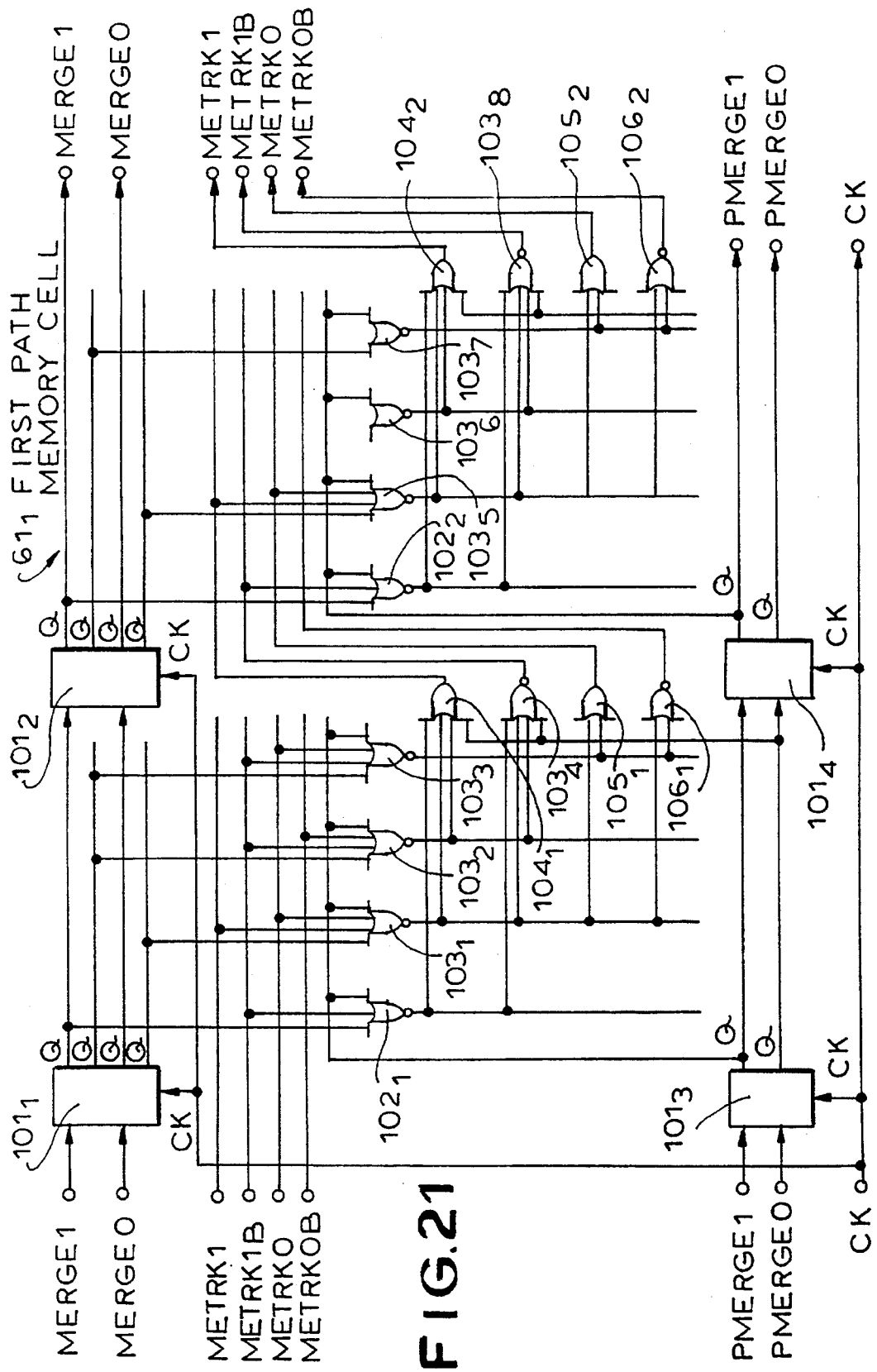
FIG. 21 is a block diagram of the path memory cell shown in FIG. 20.

As shown in FIG. 21, the first path memory cell $61_1$ includes a first flip-flop group $101_1$ made up of two flip-flops, a second flip-flop group $101_2$ made up of two flip-flops, a third flip-flop group $101_3$ made up of two flip-flops, a fourth flip-flop group $101_4$ made up of two flip-flops, a first 3NOR circuit $102_1$, a first 4NOR circuit $103_1$, a second 4NOR circuit $103_2$, a third 4NOR circuit $103_3$, a first 4OR circuit $104_1$, a fourth 4NOR circuit $103_4$, a first 2OR circuit $105_1$, a first 2NOR circuit $106_1$, a second 3NOR circuit $102_2$, a fifth 4NOR circuit $103_5$, a sixth 4NOR circuit $103_6$, a seventh 4NOR circuit $103_7$, a second 4OR circuit $104_2$, an eighth 4NOR circuit $103_8$, a second 2OR circuit $105_2$ and a second 2NOR circuit $106_2$.

The signal MERGE1 and the signal MERGE0 are inputted to the first flip-flop group $101_1$, and taken into the first flip-flop group $101_1$ with the bit clock CK. The two output signals of the first flip-flop group $101_1$, which are corresponding to the signal MERGE1 and the signal MERGE0, are inputted to the second flip-flop group $101_2$ and taken into the second flip-flop group $101_2$ with the bit clock CK. The two output signals from the second flip-flop group $101_2$, which are corresponding to the signal MERGE1 and the signal MERGE0, are outputted to the second path memory cell $61_2$ on the next level. Similarly, the signal PMERGE1 and the signal PMERGE0 are inputted to the third flip-flop group $101_3$, and taken into the third flip-flop group $101_3$ with the bit clock CK. The two output signals of the third flip-flop group $101_3$, which are corresponding to the signal PMERGE1 and the signal PMERGE0, are inputted to the fourth flip-flop group $101_4$ and taken into the fourth flip-flop group $101_4$ with the bit clock CK. The two output signals from the fourth flip-flop group $101_4$, which are corresponding to the signal PMERGE1 and the signal PMERGE0, are outputted to the second path memory cell $61_2$ on the next level.

The output signal corresponding to the signal MERGE1 of the first flip-flop group $101_1$, the signal METRK1B, and the output signals corresponding to the signal PMERGE1 of the third flip-flop group $101_3$ are each inputted to the first 3NOR circuit $102_1$, and the logical sum of these signals is computed. The output signal corresponding to the inverted signal of the signal MERGE0 of the first flip-flop group $101_1$, the signal METRK1, the signal METRK0, and the output signal corresponding to the signal PMERGE1 of the third flip-flop group $101_3$ are each inputted to the first 4NOR circuit $103_1$, and logical sum of these signals is computed. The output signal corresponding to the inverted signal of the signal MERGE1 of the first flip-flop group $101_1$, the signal METRK1B, the signal METRK0B, and the output signal corresponding to the signal PMERGE1 of the third flip-flop group $101_3$ are each inputted to the second 4NOR circuit $103_2$, and the logical sum of these signals is computed. The output signal corresponding to the inverted signal of the signal MERGE1 of the first flip-flop group $101_1$, the signal METRK1B, the signal METRK0, and the output signal corresponding to the signal PMERGE1 of the third flip-flop group $101_3$ are each inputted to the third 4NOR circuit $103_3$, and the logical sum of these signals is computed. The output signal of the first 3NOR circuit $102_1$, the output signal of the first 4NOR circuit $103_1$, the output signal of the second 4NOR circuit $103_2$, and the output signal corresponding to the signal PMERGE0 of the third flip-flop group $101_3$ are each inputted to the first 4OR circuit $104_1$, and the logical sum of these signals is computed. The output signal of the first 3NOR circuit $102_1$, the output signal of the first 4NOR circuit $103_1$, the output signal of the second 4NOR circuit $103_2$, and the output signal corresponding to the signal PMERGE0 of the third flip-flop group $101_3$ are each inputted to the fourth 4NOR circuit $103_4$, and the logical sum of these signals is computed. The output signal of the first 4NOR circuit $103_1$ and the output signal of the third 4NOR circuit $103_3$ are both inputted to the first 2OR circuit $105_1$, and the logical sum of these signals is computed. The output signal of the first 4NOR circuit $103_1$ and the output signal of the third 4NOR circuit $103_3$ are both inputted to the first 2NOR circuit $106_1$, and the logical sum of these signals is computed.

The output signal corresponding to the signal MERGE1 of the second flip-flop group $101_2$, the output signal of the fourth 4NOR circuit $103_4$, and the output signal corresponding to the signal PMERGE1 of the fourth flip-flop group $101_4$ are each inputted to the second 3NOR circuit $102_2$, and the logical sum of these signals is computed. The output signal corresponding to the inverted signal of the signal MERGE0 of the second flip-flop group $101_2$, the output signal of the first 4OR circuit $104_1$, the output signal of the first 2OR circuit $105_1$, and the output signal corresponding to the signal PMERGE1 of the fourth flip-flop group $101_4$ are each inputted to the fifth 4NOR circuit $103_5$, and the logical sum of these signals is computed. The output signal corresponding to the inverted signal of the signal MERGE1 of the second flip-flop group $101_2$, the output signal of the fourth 4NOR circuit $103_4$, the output signal of the first 2NOR circuit $106_1$, and the output signal corresponding to the signal PMERGE1 of the fourth flip-flop group $101_4$ are each inputted to the sixth 4NOR circuit $103_6$, and the logical sum of these signals is computed. The output signal corresponding to the inverted signal of the signal MERGE1 of the second flip-flop group $101_2$, the output signal of the fourth 4NOR circuit $103_4$, the output signal of the first 2OR circuit $105_1$, and the output signal corresponding to the signal PMERGE1 of the fourth flip-flop group $101_4$ are each inputted to the seventh 4NOR circuit $103_7$, and the logical sum of these signals is computed.

The output signal of the second 3NOR circuit $102_2$, the output signal of the fifth 4NOR circuit $103_5$, the output signal of the sixth 4NOR circuit $103_6$, and the output signal corresponding to the signal PMERGE0 of the fourth flip-flop group $101_4$ are inputted to the second 4OR circuit $104_2$, and the logical sum of these signals is computed. The output signal of the second 3NOR circuit $102_2$, the output signal of the fifth 4NOR circuit $103_5$, the output signal of the sixth 4NOR circuit $103_6$, and the output signal corresponding to the signal PMERGE0 of the fourth flip-flop group $101_4$ are inputted to the eighth 4NOR circuit $103_8$, and the logical sum of these signals is computed. The output signal of the fifth 4NOR circuit $103_5$ and the output signal of the seventh 4NOR circuit $103_7$ are inputted to the second 2OR circuit $105_2$, and the logical sum of these signals is computed. The output signal of the fifth 4NOR circuit $103_5$ and the output signal of the seventh 4NOR circuit $103_7$ are inputted to the second 2NOR circuit $106_2$, and the logical sum of these signals is computed. The output signal of the second 4OR circuit $104_2$ is outputted to the second path memory cell $61_2$ on the next level as the signal METRK1. The output signal of the eighth 4NOR circuit $103_8$ is outputted to the second path memory cell $61_2$ as the signal METRKB. The output signal of the second 2OR circuit $105_2$ is outputted to the second path memory cell $61_2$ as the signal METRK0. The output signal of the second 2NOR circuit $106_2$ is outputted to the second path memory cell $61_2$ as the signal METRK0B.

The first path memory cell $61_1$ is made merge 0 when the value of the signal MERGE1 is "0" and the value of the signal MERGE0 is "0." The first path memory cell $61_1$ is made merge 1 when the value of the signal MERGE1 is "0" and the value of the signal MERGE0 is "1." The first path memory cell $61_1$ is made merge 2 when the value of the signal MERGE1 is "1" and the value of the signal MERGE0 is "0." The first path memory cell $61_1$ is made merge 3 when the value of the signal MERGE1 is "1" and the value of the signal MERGE0 is "1." The first path memory cell $61_1$ is in state S0 when the value of the signal METRK1 is "0" and the value of the signal METRK0 is "0." The first path memory cell $61_1$ is in state S1 when the value of the signal METRK1 is "0" and the value of the signal METRK0 is "1." The first path memory cell $61_1$ is in state S2 when the value of the signal METRK1 is "1" and the value of the signal METRK0 is "0." The first path memory cell $61_1$ is in state S3 when the value of the signal METRK1 is "1" and the value of the signal METRK0 is "1." Furthermore, the first path memory cell $61_1$ is made S0 merge when the value of the signal PMERGE1 is "1" and the value of the signal PMERGE0 is "0." The first path memory cell $61_1$ is made S2 merge when the value of the signal PMERGE1 is "1" and the value of the signal PMERGE0 is "1." The first path memory cell $61_1$ computes states from future states towards the past, and the same operations are repeated during two clock pulses of the bit clock CK.

Next will be described the operation of the first path memory cell $61_1$.

When, of the signals sent one clock pulse earlier of the bit clock CK from the path merge operation circuit 50 on the preceding level to the first path memory cell $61_1$, the value of the signal PMERGE1 is "1" and the value of the signal PMERGE0 is "0," the values of the output signals of the second 4OR circuit $104_2$ and the second 2OR circuit $105_2$ are both made "0." As a result, the values of the signal METRK1 and the signal METRK0 outputted to the second path memory cell $61_2$ on the next level are both forced to be "0," thereby causing an S0 merge. When, of the signals sent one clock pulse earlier of bit clock CK from the path merge operation circuit 50 on the preceding level to the first path memory cell $61_1$, the value of the signal PMERGE1 is "1" and the value of the signal PMERGE0 is "1," the value of the output signal of the second 4OR circuit $104_2$ is made "1" and the value of the output of the second 2OR circuit $105_2$ is made "0." As a result, the value of the signal METRK1 outputted to the second path memory cell $61_2$ on the next level is forced to be "1" and the value of the signal METRK0 is forced to be "0," thereby causing an S2 merge.

When, of the signals sent one clock pulse earlier of the bit clock CK from the path merge operation circuit 50 on the preceding level to the first path memory cell $61_1$, the value of the signal PMERGE1 is "0" and the value of the signal PMERGE0 is "0," the following operations are carried out:

(1) When, of the signals sent one clock pulse earlier of the bit clock CK from the path merge operation circuit 50 on the preceding level to the first path memory cell $61_1$, the value of the signal MERGE1 is "0" and the value of the signal MERGE0 is "0,"

(a) When, of the signals sent one clock pulse earlier of the bit clock CK from the path merge operation circuit 50 on the preceding level to the first path memory cell $61_1$, the value of the signal METRK1 is "1" and the value of the signal METRK0 is "1," the value of the signal METRK1 outputted to the second path memory cell $61_2$ on the next level is made "1" and the value of the signal METRK0 outputted to the second path memory cell $61_2$ on the next level is made "0."

(b) When, of the signals sent one clock pulse earlier of the bit clock CK from the path merge operation circuit 50 on the preceding level to the first path memory cell $61_1$, the value of the signal METRK1 is "1" and the value of the signal METRK0 is "0," the value of the signal METRK1 outputted to the second path memory cell $61_2$ on the next level is made "1" and the value of the signal METRK0 outputted to the second path memory cell $61_2$ on the next level is made "0."

(c) When, of the signals sent one clock pulse earlier of the bit clock CK from the path merge operation circuit 50 on the preceding level to the first path memory cell $61_1$, the value of the signal METRK1 is "0" and the value of the signal METRK0 is "1," the value of the signal METRK1 outputted to the second path memory cell $61_2$ on the next level is made and the value of the signal METRK0 outputted to the second path memory cell $61_2$ on the next level is made "0."

(d) When, of the signals sent one clock pulse earlier of the bit clock CK from the path merge operation circuit 50 on the preceding level to the first path memory cell $61_1$, the value of the signal METRK1 is "0" and the value of the signal METRK0 is "0," the value of the signal METRK1 outputted to the second path memory cell $61_2$ on the next level is made "0" and the value of the signal METRK0 outputted to the second path memory cell $61_2$ on the next level is made "0."

(2) When, of the signals sent one clock pulse earlier of the bit clock CK from the path merge operation circuit 50 on the preceding level to the first path memory cell $61_1$, the value of the signal MERGE1 is "0" and the value of the signal MERGE0 is "1,"

(a) When, of the signals sent one clock pulse earlier of the bit clock CK from the path merge operation circuit 50 on the preceding level to the first path memory cell $61_1$, the value of the signal METRK1 is "1" and the value of the signal METRK0 is "1," the value of the signal METRK1 outputted to the second path memory cell $61_2$ on the next level is made "1" and the value of the signal METRK0 outputted to the second path memory cell $61_2$ on the next level is made "0."

(b) When, of the signals sent one clock pulse earlier of the bit clock CK from the path merge operation circuit 50 on the preceding level to the first path memory cell $61_1$, the value of the signal METRK1 is "1" and the value of the signal METRK0 is "0," the value of the signal METRK1 outputted to the second path memory cell $61_2$ on the next level is made "1" and the value of the signal METRK0 outputted to the second path memory cell $61_2$ on the next level is made "0."

(c) When, of the signals sent one clock pulse earlier of the bit clock CK from the path merge operation circuit 50 on the preceding level to the first path memory cell $61_1$, the value of the signal METRK1 is "0" and the value of the signal METRK0 is "1," the value of the signal METRK1 outputted to the second path memory cell $61_2$ on the next level is made "0." and the value of the signal METRK0 outputted to the second path memory cell $61_2$ on the next level is made "0."

(d) When, of the signals sent one clock pulse earlier of the bit clock CK from the path merge operation circuit 50 on the preceding level to the first path memory cell $61_1$, the value of the signal METRK1 is "0" and the value of the signal METRK0 is "0," the value of the signal METRK1 outputted to the second path memory cell $61_2$ on the next level is made "1" and the value of the signal METRK0 outputted to the second path memory cell $61_2$ on the next level is made "1."

(3) When, of the signals sent one clock pulse earlier of the bit clock CK from the path merge operation circuit 50 on the preceding level to the first path memory cell $61_1$, the value of the signal MERGE1 is "1" and the value of the signal MERGE0 is "0,"

(a) When, of the signals sent one clock pulse earlier of the bit clock CK from the path merge operation circuit 50 on the preceding level to the first path memory cell $61_1$, the value of the signal METRK1 is "1" and the value of the signal METRK0 is "1," the value of the signal METRK1 outputted to the second path memory cell $61_2$ on the next level is made "1" and the value of the signal METRK0 outputted to the second path memory cell $61_2$ on the next level is made "0."

(b) When, of the signals sent one clock pulse earlier of the bit clock CK from the path merge operation circuit 50 on the preceding level to the first path memory cell $61_1$, the value of the signal METRK1 is "1" and the value of the signal METRK0 is "0," the value of the signal METRK1 outputted to the second path memory cell $61_2$ on the next level is made and the value of the signal METRK0 outputted to the second path memory cell $61_2$ on the next level is made "1."

(c) When, of the signals sent one clock pulse earlier of the bit clock CK from the path merge operation circuit 50 on the preceding level to the first path memory cell $61_1$, the value of the signal METRK1 is "0" and the value of the signal METRK0 is "1," the value of the signal METRK1 outputted to the second path memory cell $61_2$ on the next level is made "0" and the value of the signal METRK0 outputted to the second path memory cell $61_2$ on the next level is made "0."

(d) When, of the signals sent one clock pulse earlier of the bit clock CK from the path merge operation circuit 50 on the preceding level to the first path memory cell $61_1$, the value of the signal METRK1 is "0" and the value of the signal METRK0 is "0," the value of the signal METRK1 outputted to the second path memory cell $61_2$ on the next level is made "0" and the value of the signal METRK0 outputted to the second path memory cell $61_2$ on the next level is made "0."

(4) When, of the signals sent one clock pulse earlier of the bit clock CK from the path merge operation circuit 50 on the preceding level to the first path memory cell $61_1$, the value of the signal MERGE1 is "1" and the value of the signal MERGE0 is "1,"

(a) When, of the signals sent one clock pulse earlier of the bit clock CK from the path merge operation circuit 50 on the preceding level to the first path memory cell $61_1$, the value of the signal METRK1 is "1" and the value of the signal METRK0 is "1," the value of the signal METRK1 outputted to the second path memory cell $61_2$ on the next level is made "1" and the value of the signal METRK0 outputted to the second path memory cell $61_2$ on the next level is made "0."

(b) When, of the signals sent one clock pulse earlier of the bit clock CK from the path merge operation circuit 50 on the preceding level to the first path memory cell $61_1$, the value of the signal METRK1 is "1" and the value of the signal METRK0 is "0," the value of the signal METRK1 outputted to the second path memory cell $61_2$ on the next level is made "0" and the value of the signal METRK0 outputted to the second path memory cell $61_2$ on the next level is made "1."

(c) When, of the signals sent one clock pulse earlier of the bit clock CK from the path merge operation circuit 50 on the preceding level to the first path memory cell $61_1$, the value of the signal METRK1 is "0" and the value of the signal METRK0 is "1," the value of the signal METRK1 outputted to the second path memory cell $61_2$ on the next level is made "0" and the value of the signal METRK0 outputted to the second path memory cell $61_2$ on the next level is made "0."

(d) When, of the signals sent one clock pulse earlier of the bit clock CK from the path merge operation circuit 50 on the preceding level to the first path memory cell $61_1$, the value of the signal METRK1 is "0" and the value of the signal METRK0 is "0," the value of the signal METRK1 outputted to the second path memory cell $61_2$ on the next level is made "1" and the value of the signal METRK0 outputted to the second path memory cell $61_2$ on the next level is made "1."

The composition and operation of the other path memory cells $61_2$–$61_{24}$ are the same as the composition and operation of the above-described first path memory cell $61_1$. In addition, at the starting time of operation of the path memory circuit 60 shown in FIG. 20, the values of the signal MERGE1 and the signal MERGE0, which are sent from the path merge operation circuit 50 on the preceding layer to the first path memory cell $61_1$ at one clock pulse earlier of the bit clock CK, are "0." However, in the path memory 60, in order that path merge occurs without fail, the values of the signal METRK1 and the signal METRK0 are established at that point in time.

Figure 22:
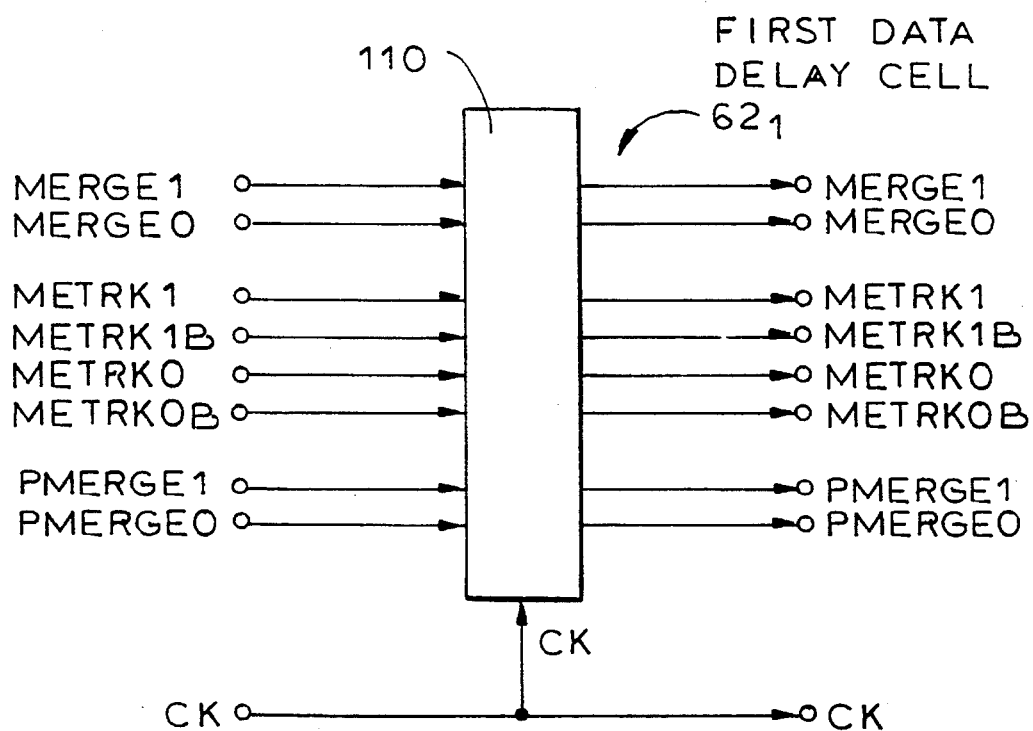
FIG. 22 is a block diagram of the data delay cell shown in FIG. 20.

The first data delay cell $62_1$ of the path memory circuit 60 shown in FIG. 20 is provided for the purpose of delaying by just one clock pulse of the bit clock CK each of the signal MERGE1, the signal MERGE0, the signal METRK1, the signal METRK1B, the signal METRK0, the signal METRK0B, the signal PMERGE1, and the signal PMERGE0 sent from the second path memory cell $61_2$ on the preceding level. As shown in FIG. 22, the first data delay cell $62_1$ is composed of a flip-flop group 110 made up of eight flip-flops. The remaining data delay cells $62_2$–$62_6$ are all equivalent to the first data delay cell $62_1$.

Figure 23:
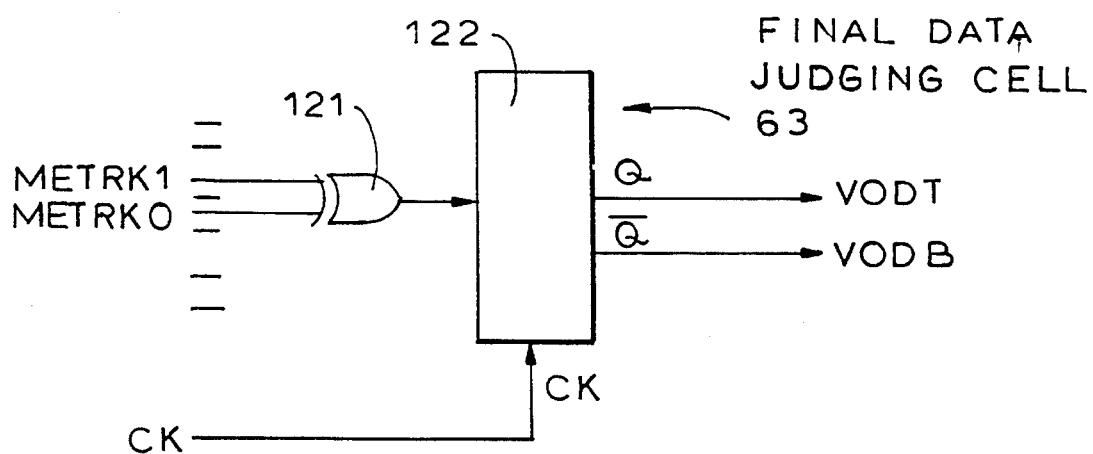
FIG. 23 is a block diagram of a final data judging cell shown in FIG. 20.

The final data judging cell 63 of the path memory circuit 60 shown in FIG. 20 is provided for the purpose of computing the exclusive-or operation of the signal METRK1 and the signal METRK0 sent from the 24th path memory cell $61_{24}$ on the preceding level and outputting each of a final binary judgment output signal VODT and an inverted final binary judgment output signal VODB. As shown in FIG. 23, the final data judging cell 63 is composed of an EXNOR circuit 121 for computing the exclusive-or operation of the signal METRK1 and the signal METRK0 and a flip-flop 122 for taking in the output signal of the EXNOR circuit 121 with the bit clock CK and for producing the final binary judgment output signal VODT and the inverted final binary judgment output signal VODB.

Table 2 presents the relations among the merge, the state transition, and the final binary judgment output signal VODT. According to Table 2, for each merge, when the transition is made to state S2 or state S1, the final binary judgment output signal VODT becomes "1," and when the transition is made to state S3 or state S0, the final binary judgment output signal becomes "0."

TABLE 2

| MERGE | STATE TRANSITION | VODT |
|---|---|---|
| MERGE 0 | STATE S2 - STATE S3 | 0 |
|  | STATE S2 - STATE S2 | 1 |
|  | STATE S0 - STATE S1 | 1 |
|  | STATE S0 - STATE S0 | 0 |
| MERGE 1 | STATE S2 - STATE S3 | 0 |
|  | STATE S2 - STATE S2 | 1 |
|  | STATE S0 - STATE S1 | 1 |
|  | STATE S3 - STATE S0 | 0 |
| MERGE 2 | STATE S2 - STATE S3 | 0 |
|  | STATE S1 - STATE S2 | 1 |
|  | STATE S0 - STATE S1 | 1 |
|  | STATE S0 - STATE S0 | 0 |
| MERGE 3 | STATE S2 - STATE S3 | 0 |
|  | STATE S1 - STATE S2 | 1 |
|  | STATE S0 - STATE S1 | 1 |
|  | STATE S3 - STATE S0 | 0 |

The above described Viterbi decoding method according the first embodiment of the playback data detecting method of the present invention applies to NRZI playback data but by making the following revisions, the method can also be made to apply to NRZ playback data.

(1) When the signal e(t) of "−1" is inputted during state S0, a transition is made to state S0 and the value of the output signal f(t) is made "0." When the signal e(t) of "1" is inputted during state S0, a transition is made to state S1 and the value of the output signal f(t) is made "1." When the signal e(t) of "1" is inputted during state S1, a transition is made to state S2 and the value of the output signal f(t) is made "0." When the signal e(t) of "1" is inputted during state S2, a transition is made to state S2 and the value of the output signal f(t) is made "0." When the signal e(t) of "−1" is inputted during state S2, a transition is made to state S3 and the value of the output signal f(t) is made "1." When the signal e(t) of "−1" is inputted during state S3, a transition is made to state S0 and the value of the output signal f(t) is made "0." When the playback signal in violation of these state transition rules is inputted, the state in violation is detected and its original state is judged, thereby carrying out bit error correcting.

(2) The output data is obtained by making the output data corresponding to state S0 and state S2 a value "0" and the output data corresponding to state S1 and state S3 a value "1."

In addition, a Viterbi decoder for cases applying to NRZ playback data can be realized by outputting the final binary judgment output signal VODT shown in Table 3 in the final data judgment cell 63 (refer to FIG. 20) of the above-described Viterbi decoder.

TABLE 3

| MERGE | STATE TRANSITION | VODT |
|---|---|---|
| MERGE 0 | STATE S2 - STATE S3 | 1 |
|  | STATE S2 - STATE S2 | 0 |
|  | STATE S0 - STATE S1 | 1 |
|  | STATE S0 - STATE S0 | 0 |
| MERGE 1 | STATE S2 - STATE S3 | 1 |
|  | STATE S2 - STATE S2 | 0 |
|  | STATE S0 - STATE S1 | 1 |
|  | STATE S3 - STATE S0 | 0 |
| MERGE 2 | STATE S2 - STATE S3 | 1 |
|  | STATE S1 - STATE S2 | 0 |

TABLE 3-continued

| MERGE | STATE TRANSITION | VODT |
|---|---|---|
|  | STATE S0 - STATE S1 | 1 |
|  | STATE S0 - STATE S0 | 0 |
| MERGE 3 | STATE S2 - STATE S3 | 1 |
|  | STATE S1 - STATE S2 | 0 |
|  | STATE S0 - STATE S1 | 1 |
|  | STATE S3 - STATE S0 | 0 |

Figure 24:
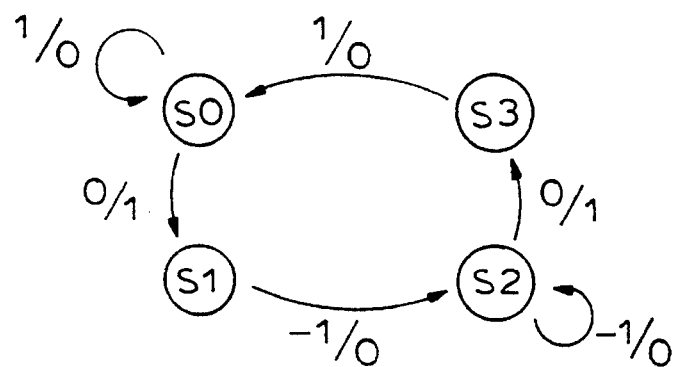
FIG. 24 is a state transition chart illustrating the Viterbi decoding method according to the second embodiment of the playback data detecting method of the present invention.
Figure 25:
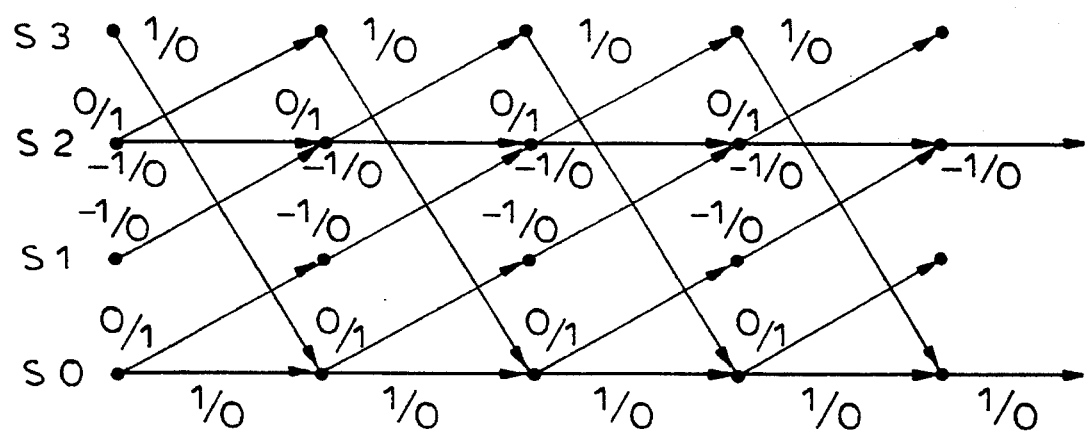
FIG. 25 is a trellis diagram for the purpose of illustrating the Viterbi decoding method according to the second embodiment of a playback data detecting method of the present invention.

A Viterbi decoding method according to the second embodiment of the playback data detecting method of the present invention takes as its object producing playback data according to the NRZ method. As shown in the state transition chart of FIG. 24 and the trellis diagram of FIG. 25, the playback states are the four states which are state S0, state S1, state S2, and state S3. When the signal e(t) of "1" is inputted during state S0, it makes a transition to state S0 and the value of the output signal f(t) is made "0." When the signal e(t) of "0" is inputted during state S0, it makes a transition to state S1 and the value of the output signal f(t) is made "1." When the signal e(t) of "−1" is inputted during state S1, it makes a transition to state S2 and the value of the output signal f(t) is made "0." When the signal e(t) of "−1" is inputted during state S2, it makes a transition to state S2 and the value of the output signal f(t) is made "0." When the signal e(t) of "0" is inputted during state S2, it makes a transition to state S3 and the value of the output signal f(t) is made "1." When the signal e(t) of "1" is inputted during state S3, it makes a transition to state S0 and the value of the output signal f(t) is made "0." When the signal e(t) violating the above-described state transition rules is inputted, bit error correction is performed by detecting an incorrect state and judging an original state. As a result, error rate of random errors is improved.

The Viterbi decoding method according to the second embodiment of the playback data detecting method of the present invention applies to a playback data converted from binary to three-value by means of a partial response (1, 1) encoding method. Here, the playback signal is obtained by playing back a recording signal recorded to a magnetic medium such as tape after having been converted to channel bits while the number of continuous non-inverse bits is constrained within a range of a minimum of "2."

In the same manner as for the method described in FIGS. 1 through 9, standardized metrics $l_{00}$, $l_{01}$, $l_{12}$, $l_{22}$, $l_{23}$, $l_{30}$ are found to be as follows:

$l_{00} = -y_k + 0.5$ $l_{01} = 0$ $l_{12} = y_k + 0.5$ $l_{22} = y_k + 0.5$ $l_{23} = 0$ $l_{30} = -y_k + 0.5$

Here, when the sampled value of the playback signal at time n is $y_n$ and the state metrics of states S3, S2, S1, and S0 are $m_n(S3)$, $m_n(S2)$, $m_n(S1)$, and $m_n(S0)$, state metrics $m_n(S3)$, $m_n(S2)$, $m_n(S1)$, and $m_n(S0)$ are expressed as follows:

$$\begin{aligned} m_n(S3) &= m_{n-1}(S2) + l_{23} \\ &= m_{n-1}(S2) \end{aligned}$$

$$\begin{aligned} m_n(S2) &= \min[m_{n-1}(S2) + l_{22}, m_{n-1}(S1) + l_{12}] \\ &= \min[m_{n-1}(S2) + y_n + 0.5, m_{n-1}(S1) + y_n + 0.5] \end{aligned}$$

-continued $$m_n(S1) = m_{n-1}(S0) + l_{01}$$
$$= m_{n-1}(S0)$$
$$m_n(S0) = \min[m_{n-1}(S0) + l_{00}, m_{n-1}(S3) + l_{30}]$$
$$= \min[m_{n-1}(S0) - y_n + 0.5, m_{n-1}(S3) - y_n + 0.5]$$

At this time, merge 0, merge 1, merge 2 and merge 3 are defined as follows:

<merge 0>
when $m_{n-1}(S2) < m_{n-1}(S1)$ and $m_{n-1}(S0) < m_{n-1}(S3)$,
$m_n(S3) = m_{n-1}(S2)$,
$m_n(S2) = m_{n-1}(S2) + y_n + 0.5$,
$m_n(S1) = m_{n-1}(S0)$, and
$m_n(S0) = m_{n-1}(S0) - y_n + 0.5$;
and the trellis diagram is as shown in FIG. 26:

<merge 1>
when $m_{n-1}(S2) < m_{n-1}(S1)$ and $m_{n-1}(S0) \geq m_{n-1}(S3)$,
$m_n(S3) = m_{n-1}(S2)$,
$m_n(S2) = m_{n-1}(S2) + y_n + 0.5$,
$m_n(S1) = m_{n-1}(S0)$, and
$m_n(S0) = m_{n-1}(S3) - y_n + 0.5$;
and the trellis diagram is as shown in FIG. 27:

<merge 2>
when $m_{n-1}(S2) \geq m_{n-1}(S1)$ and $m_{n-1}(S0) < m_{n-1}(S3)$,
$m_n(S3) = m_{n-1}(S2)$,
$m_n(S2) = m_{n-1}(S1) + y_n + 0.5$,
$m_n(S1) = m_{n-1}(S0)$, and
$m_n(S0) = m_{n-1}(S0) - y_n + 0.5$;
and the trellis diagram is as shown in FIG. 28:

<merge 3>
when $m_{n-1}(S2) \geq m_{n-1}(S1)$ and $m_{n-1}(S0) < m_{n-1}(S3)$,
$m_n(S3) = m_{n-1}(S2)$,
$m_n(S2) = m_{n-1}(S1) + y_n + 0.5$,
$m_n(S1) = m_{n-1}(S0)$, and
$m_n(S0) = m_{n-1}(S3) - y_n + 0.5$;
and the trellis diagram is as shown in FIG. 29.

When the playback data conforms to "y" ($-1 \leq y \leq 1$), "y+0.5" and "-y+0.5" are calculated and the merges are judged as follows:

(1) merge 0
when $m(S2) < m(S1)$ and $m(S0) < m(S3)$,
$m(S3) = m(S2)$,
$m(S2) = m(S2) + y + 0.5$,
$m(S1) = m(S0)$, and
$m(S0) = m(S0) - y + 0.5$:

(2) merge 1
when $m(S2) < m(S1)$ and $m(S0) \geq m(S3)$,
$m(S3) = m(S2)$,
$m(S2) = m(S2) + y + 0.5$,
$m(S1) = m(S0)$, and
$m(S0) = m(S3) - y + 0.5$:

(3) merge 2
when $m(S2) \geq m(S1)$ and $m(S0) < m(S3)$,
$m(S3) = m(S2)$,
$m(S2) = m(S1) + y + 0.5$,
$m(S1) = m(S0)$, and
$m(S0) = m(S0) - y + 0.5$:

(4) merge 3
when $m(S2) \geq m(S1)$ and $m(S0) \geq m(S3)$,
$m(S3) = m(S2)$,
$m(S2) = m(S1) + y + 0.5$,
$m(S1) = m(S0)$, and
$m(S0) = m(S3) - y + 0.5$.

Subsequently, according to which of (1) or (2) below is generated, the path is merged and the output data corresponding to the playback data is obtained.

(1) When a path connecting three consecutive states is (merge 0 or merge 1)—merge 1—(merge 0 or merge 1), the path is merged with state S2.

(2) When a path connecting three consecutive states is (merge 0 or merge 2)—merge 2—(merge 0 or merge 2), the path is merged with state S0.

One series of path merges is shown in FIG. 30.

By merging the path as described above, one state is obtained from among the four states S0–S3. As a result, the output data can be obtained by making the output data corresponding to state S0 or state S2 a value "0" and the output data corresponding to state S1 or state S3 a value "1." In this manner, bit error correcting for random errors can be carried out.

Next, a Viterbi decoder 200 capable of actually realizing the above-described Viterbi decoding method according to the second embodiment of the playback data detecting method of the present invention will be described with reference to FIG. 31. The Viterbi decoder 200 includes an A/D convertor circuit 201, a condition calculation circuit 202, a standardized metric calculation & merge judging circuit 203, a path merge judging circuit 204, and a path memory circuit 205. The A/D convertor circuit 201 is provided for the purpose of analog-to-digital converting the output signal e(t) of the high-pass filter (see FIG. 1) provided on the preceding level of the Viterbi decoder 200 and producing the sampled value $y_n$ of the playback signal. The condition calculation circuit 202 is provided for calculating "$y_n + 0.5$" and "$y_n - 0.5$" using the sampled value $y_n$ of the playback signal sent thereto from the A/D conversion circuit 201. The standardized metric calculation & merge judging circuit 203 is provided for calculating state metrics $m_n(S3)$, $m_n(S2)$, $m_n(S1)$, and $m_n(S0)$ by the above-described method using the signal indicating the calculation result of "$y_n + 0.5$" and the signal indicating the calculation result of "$y_n - 0.5$" sent thereto from the condition calculation circuit 202, as well as for judging the above-described merge 0, merge 1, merge 2, and merge 3 by comparing the size of state metric $m_{n-1}(S2)$ and the size of state metric $m_{n-1}(S1)$ and comparing the size of state metric $m_{n-1}(S3)$ and the size of state metric $m_{n-1}(S0)$. The path merge judging circuit 204 is provided for the purpose of detecting the continuity of the merge using a signal indicating the result of the size judgment of state metric $m_{n-1}(S2)$ and state metric $m_{n-1}(S1)$ and a signal indicating the size judgment of state metric $m_{n-1}(S3)$ and state metric $m_{n-1}(S0)$ sent thereto from the standardized metric calculation & merge judging circuit 203. The path merge judging circuit 204 is also provided for the purpose of making the path merge of the path memory circuit 205 on the next level an S0 merge by making a signal PM1 a value "1" (high level) and a signal PM0 a value "0" (low level) when the merge shifts as (merge 0 or merge 2)—merge 2—(merge 0 or merge 2); and for making the path merge of the path memory circuit 205 an S2 merge by making the signal PM1 and the signal PM0 both a value "0" (low level) when the merge shifts as (merge 0 or merge 1)—merge 1—(merge 0 or merge 1). When the merge makes a transition other than those described above, the path merge judging circuit 204 makes the path merge of the path memory circuit 205 "through" by making the signal PM1 and the signal PM0 both a value "0" (low level). When the merge makes a forbidden transition, the path merge judging circuit 204 inhibits the merge in the path memory circuit 205 by making the signal PM1 a value "0" (low level) and the signal PM0 a value "1" (high level). The path memory circuit 205 is provided for the purpose of carrying out a path merge according to the signal PM1 and the signal PM0 sent thereto from the path merge judging circuit 204 and for outputting the output data the value of which is "0" for state S0 or state S2 and "1" for state S1 or state S3.

In the standardized metric calculation & merge judging circuit 203, state metric $m_n(S3)$ of state S3, state metric $m_n(S2)$ of state S2, and state metric $m_n(S1)$ of state S1 can be found as the relative values with state metric $m_n(S0)$ of state S0.

The Viterbi decoding method of the second embodiment of the playback data detecting method of the present invention is intended for producing the NRZ playback data, but can also be applied for applications in which the playback data is produced according to the NRZI method by carrying out the following modifications.

(1) When the signal e(t) of "1" is inputted during state S0, a transition is made to state S0 and the value of the output signal f(t) is made "0." When the signal e(t) of "0" is inputted during state S0, a transition is made to state S1 and the value of the output signal f(t) is made "1." When the signal e(t) of "−1" is inputted during state S1, a transition is made to state S2 and the value of the output signal f(t) is made "1." When the signal e(t) of "−1" is inputted during state S2, a transition is made to state S2 and the value of the output signal f(t) is made "1." When the signal e(t) of "0" is inputted during state S2, a transition is made to state S3 and the value of the output signal f(t) is made "0." When the signal e(t) of "1" is inputted during state S3, a transition is made to state S0 and the value of the output signal f(t) is made "0." When the playback signal violating these state transition rules is inputted, bit error correction is performed by detecting an incorrect state and judging an original state.

(2) The output data is obtained by making the output data corresponding to state S0 or state S3 a value "0" and making the output data corresponding to state S1 or state S2 a value "1."

Figure 31:
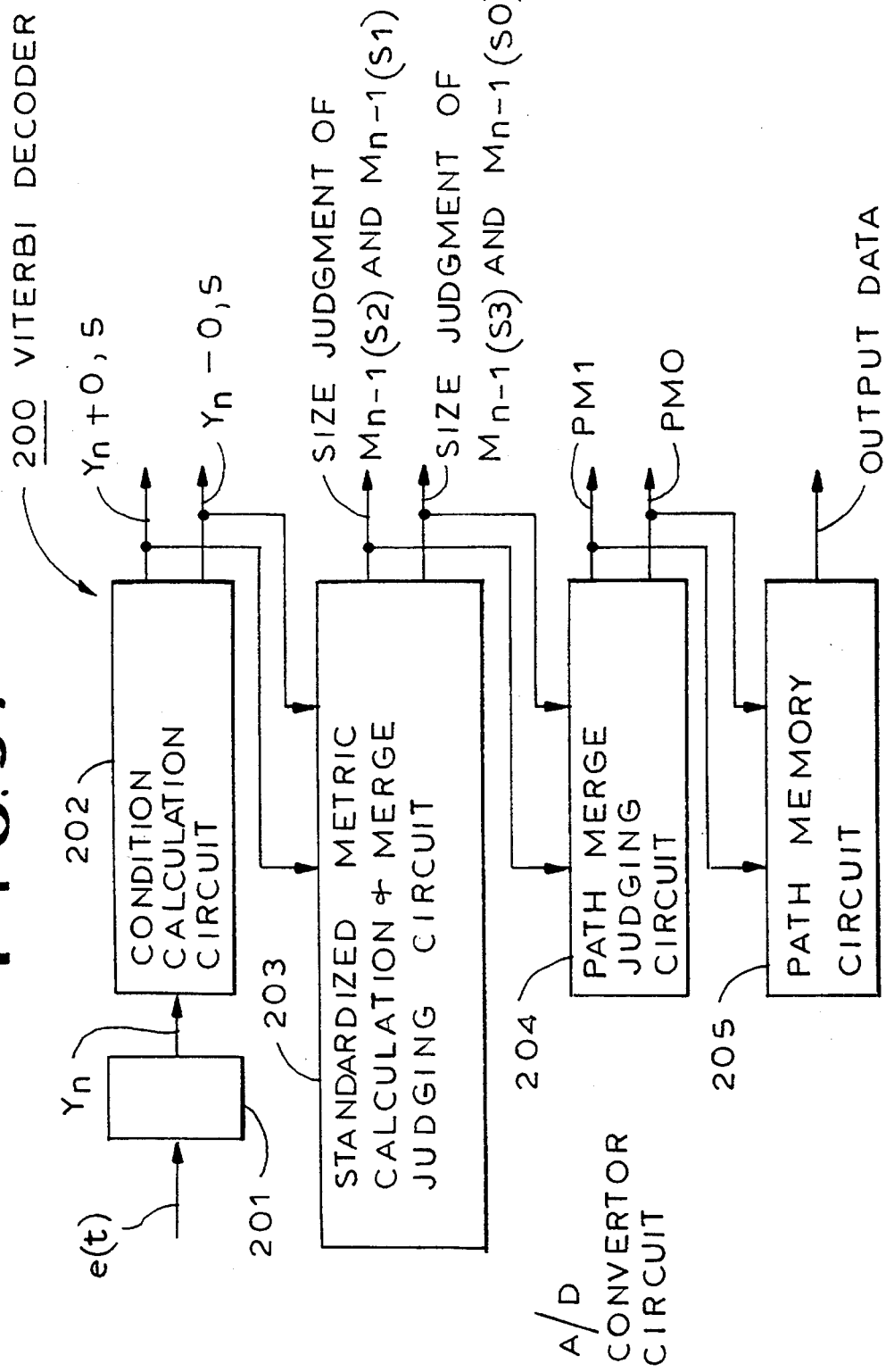
FIG. 31 is a block diagram showing a series of Viterbi decoders capable of concretely realizing the Viterbi decoding method according to the second embodiment of the playback data detecting method of the present invention.

A Viterbi decoder for producing the NRZI playback data can be realized by outputting the output data of "0" for state S0 or state S3 and the output data of "1" for state S1 or state S2 in the path memory circuit 205 of the Viterbi decoder 200 shown in FIG. 31.

Figure 32:
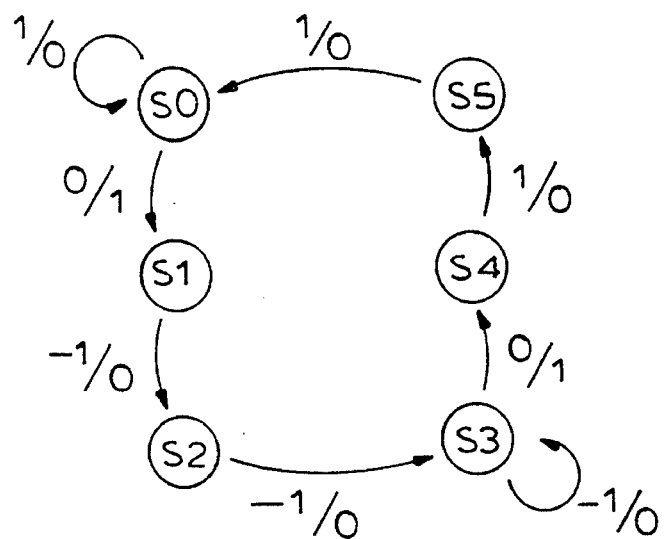
FIG. 32 is a state transition diagram for the purpose of illustrating the Viterbi decoding method according to the third embodiment of the playback data detecting method of the present invention.
Figure 33:
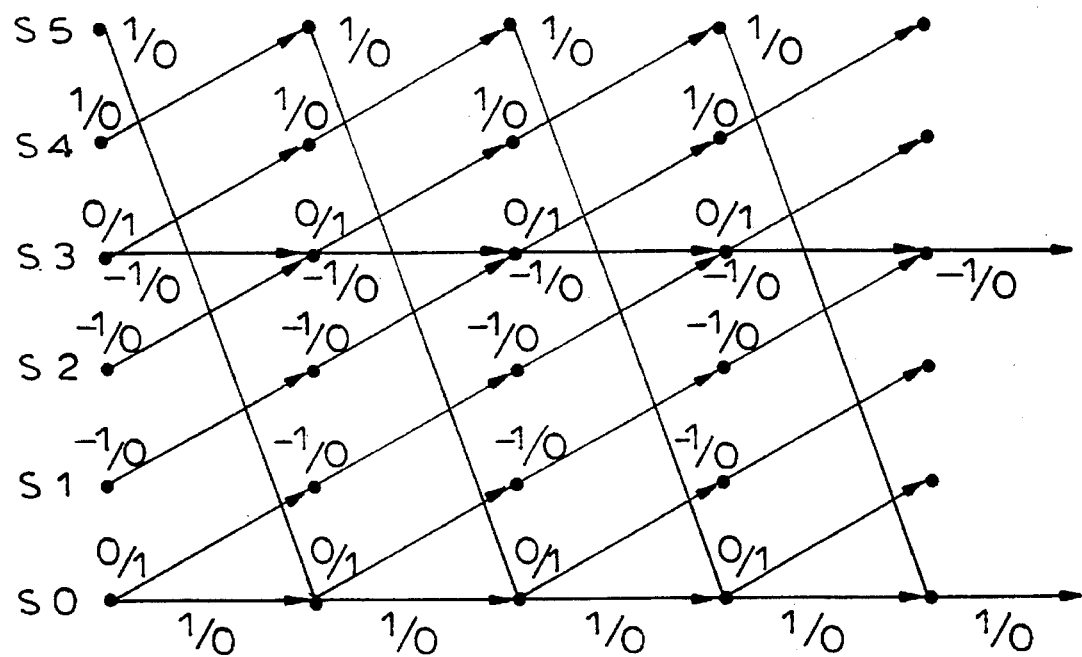
FIG. 33 is a trellis diagram for the purpose of illustrating the Viterbi decoding method according to the third embodiment of a playback data detecting method of the present invention.

A Viterbi decoding method according to the third embodiment of the playback data detecting method of the present invention is a method that produces playback data according to the NRZ method. As shown in the state transition chart of FIG. 32 and the trellis diagram of FIG. 33, the playback states are the six states which are state S0, state S1, state S2, state S3, state S4, and state S5. When the signal e(t) of "1" is inputted during state S0, it makes a transition to state S0 and the value of the output signal f(t) is made "0." When the signal e(t) of "0" is inputted during state S0, it makes a transition to state S1 and the value of the output signal f(t) is made "1." When the signal e(t) of "−1" is inputted during state S1, it makes a transition to state S2 and the value of the output signal f(t) is made "0." When the signal e(t) of "−1" is inputted during state S2, it makes a transition to state S3 and the value of the output signal f(t) is made "0." When the signal e(t) of "−1" is inputted during state S3, it makes a transition to state S3 and the value of the output signal f(t) is made "0." When the signal e(t) of "0" is inputted during state S3, it makes a transition to state S4 and the value of the output signal f(t) is made "1." When the signal e(t) of "1" is inputted during state S4, it makes a transition to state S5 and the value of the output signal f(t) is made "0." When the signal e(t) of "1" is inputted during state S5, it makes a transition to state S0 and the value of the output signal f(t) is made "0." When the signal e(t) violating the above-described state transition rules is inputted, bit error correction is performed by detecting an incorrect state and judging an original state. As a result, error rate of random errors is improved.

The Viterbi decoding method according to the third embodiment of the playback data detecting method of the present invention applies to a playback signal obtained by playing back a recording signal recorded to a magnetic medium such as tape after having been converted to channel bits while the number of the continuous non-inverse bits is constrained within a range of a minimum of "3."

In the same manner as for the method described in FIGS. 1 through 9, standardized metrics $l_{00}, l_{01}, l_{12}, l_{23}, l_{33}, l_{34}, l_{45}$, and $l_{50}$ are found to be as follows:

$l_{00} = -y_k + 0.5$ $l_{01} = 0$ $l_{12} = y_k + 0.5$ $l_{23} = y_k + 0.5$ $l_{33} = y_k + 0.5$ $l_{34} = 0$ $l_{45} = -y_k + 0.5$ $l_{50} = -y_k + 0.5$

Here, when the sampled value of the playback signal at time n is "$y_n$" and the state metrics of states S5, S4, S3, S2, S1, and S0 are $m_n(S5), m_n(S4), m_n(S3), m_n(S2), m_n(S1)$, and $m_n(S0)$, state metrics $m_n(S5), m_n(S4), m_n(S3), m_n(S2), m_n(S1)$, and $m_n(S0)$ are expressed as follows:

$$m_n(S5) = m_{n-1}(S4) + l_{45}$$
$$= m_{n-1}(S4) - y_n + 0.5$$

$$m_n(S4) = m_{n-1}(S3) + l_{34}$$
$$= m_{n-1}(S3)$$

$$m_n(S3) = \min[m_{n-1}(S3) + l_{33}, m_{n-1}(S2) + l_{23}]$$
$$= \min[m_{n-1}(S3) + y_n + 0.5, m_{n-1}(S2) + y_n + 0.5]$$

$$m_n(S2) = m_{n-1}(S1) + l_{12}$$
$$= m_{n-1}(S1) + y_n + 0.5$$

$$m_n(S1) = m_{n-1}(S0) + l_{01}$$
$$= m_{n-1}(S0)$$

$$m_n(S0) = \min[m_{n-1}(S0) + l_{00}, m_{n-1}(S5) + l_{50}]$$
$$= \min[m_{n-1}(S0) - y_n + 0.5, m_{n-1}(S5) - y_n + 0.5]$$

Figure 34:
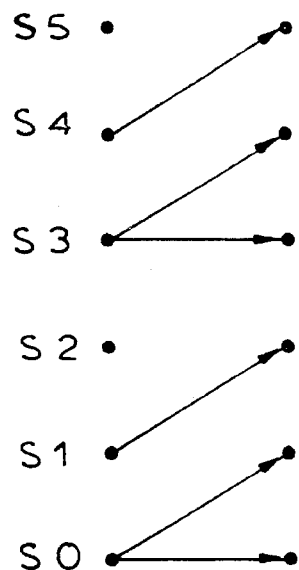
FIG. 34 shows a trellis diagram of merge 0.
Figure 36:
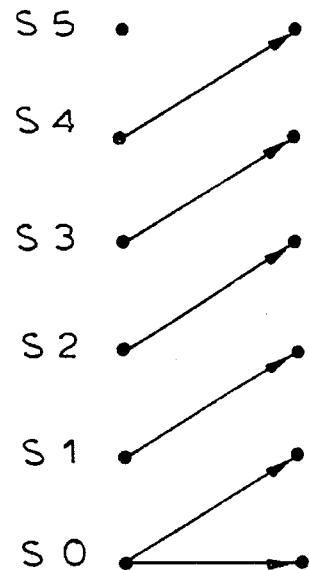
FIG. 36 shows a trellis diagram of merge 2.
Figure 35:
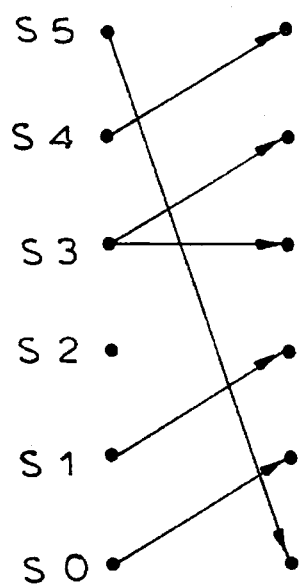
FIG. 35 shows a trellis diagram of merge 1.
Figure 37:
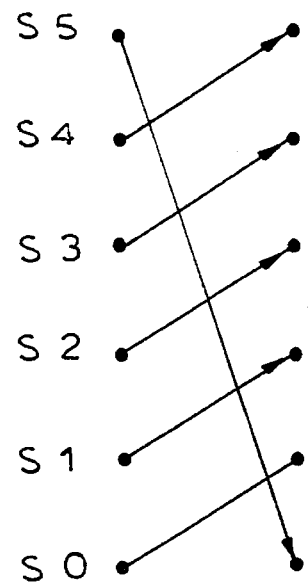
FIG. 37 shows a trellis diagram of merge 3.

At this time, merge 0, merge 1, merge 2, and merge 3 are defined as follows:

<merge 0>
when $m_{n-1}(S3) < m_{n-1}(S2)$ and $m_{n-1}(S0) < m_{n-1}(S5)$,
$m_n(S5) = m_{n-1}(S4) - y_n + 0.5$,
$m_n(S4) = m_{n-1}(S3)$,
$m_n(S3) = m_{n-1}(S3) + y_n + 0.5$,
$m_n(S2) = m_{n-1}(S1) + y_n + 0.5$,
$m_n(S1) = m_{n-1}(S0)$, and
$m_n(S0) = m_{n-1}(S0) - y_n + 0.5$;
and the trellis diagram is as shown in FIG. 34:

<merge 1>
when $m_{n-1}(S3) < m_{n-1}(S2)$ and $m_{n-1}(S0) \geq m_{n-1}(S5)$,
$m_n(S5) = m_{n-1}(S4) - y_n + 0.5$,
$m_n(S4) = m_{n-1}(S3)$,
$m_n(S3) = m_{n-1}(S3) + y_n + 0.5$,
$m_n(S2) = m_{n-1}(S1) + y_n + 0.5$,
$m_n(S1) = m_{n-1}(S0)$, and
$m_n(S0) = m_{n-1}(S5) - y_n + 0.5$;
and the trellis diagram is as shown in FIG. 35:

<merge 2>
when $m_{n-1}(S3) \geq m_{n-1}(S2)$ and $m_{n-1}(S0) < m_{n-1}(S5)$,
  $m_n(S5) = m_{n-1}(S4) - y_n + 0.5$,
  $m_n(S4) = m_{n-1}(S3)$,
  $m_n(S3) = m_{n-1}(S2) + y_n + 0.5$,
  $m_n(S2) = m_{n-1}(S1) + y_n + 0.5$,
  $m_n(S1) = m_{n-1}(S0)$, and
  $m_n(S0) = m_{n-1}(S0) - y_n + 0.5$;
and the trellis diagram is as shown in FIG. 36:

<merge 3>
when $m_{n-1}(S3) \geq m_{n-1}(S2)$ and $m_{n-1}(S0) \geq m_{n-1}(S5)$,
  $m_n(S5) = m_{n-1}(S4) - y_n + 0.5$,
  $m_n(S4) = m_{n-1}(S3)$,
  $m_n(S3) = m_{n-1}(S2) + y_n + 0.5$,
  $m_n(S2) = m_{n-1}(S1) + y_n + 0.5$,
  $m_n(S1) = m_{n-1}(S0)$, and
  $m_n(S0) = m_{n-1}(S5) - y_n + 0.5$;
and the trellis diagram is as shown in FIG. 37.

When the playback data conforms to "y" ($-1 \leq y \leq 1$), "y+0.5" and "-y+0.5" are calculated and the merges are judged as follows:

(1) merge 0
when $m(S3) < m(S2)$ and $m(S0) < m(S5)$,
  $m(S5) = m(S4) - y + 0.5$,
  $m(S4) = m(S3)$,
  $m(S3) = m(S3) + y + 0.5$,
  $m(S2) = m(S1) + y + 0.5$,
  $m(S1) = m(S0)$, and
  $m(S0) = m(S0) - y + 0.5$:

(2) merge 1
when $m(S3) < m(S2)$ and $m(S0) \geq m(S5)$,
  $m(S5) = m(S4) - y + 0.5$,
  $m(S4) = m(S3)$,
  $m(S3) = m(S3) + y + 0.5$,
  $m(S2) = m(S1) + y + 0.5$,
  $m(S1) = m(S0)$, and
  $m(S0) = m(S5) - y + 0.5$:

(3) merge 2
when $m(S3) \geq m(S2)$ and $m(S0) < m(S5)$,
  $m(S5) = m(S4) - y + 0.5$,
  $m(S4) = m(S3)$,
  $m(S3) = m(S2) + y + 0.5$,
  $m(S2) = m(S1) + y + 0.5$,
  $m(S1) = m(S0)$, and
  $m(S0) = m(S0) - y + 0.5$:

(4) merge 3
when $m(S3) \geq m(S2)$ and $m(S0) \geq m(S5)$,
  $m(S5) = m(S4) - y + 0.5$,
  $m(S4) = m(S3)$,
  $m(S3) = m(S2) + y + 0.5$,
  $m(S2) = m(S1) + y + 0.5$,
  $m(S1) = m(S0)$, and
  $m(S0) = m(S5) - y + 0.5$.

Subsequently, according to which of (1) or (2) below is generated, the path is merged and the output data corresponding to the playback data is obtained.

(1) When a path connecting five consecutive states is (merge 0 or merge 1)—(merge 0 or merge 1)—merge 1—(merge 0 or merge 1)—(merge 0 or merge 1), the path is merged with state S3.

(2) When a path connecting five consecutive states is (merge 0 or merge 2)—(merge 0 or merge 2)—merge 2—(merge 0 or merge 2)—(merge 0 or merge 2), the path is merged with state S0.

Figure 38:
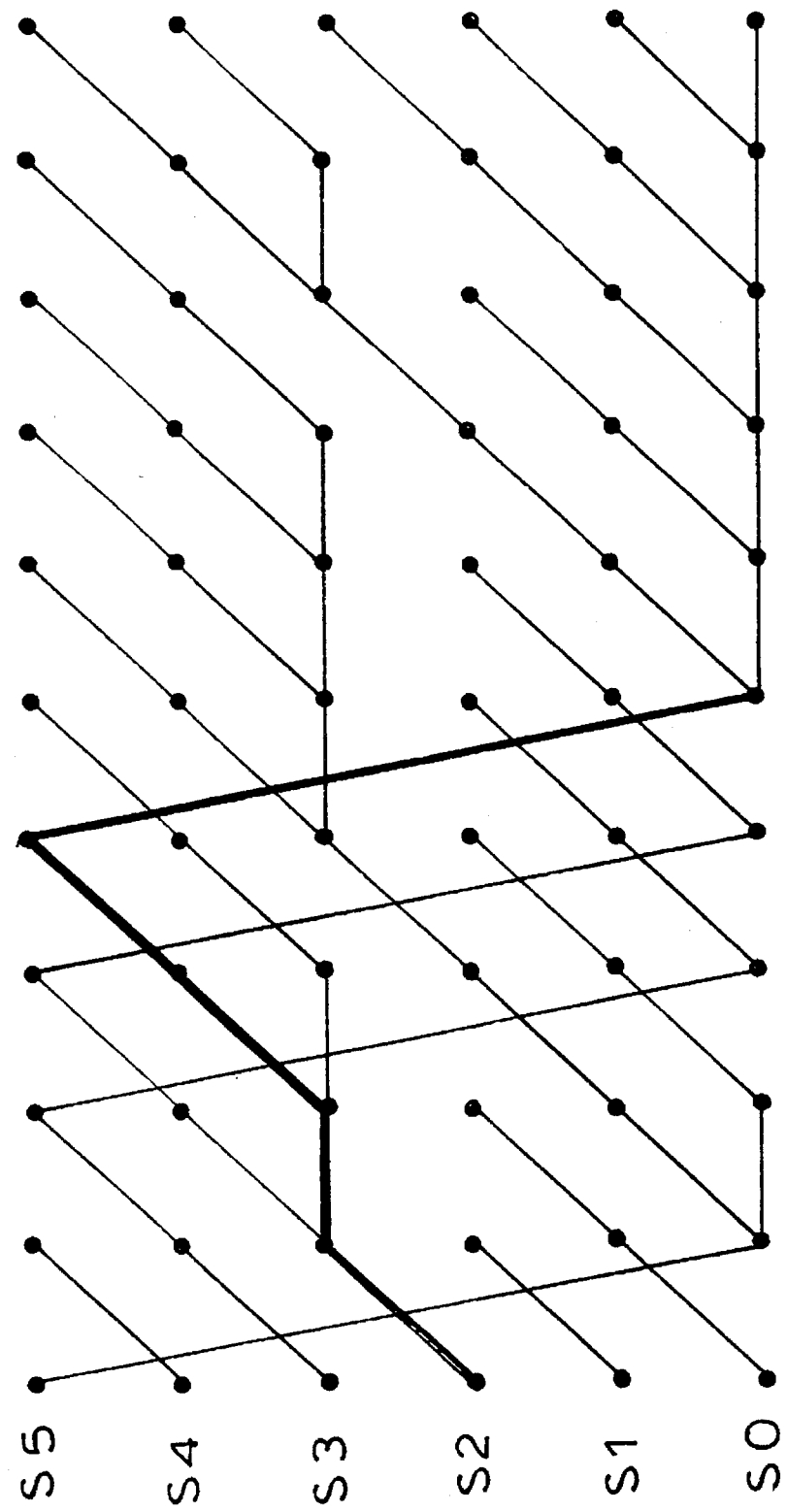
FIG. 38 shows a series of path merges for the purpose of illustrating the Viterbi decoding method according to the third embodiment of a playback data detecting method of the present invention.

One series of path merges is shown in FIG. 38.

By merging the path as described above, one state is obtained from among the six states S0–S5. As a result, the output data can be obtained by making the output corresponding to state S0, state S2, state S3, or state S5 a value "0" and making the output data corresponding to state S1 or state S4 a value "1." In this manner, bit error correcting for random errors can be carried out.

Next, a Viterbi decoder 300 capable of actually realizing the above-described Viterbi decoding method according to the third embodiment of the playback data detecting method of the present invention will be described with reference to FIG. 39. The Viterbi decoder 300 includes an A/D convertor circuit 301, a condition calculation circuit 302, a standardized metric calculation & merge judging circuit 303, a path merge judging circuit 304, and a path memory circuit 305. The A/D convertor circuit 301 is provided for the purpose of analog-to-digital converting the output signal e(t) of the high-pass filter (see FIG. 1) provided on the preceding level of the Viterbi decoder 300 and producing the sampled value $y_n$ of the playback signal. The condition calculation circuit 302 is provided for calculating "$y_n+0.5$" and "$y_n-0.5$" using the sampled value $y_n$ of the playback signal sent thereto from the A/D conversion circuit 301. The standardized metric calculation & merge judging circuit 303 is provided for calculating state metrics $m_n(S5)$, $m_n(S4)$, $m_n(S3)$, $m_n(S2)$, $m_n(S1)$, and $m_n(S0)$ by the above-described method using the calculation result of "$y_n+0.5$" and the calculation result of "$y_n-0.5$" sent thereto from the condition calculation circuit 302. The standardized metric calculation & merge judging circuit 303 is also provided for judging the above-described merge 0, merge 1, merge 2, and merge 3 by comparing the size of state metric $m_{n-1}(S3)$ and the size of state metric $m_{n-1}(S2)$ and comparing the size of state metric $m_{n-1}(S5)$ and the size of state metric $m_{n-1}(S0)$. The path merge judging circuit 304 is provided for the purpose of detecting the continuity of the merge using a signal indicating the result of the size judgment of state metric $m_{n-1}(S3)$ and state metric $m_{n-1}(S2)$ and a signal indicating the size judgment of state metric $m_{n-1}(S5)$ and state metric $m_{n-1}(S0)$ both of which are sent thereto from the standardized metric calculation & merge judging circuit 303. The path merge judging circuit 304 makes the path merge of the path memory circuit 305 on the next level an S0 merge by making a signal PM1 a value "1" (high level) and a signal PM0 a value "0" (low level) when the merge shifts as (merge 0 or merge 2) (merge 2)—(merge 0 or merge 2)—merge 2—(merge 0 or merge 2) (merge 2)—(merge 0 or merge 2), and makes the path merge of the path memory circuit 305 merge by making the signal PM1 and the signal PM0 both a value "0" (low level) when the merge shifts as (merge 0 or merge 1)—(merge 0 or merge 1)—merge 1 (merge 1—(merge 0 or merge 1)—(merge 0 or merge 1). The path merge judging circuit 304 makes the path merge of the path memory circuit 305 "through" by making the signal PM1 and the signal PM0 both a value "0" (low level) when the merge makes a transition other than those described above. The path merge judging circuit 304 inhibits the merge in the path memory circuit 305 by making the signal PM0 a value "1" (high level) and the signal PM1 a value "0" (low level) when the merge makes a forbidden transition. The path memory circuit 305 is provided for the purpose of carrying out the path merge according to the signal PM1 and the signal PM0 both of which are sent thereto from the path merge judging circuit 304 and outputting the output data the value of which is "0" for state S0, state S2, state S3, or state S5 and is "1" for state S1 or state S4.

In the standardized metric calculation & merge judging circuit 303, the state metric $m_n(S5)$ of state S5, the state metric $m_n(S4)$ of state S4, the state metric $m_n(S3)$ of state S3, the state metric $m_n(S2)$ of state S2, and the state metric $m_n(S1)$ of state S1 can be found as the relative values with the state metric $m_n(S0)$ of state S0.

The Viterbi decoding method of the third embodiment of the playback data detecting method of the present invention is intended for producing the playback data according to an NRZ method, but can also be applied for applications in which the playback data according to the NRZI method is produced by carrying out the following modifications.

(1) When the signal e(t) of "1" is inputted during state S0, a transition is made to state S0 and the value of the output signal f(t) is made "0." When the signal e(t) of "0" is inputted during state S0, a transition is made to state S1 and the value of the output signal f(t) is made "1." When the signal e(t) of "−1" is inputted during state S1, a transition is made to state S2 and the value of the output signal f(t) is made "1." When the signal e(t) of "−1" is inputted during state S2, a transition is made to state S3 and the value of the output signal f(t) is made "1." When the signal e(t) of "−1" is inputted during state S3, a transition is made to state S3 and the value of the output signal f(t) is made "1." When the signal e(t) of "0" is inputted during state S3, a transition is made to state S4 and the value of the output signal f(t) is made "0." When the signal e(t) of "1" is inputted during state S4, a transition is made to state S5 and the value of the output signal f(t) is made "0." When the signal e(t) of "1" is inputted during state S5, a transition is made to state S0 and the value of the output signal f(t) is made "0." When the signal e(t) violating these state transition rules is inputted, bit error correction is performed by detecting an incorrect state and judging an original state. As a result, error rate for random errors is performed.

(2) The output data is obtained by making the output data corresponding to state S0, state S4, or state S5 a value "0" and making the output data corresponding to state S1, state S2, or state S3 a value "1."

Figure 39:
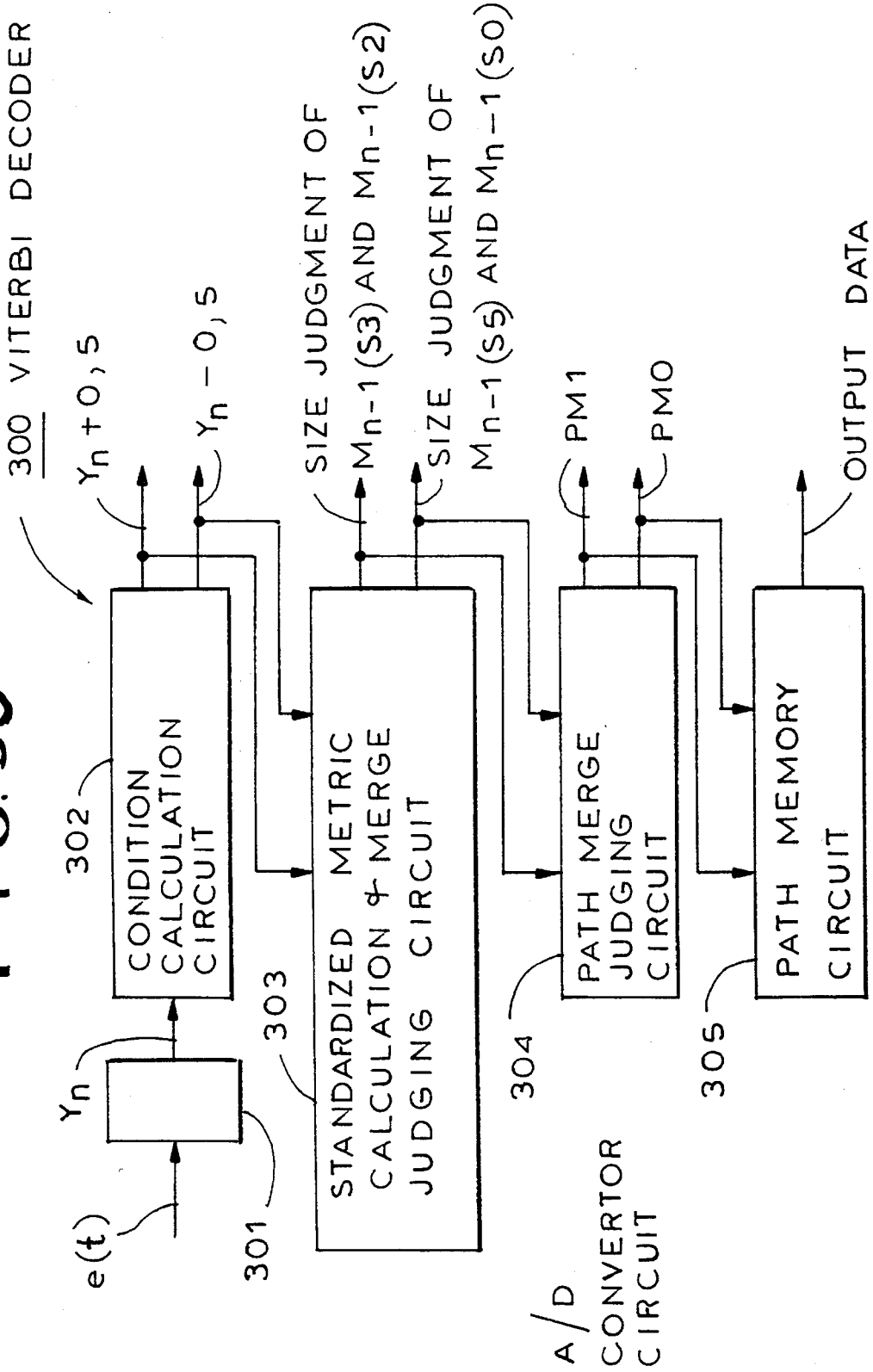
FIG. 39 is a block diagram showing a series of Viterbi decoders capable of concretely realizing the Viterbi decoding method according to the third embodiment of the playback data detecting method of the present invention.

A Viterbi decoder for producing the playback data according to the NRZI method can be realized by outputting output data of "0" for state S0, state S4 or state S5 and outputting output data of "1" for state S1, state S2, or state S3 in the path memory circuit 305 of the Viterbi decoder 300 shown in FIG. 39.

Figure 40:
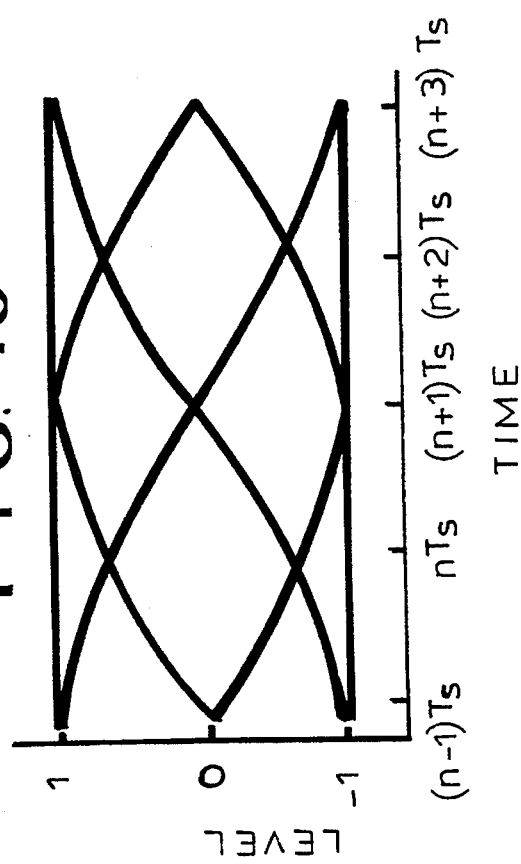
FIG. 40 is a graph showing a series of an eye pattern of the output signal of a high-pass filter shown in FIG. 1.

A Viterbi decoding method according to the fourth embodiment of the playback data detecting method of the present invention applies to a playback signal converted from a binary to three-value signal by a partial response (1, 1) encoding method. In other words, for recording data made up of code in which one or more "0s" exist in the space between "1" and "1" of a code such as (1, 7), the eye pattern of the output signal e(t) of high path filter 13 shown in FIG. 1 takes the form shown in FIG. 40. Consequently, when sampling is carried out of the signal e(t) for every period Ts of recording data, signals of three values "1", "0," and "−1" are obtained (These signals of three values will hereinafter be referred to as "3-value conversion signals."). On the other hand, when sampling is carried out of the signal e(t) for every period Ts of recording data shifted a half-period, signals of two values "1" and "−1" are obtained (These signals of two values will hereinafter be referred to as "binary conversion signals."). Thus, the Viterbi decoding method according to the fourth embodiment of the playback data detecting method of the present invention obtains output data according to the NRZ method using the three-value conversion signals and the binary conversion signals. The playback signals are obtained by playing back the recording signal according to the NRZI method recorded to a magnetic medium such as tape after having been converted to channel bits while the number of the continuous non-inverse bits is constrained within a range of a minimum of "2."

Figure 41:
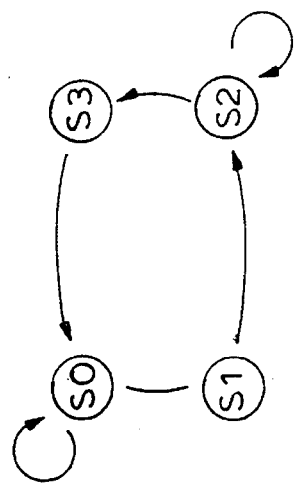
FIG. 41 is a state transition diagram for the purpose of illustrating the Viterbi decoding method according to the fourth embodiment of the playback data detecting method of the present invention.
Figure 42:
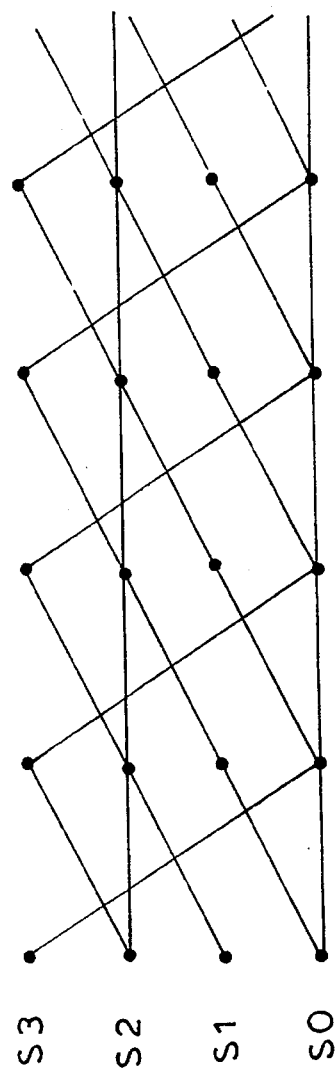
FIG. 42 is a trellis diagram for the purpose of illustrating the Viterbi decoding method according to the fourth embodiment of a playback data detecting method of the present invention.

In concrete terms, as shown in the state transition chart of FIG. 41 and the trellis diagram of FIG. 42, in the Viterbi decoding method according to the fourth embodiment of the playback data detecting method of the present invention, the playback state is one of the four states state S0, state S1, state S2, and state S3. When the three-value conversion signal of "−1" and the binary conversion signal "−1" are continuously inputted during state S0, a transition is made to state S0 and the value of the output signal f(t) is made "0." When the three-value conversion signal of "0" and the binary conversion signal of "1" are continuously inputted during state S0, a transition is made to state S1 and the value of the output signal f(t) is made "1." When the three-value conversion signal of "1" and the binary conversion signal of "1" are continuously inputted during state S1, a transition is made to state S2 and the value of the output signal f(t) is made "0." When the three-value conversion signal of "1" and the binary conversion signal of "1" are continuously inputted during state S2, a transition is made to state S2 and the value of the output signal f(t) is made "0." When the three-value conversion signal of "0" and the binary conversion signal of "−1" are continuously inputted during state S2, a transition is made to state S3 and the value of the output signal f(t) is made "1." When the three-value conversion signal of "−1" and the binary conversion signal of "−1" are continuously inputted during state S3, a transition is made to state S0 and the value of the output signal f(t) is made "0." When the three-value conversion signal and the binary conversion signal that violate the above-described state transition rules are continuously inputted, bit error correction is performed by detecting an incorrect state and judging an original state. As a result, error rate of random errors is improved.

When the three-value conversion signal is $y_{3k}$ and the binary conversion signal following this three-value conversion signal is $y_{2k}$, standardized metrics $l_{00}, l_{01}, l_{12}, l_{22}, l_{23}$, and $l_{30}$, are defined as follows:

$l_{00} = y_{3k} + 0.5 + y_{2k}$ $l_{01} = -y_{2k}$ $l_{12} = -y_{3k} + 0.5 - y_{2k}$ $l_{22} = -y_{3k} + 0.5 - y_{2k}$ $l_{23} = y_{2k}$ $l_{30} = y_{3k} + 0.5 + y_{2k}$

Here, when the sampled value of the three-value conversion signal $y_{3k}$ at time n is $y_{3n}$ and the sampled value of the binary conversion signal $y_{2k}$ at time n is $y_{2n}$, the state metrics of states S3, S2, S1, and S0 are $m_n(S3), m_n(S2), m_n(S1)$, and $m_n(S0)$, state metric $m_n(S3), m_n(S2), m_n(S1)$, and $m_n(S0)$ are expressed as follows:

$$\begin{aligned} m_n(S3) &= m_{n-1}(S2) + l_{23} \\ &= m_{n-1}(S2) + y_{2n} \\ m_n(S2) &= \min[m_{n-1}(S2) + l_{22}, m_{n-1}(S1) + l_{12}] \\ &= \min[m_{n-1}(S2) - y_{3n} + 0.5 - y_{2n}, \\ &\quad m_{n-1}(S1) - y_{3n} + 0.5 - y_{2n}] \\ m_n(S1) &= m_{n-1}(S0) + l_{01} \\ &= m_{n-1}(S0) - y_{2n} \end{aligned}$$

-continued $$m_n(S0) = \min[m_{n-1}(S0) + l_{00}, m_{n-1}(S3) + l_{30}]$$
$$= \min[m_{n-1}(S0) + y_{3n} + 0.5 + y_{2n},$$
$$m_{n-1}(S3) + y_{3n} + 0.5 + y_{2n}]$$

At this time, merge 0, merge 1, merge 2, and merge 3 are defined as follows:

<merge 0>
when $m_{n-1}(S2) < m_{n-1}(S1)$ and $m_{n-1}(S0) < m_{n-1}(S3)$,
$m_n(S3) = m_{n-1}(S2) + y_{2n}$,
$m_n(S2) = m_{n-1}(S2) - y_{3n} + 0.5 - y_{2n}$,
$m_n(S1) = m_{n-1}(S0) - y_{2n}$, and
$m_n(S0) = m_{n-1}(S0) + y_{3n} + 0.5 + y_{2n}$;
and the trellis diagram is as shown in FIG. 43:

<merge 1>
when $m_{n-1}(S2) < m_{n-1}(S1)$ and $m_{n-1}(S0) \geq m_{n-1}(S3)$,
$m_n(S3) = m_{n-1}(S2) + y_{2n}$,
$m_n(S2) = m_{n-1}(S2) - y_{3n} + 0.5 - y_{2n}$,
$m_n(S1) = m_{n-1}(S0) - y_{2n}$, and
$m_n(S0) = m_{n-1}(S3) + y_{3n} + 0.5 + y_{2n}$;
and the trellis diagram is as shown in FIG. 44:

<merge 2>
when $m_{n-1}(S2) \geq m_{n-1}(S1)$ and $m_{n-1}(S0) < m_{n-1}(S3)$,
$m_n(S3) = m_{n-1}(S2) + y_{2n}$,
$m_n(S2) = m_{n-1}(S1) - y_n + 0.5 - y_{2n}$,
$m_n(S1) = m_{n-1}(S0) - y_{2n}$, and
$m_n(S0) = m_{n-1}(S0) + y_{3n} + 0.5 + y_{2n}$;
and the trellis diagram is as shown in FIG. 45:

<merge 3>
when $m_{n-1}(S2) \geq m_{n-1}(S1)$ and $m_{n-1}(S0) \geq m_{n-1}(S3)$,
$m_n(S3) = m_{n-1}(S2) + y_{2n}$,
$m_n(S2) = m_{n-1}(S1) - y_n + 0.5 - y_{2n}$,
$m_n(S1) = m_{n-1}(S0) - y_{2n}$, and
$m_n(S0) = m_{n-1}(S3) + y_{3n} + 0.5 + y_{2n}$;
and the trellis diagram is as shown in FIG. 46.

When the three-value playback data is $y_3$ ($-1 \leq y_3 \leq 1$) and the binary playback data is $y_2$ ($-1 \leq y_3 \leq 1$), each of $-y_2$, "$y_3 + 0.5 - y_2$," and "$y_3 + 0.5 + y_2$" is calculated and the merges are judged as follows:

(1) merge 0
when $m(S2) < m(S1)$ and $m(S0) < m(S3)$,
$m(S3) = m(S2) + y_2$,
$m(S2) = m(S2) - y_3 + 0.5 - y_2$,
$m(S1) = m(S0) - y_2$, and
$m(S0) = m(S0) + y_3 + 0.5 + y_2$:

(2) merge 1
when $m(S2) < m(S1)$ and $m(S0) \geq m(S3)$,
$m(S3) = m(S2) + y_2$,
$m(S2) = m(S2) - y_3 + 0.5 - y_2$,
$m(S1) = m(S0) - y_2$, and
$m(S0) = m(S3) + y_3 + 0.5 + y_2$:

(3) merge 2
when $m(S2) \geq m(S1)$ and $m(S0) < m(S3)$,
$m(S3) = m(S2) + y_2$,
$m(S2) = m(S1) - y_3 + 0.5 - y_2$,
$m(S1) = m(S0) - y_2$, and
$m(S0) = m(S0) + y_3 + 0.5 + y_2$:

(4) merge 3
when $m(S2) \geq m(S1)$ and $m(S0) \geq m(S3)$,
$m(S3) = m(S2) + y_2$,
$m(S2) = m(S1) - y_3 + 0.5 - y_2$,
$m(S1) = m(S0) - y_2$, and
$m(S0) = m(S3) + y_3 + 0.5 + y_2$.

Subsequently, according to which of (1) or (2) below is generated, the path is merged and the output data corresponding to the playback data is obtained.

(1) When a path connecting three consecutive states is (merge 0 or merge 1)—merge 1—(merge 0 or merge 1), the path is merged with state S2.

(2) When a path connecting three consecutive states is (merge 0 or merge 2)—merge 2—(merge 0 or merge 2), the path is merged with state S0.

One series of path merges is shown in FIG. 47.

By merging the path as described above, one state is obtained from among the four states S0–S3. As a result, the output data can be obtained by making the output corresponding to state S0 or state S2 a value "0" and making the output data corresponding to state S1 or state S3 a value "1." In this manner, bit error correcting for random errors can be carried out.

Next, a Viterbi decoder 500 capable of actually realizing the above-described Viterbi decoding method according to the fourth embodiment of the playback data detecting method of the present invention will be described with reference to FIG. 48. The Viterbi decoder 500 includes an A/D convertor circuit 501, a condition calculation circuit 502, a standardized metric calculation & merge judging circuit 503, a path merge judging circuit 504, and a path memory circuit 505. The A/D convertor circuit 501 is provided for the purpose of analog-to-digital converting the output signal e(t) of the high-pass filter (see FIG. 1) provided on the preceding level of the Viterbi decoder 500 by a first sampling clock synchronized with the period Ts of the recording data and a second sampling clock shifted half a period from the first sampling clock and producing the sampled value $y_{3n}$ of the three-value conversion signal and the sampling value $y_{2n}$ of the binary conversion signal. The condition calculation circuit 502 is provided for calculating $-y_{2n}$, "$-y_{3n} + 0.5 - y_{2n}$," and "$y_{3n} + 0.5 - y_{2n}$" using the sampling value $y_{3n}$ of the three-value conversion signal and the sampling value $y_{2n}$ of the binary conversion signal both of which are sent thereto from the A/D conversion circuit 501. The standardized metric calculation & merge judging circuit 503 is provided for calculating state metrics $m_n(S3)$, $m_n(S2)$, $m_n(S1)$, and $m_n(S0)$ by the above-described method using the sampling value $y_{2n}$ of the binary conversion signal, a signal indicating the calculation result of "$y_{3n} + 0.5 - y_{2n}$," a signal indicating the calculation result of $-y_{2n}$, and a signal indicating the calculation result of "$y_{3n} + 0.5 - y_{2n}$" all of which are sent thereto from the condition calculation circuit 502. The standardized metric calculation & merge judging circuit 503 is also provided for judging the above-described merge 0, merge 1, merge 2, and merge 3 by comparing the size of state metric $m_{n-1}(S2)$ and the size of state metric $m_{n-1}(S1)$ and comparing the size of state metric $m_{n-1}(S0)$ and the size of state metric $m_{n-1}(S3)$. The path merge judging circuit 504 is provided for the purpose of detecting the continuity of the merge using a signal indicating the result of the size judgment of state metric $m_{n-1}(S2)$ and state metric $m_{n-1}(S1)$ and a signal indicating the size judgment of state metric $m_{n-1}(S0)$ and the size of state metric $m_{n-1}(S3)$ both of which are sent thereto from the standardized metric calculation & merge judging circuit 303. The path merge judging circuit 504 makes the path merge of the path memory circuit 505 on the next level an S0 merge by making a signal PM1 a value "1" (high level) and a signal PM0 a value "0" (low level) when the merge shifts as (merge 0 or merge 2)—merge 2—(merge 0 or merge 2), and makes the path merge of the path memory circuit 505 an S2 merge by making the signal PM1 and the signal PM0 both a value "1" (high level) when the merge shifts as (merge 0 or merge 1)—merge 1—(merge 0 or merge 1). The path merge judging circuit 504 makes the path merge of the path memory circuit 505 "through" by making the signal PM1 and the signal PM0 both a value "0" (low level) when the merge makes a transition other than those described above. The path merge judging circuit 504 inhibits the merge in the path memory circuit 505 by making the signal PM1 a value "0" (low level) and the signal PM0 a value "1" (high level) when the merge makes a forbidden transition. The path memory circuit 505 is provided for the purpose of carrying out a path merge according to the signal PM1 and the signal PM0 both of which are sent thereto from the path merge judging circuit 504 and outputting output data the value of which is "0" for state S0 or state S2 and is "1" for state S1 or state S3.

In the standardized metric calculation & merge judging circuit 503, state metric $m_n(S3)$ of state S3, state metric $m_n(S2)$ of state S2 and state metric $m_n(S1)$ of state S1 can be found as the relative values with state metric $m_n(S0)$ of state S0.

The Viterbi decoding method of the fourth embodiment of the playback data detecting method of the present invention is intended for producing the playback data according to the NRZ method, but can also be applied for applications in which the playback data according to the NRZI method is produced by carrying out the following modifications.

(1) When the three-value conversion signal of "−1" and the binary conversion signal of "−1" are continuously inputted during state S0, a transition is made to state S0 and the value of the output signal f(t) is made "0." When the three-value conversion signal of "0" and the binary conversion signal of "1" are continuously inputted during state S0, a transition is made to state S1 and the value of the output signal f(t) is made "1." When the three-value conversion signal of "1" and the binary conversion signal of "1" are continuously inputted during state S1, a transition is made to state S2 and the value of the output signal f(t) is made "1." When the three-value conversion signal of "1" and the binary conversion signal of "1" are continuously inputted during state S2, a transition is made to state S2 and the value of the output signal f(t) is made "1." When the three-value conversion signal of "0" and the binary conversion signal of "−1" are continuously inputted during state S2, a transition is made to state S3 and the value of the output signal f(t) is made "0." When the three-value conversion signal of "−1" and the binary conversion signal of "−1" are continuously inputted during state S3, a transition is made to state S0 and the value of the output signal f(t) is made "0." When the three-value conversion signal and the binary conversion signal violating these state transition rules are continuously inputted, bit error correction is performed by detecting an incorrect state and judging an original state. As a result, error rate for random errors is improved.

(2) The output data is obtained by making the output data corresponding to state S0 or state S3 a value "0" and making the output data corresponding to state S1 or state S2 a value "1."

Figure 48:
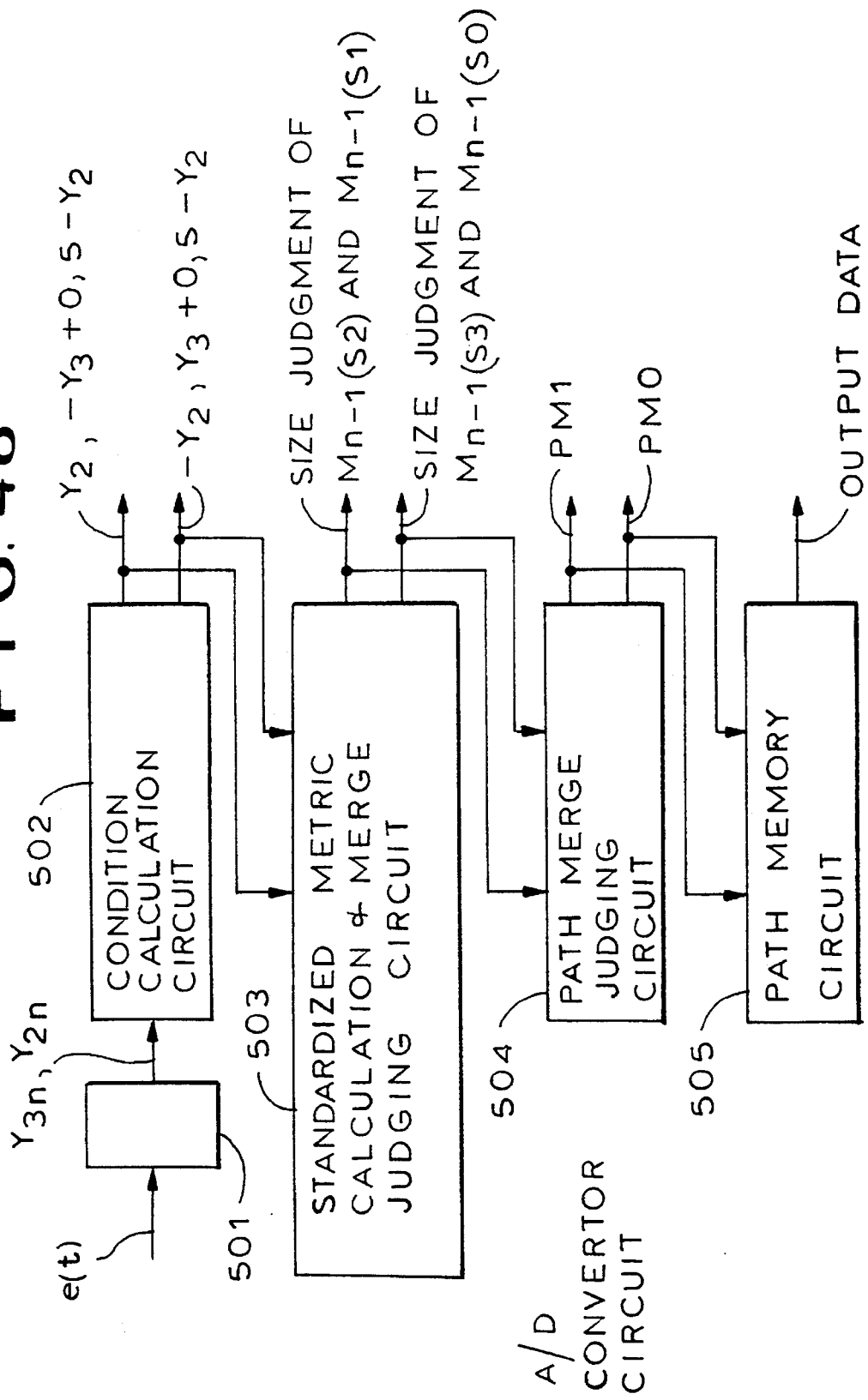
FIG. 48 is a block diagram showing a series of Viterbi decoders capable of concretely realizing the Viterbi decoding method according to the fourth embodiment of the playback data detecting method of the present invention.

A Viterbi decoder for producing the playback data according to the NRZI method can be realized by outputting the output data of "0" for state S0 or state S3 and outputting the output data of "1" for state S1 or state S2 in the path memory circuit 505 of the Viterbi decoder 500 shown in FIG. 48.

While the present invention has been described in conjunction with preferred embodiments thereof, it will now be possible for one skilled in the art to easily put the present invention into practice in various other manners.

What is claimed is:

1. A playback data detecting method for producing an NRZ playback data according to a Viterbi decoding method using a playback signal having a value of "−1" or "1" played back from a recording medium, for an NRZI recording data recorded to the recording medium after having been converted to channel bits while constraining the number of continuous noninverse bits within a range of a minimum of "2," and using four playback states which are state S0, state S1, state S2, and state S3 comprising;

a step of making a state transition and producing an output signal as follows:

when the playback signal of "−1" is inputted during state S0, the transition is made to state S0 and the value of the output signal is made "0,"

when the playback signal of "1" is inputted during state S0, the transition is made to state S1 and the value of the output signal is made "1,"

when the playback signal of "1" is inputted during state S1, the transition is made to state S2 and the value of the output signal is made "0,"

when the playback signal of "1" is inputted during state S2, the transition is made to state S2 and the value of the output signal is made "0,"

when the playback signal of "−1" is inputted during state S2, the transition is made to state S3 and the value of the output signal is made "1,"

and when the playback signal of "−1" is inputted during state S3, the transition is made to state S0 and the value of the output signal is made "0:" and a step of performing bit error correcting by detecting an incorrect state and judging an original state when the playback signal violating the above-described state transition rules is inputted.

2. The playback data detecting method of claim 1 comprising;

in a case in which a reciprocal of a probability of taking state S0 is state metric m(S0), a reciprocal of a probability of taking state S1 is state metric m(S1), a reciprocal of a probability of taking state S2 is state metric m(S2), a reciprocal of a probability of taking state S3 is state metric m(S3), and the playback signal is "y" ($-1 \leq y \leq 1$), a step of judging merge 0, merge 1, merge 2, and merge 3 as follows:

(a) when state metric m(S2)<state metric m(S1) and state metric m(S0)<state metric m(S3), merge 0 is judged by carrying out the following calculations,
state metric m(S3)=state metric m(S2)+y,
state metric m(S2)=state metric m(S2)−y,
state metric m(S1)=state metric m(S0)−y, and
state metric m(S0)=state metric m(S0)+y;

(b) when state metric m(S2)<state metric m(S1) and state metric m(S0)≧state metric m(S3), merge 1 is judged by carrying out the following calculations,
state metric m(S3)=state metric m(S2)+y,
state metric m(S2)=state metric m(S2)−y,
state metric m(S1)=state metric m(S0)−y, and
state metric m(S0)=state metric m(S3)+y;

(c) when state metric m(S2)≧state metric m(S1) and state metric m(S0)<state metric m(S3), merge 2 is judged by carrying out the following calculations,
state metric m(S3)=state metric m(S2)+y,
state metric m(S2)=state metric m(S1)−y,
state metric m(S1)=state metric m(S0)−y, and
state metric m(S0)=state metric m(S0)+y;

(d) and when state metric m(S2)≧state metric m(S1) and state metric m(S0)≧state metric m(S3), merge 3 is judged by carrying out the following calculations,
state metric m(S3)=state metric m(S2)+y,
state metric m(S2)=state metric m(S1)−y,
state metric m(S1)=state metric m(S0)−y, and
state metric m(S0)=state metric m(S3)+y:

a step of merging a path as follows:
(a) the path is merged to state S2 when the path connecting three successive states is (merge 0 or merge 1)—merge 1 (merge 1—(merge 0 or merge 1);
(b) and the path is merged to state S0 when the path connecting three successive states is (merge 0 or merge 2)—merge 2—(merge 0 or merge 2): and a step of producing the output signal as follows:
(a) the value of the output signal is made "0" when the state decided as described above is state S0 or state S2;
(b) and the value of the output signal is made "1" when the state is state S1 or state S3.

3. A playback data detecting method that produces an NRZI playback data according to a Viterbi decoding method using a playback signal having a value of "−1" or "1" played back from a recording medium, for an NRZI recording data recorded to the recording medium after having been converted to channel bits while constraining the number of continuous non-inverse bits within a range of a minimum of "2," and using four playback states which are state S0, state S1, state S2, and state S3 comprising;

a step of making a state transition and producing an output signal as follows:
when the playback signal of "−1" is inputted during state S0, the transition is made to state S0 and the value of the output signal is made "0,"
when the playback signal of "1" is inputted during state S0, the transition is made to state S1 and the value of the output signal is made "1,"
when the playback signal of "1" is inputted during state S1, the transition is made to state S2 and the value of the output signal is made "1,"
when the playback signal of "1" is inputted during state S2, the transition is made to state S2 and the value of the output signal is made "1,"
when the playback signal of "−1" is inputted during state S2, the transition is made to state S3 and the value of the output signal is made "0,"
and when the playback signal of "−1" is inputted during state S3, the transition is made to state S0 and the value of the output signal is made "0:" and a step of performing bit error correcting by detecting an incorrect state and judging an original state when the playback signal violating the above-described state transition rules is inputted.

4. The playback data detecting method of claim 3 comprising;

in a case in which a reciprocal of a probability of taking state S0 is state metric m(S0), a reciprocal of a probability of taking state S1 is state metric m(S1), a reciprocal of a probability of taking state S2 is state metric m(S2), a reciprocal of a probability of taking state S3 is state metric m(S3), and the playback signal is "y" ($-1 \leq y \leq 1$), a step of judging merge 0, merge 1, merge 2, and merge 3 as follows:
(a) when state metric m(S2)<state metric m(S1) and state metric m(S0)<state metric m(S3), merge 0 is judged by carrying out the following calculations,
state metric m(S3)=state metric m(S2)+y,
state metric m(S2)=state metric m(S2)−y,
state metric m(S1)=state metric m(S0)−y, and
state metric m(S0)=state metric m(S0)+y;
(b) when state metric m(S2)<state metric m(S1) and state metric m(S0)≧state metric m(S3), merge 1 is judged by carrying out the following calculations,
state metric m(S3)=state metric m(S2)+y,
state metric m(S2)=state metric m(S2)−y,
state metric m(S1)=state metric m(S0)−y, and
state metric m(S0)=state metric m(S3)+y;
(c) when state metric m(S2)≧state metric m(S1) and state metric m(S0)<state metric m(S3), merge 2 is judged by carrying out the following calculations,
state metric m(S3)=state metric m(S2)+y,
state metric m(S2)=state metric m(S1)−y,
state metric m(S1)=state metric m(S0)−y, and
state metric m(S0)=state metric m(S0)+y;
(d) and when state metric m(S2)≧state metric m(S1) and state metric m(S0)≧state metric m(S3), merge 3 is judged by carrying out the following calculations,
state metric m(S3)=state metric m(S2)+y,
state metric m(S2)=state metric m(S1)−y,
state metric m(S1)=state metric m(S0)−y, and
state metric m(S0)=state metric m(S3)+y:

a step of merging a path as follows:
(a) the path is merged to state S2 when the path connecting three successive states is (merge 0 or merge 1)—merge 1— (merge 0 or merge 1),
(b) and the path is merged to state S0 when the path connecting three successive states is (merge 0 or merge 2)—merge 2—(merge 0 or merge 2): and a step of producing the output signal as follows:
(a) the value of the output signal is made "0" when the state decided as described above is state S0 or state S3;
(b) and the value of the output signal is made "1" when the state is state S1 or state S2.

5. A Viterbi decoder having four playback states which are state S0, state S1, state S2, and state S3 and producing an NRZI playback data according to a Viterbi decoding method using a playback signal having a value of "−1" or "1" played back from a recording medium, for an NRZI recording data recorded to the recording medium after having been converted to channel bits while constraining the number of continuous non-inverse bits within a range of a minimum of "2," comprising:

data input means for producing an inverted playback signal from the playback signal;

merge calculation means for calculating state metric m(S0) which is a reciprocal of a probability of taking state S0, state metric m(S1) which is a reciprocal of a probability of taking state S1, state metric m(S2) which is a reciprocal of a probability of taking state S2, and state metric m(S3) which is a reciprocal of a probability of taking state S3 using the playback signal and the inverted playback signal both of which are sent thereto from the data input means, and for judging merge 0, merge 1, merge 2, and merge 3 as follows in a case in which the playback signal is "y" ($-1 \leq y \leq 1$) and the inverted playback signal is "−y" ($-1 \leq y \leq -1$):
(a) when state metric m(S2)<state metric m(S1) and state metric m(S0)<state metric m(S3), merge 0 is judged by carrying out the following calculations,
state metric m(S3)=state metric m(S2)+y,
state metric m(S2)=state metric m(S2)−y,
state metric m(S1)=state metric m(S0)−y, and state metric m(S0)=state metric m(S0)+y;
(b) when state metric m(S2)<state metric m(S1) and state metric m(S0)≧state metric m(S3), merge 1 is judged by carrying out the following calculations,
state metric m(S3)=state metric m(S2)+y,
state metric m(S2)=state metric m(S2)−y,
state metric m(S1)=state metric m(S0)−y, and
state metric m(S0)=state metric m(S3)+y;
(c) when state metric m(S2)≧state metric m(S1) and state metric m(S0)<state metric m(S3), merge 2 is judged by carrying out the following calculations,
state metric m(S3)=state metric m(S2)+y,
state metric m(S2)=state metric m(S1)−y,
state metric m(S1)=state metric m(S0)−y, and
state metric m(S0)=state metric m(S0)+y;
(d) and when state metric m(S2)≧state metric m(S1) and state metric m(S0)≧state metric m(S3), merge 3 is judged by carrying out the following calculations,
state metric m(S3)=state metric m(S2)+y,
state metric m(S2)=state metric m(S1)−y,
state metric m(S1)=state metric m(S0)−y, and
state metric m(S0)=state metric m(S3)+y:

path merge calculation means for producing a signal to merge a path to state S2 when the path connecting three successive states is (merge 0 or merge 1)—merge 1—(merge 0 or merge 1) and a signal to merge a path to state S0 when the path connecting three successive states is (merge 0 or merge 2)—merge 2—(merge 0 or merge 2) based on a judging result of the merge calculation means; and path memory means for merging the path based on a signal sent thereto from the path merge calculation means and for producing the output signal by making the value of the output signal "0" when a resulting judged state is state S0 or state S2 and by making the value of the output signal "1" when the resulting judged state is state S1 or state S3.

6. A Viterbi decoder having four playback states which are state S0, state S1, state S2, and state S3 and producing an NRZI playback data according to a Viterbi decoding method using a playback signal having a value of "−1" or "1" played back from a recording medium, for an NRZI recording data recorded to the recording medium after having been converted to channel bits while constraining the number of continuous non-inverse bits within a range of a minimum of "2," comprising:

data input means for producing an inverted playback signal from the playback signal;

merge calculation means for calculating state metric m(S0) which is a reciprocal of a probability of taking state S0, state metric m(S1) which is a reciprocal of a probability of taking state S1, state metric m(S2) which is a reciprocal of a probability of taking state S2, and state metric m(S3) which is a reciprocal of a probability of taking state S3 using the playback signal and the inverted playback signal both of which are sent thereto from the data input means, and for judging merge 0, merge 1, merge 2, and merge 3 as follows in a case in which the playback signal is "y" (−1≦y≦1) and the inverted playback signal is "−y" (−1≦−y≦1):

(a) when state metric m(S2)<state metric m(S1) and state metric m(S0)<state metric m(S3), merge 0 is judged by carrying out the following calculations,
state metric m(S3)=state metric m(S2)+y,
state metric m(S2)=state metric m(S2)−y,
state metric m(S1)=state metric m(S0)−y, and
state metric m(S0)=state metric m(S0)+y;

(b) when state metric m(S2)<state metric m(S1) and state metric m(S0)≧state metric m(S3), merge 1 is judged by carrying out the following calculations,
state metric m(S3)=state metric m(S2)+y,
state metric m(S2)=state metric m(S2)−y,
state metric m(S1)=state metric m(S0)−y, and
state metric m(S0)=state metric m(S3)+y;

(c) when state metric m(S2)≧state metric m(S1) and state metric m(S0)<state metric m(S3), merge 2 is judged by carrying out the following calculations,
state metric m(S3)=state metric m(S2)+y,
state metric m(S2)=state metric m(S1)−y,
state metric m(S1)=state metric m(S0)−y, and
state metric m(S0)=state metric m(S0)+y;

(d) and when state metric m(S2)≧state metric m(S1) and state metric m(S0)≧state metric m(S3), merge 3 is judged by carrying out the following calculations,
state metric m(S3)=state metric m(S2)+y,
state metric m(S2)=state metric m(S1)−y,
state metric m(S1)=state metric m(S0)−y, and
state metric m(S0)=state metric m(S3)+y:

path merge calculation means for producing a signal to merge a path to state S2 when the path connecting three successive states is (merge 0 or merge 1)—merge 1—(merge 0 or merge 1) and a signal to merge a path to state S0 when the path connecting three successive states is (merge 0 or merge 2)—merge 2—(merge 0 or merge 2) based on a judging result of the merge calculation means; and path memory means for merging the path based on a signal sent thereto from the path merge calculation means and for producing the output signal by making the value of the output signal "0" when a resulting judged state is state S0 or state S3 and by making the value of the output signal "1" when the resulting judged state is state S1 or state S2.

7. A playback data detecting method for producing an NRZ playback data according to a Viterbi decoding method using a three-value playback signal having a value of "1," "0," or "−1" obtained by converting according to a partial response (1, 1) encoding method a binary playback signal played back from a recording medium, for an NRZI recording data recorded to the recording medium after having been converted to channel bits while constraining the number of continuous non-inverse bits within a range of a minimum of "2," and using four playback states which are state S0, state S1, state S2, and state S3 comprising:

a step of making a state transition and producing an output signal as follows:
when the three-value playback signal of "1" is inputted during state S0, the transition is made to state S0 and the value of the output signal is made "0,"
when the three-value playback signal of "0" is inputted during state S0, the transition is made to state S1 and the value of the output signal is made "1,"
when the three-value playback signal of "−1" is inputted during state S1, the transition is made to state S2 and the value of the output signal is made "0,"
when the three-value playback signal of "−1" is inputted during state S2, the transition is made to state S2 and the value of the output signal is made "0,"
when the three-value playback signal of "0" is inputted during state S2, the transition is made to state S3 and the value of the output signal is made "1,"
and when the three-value playback signal of "1" is inputted during state S3, the transition is made to state S0 and the value of the output signal is made "0:" and a step of performing bit error correcting by detecting an incorrect state and judging an original state when the three-value playback signal violating the above-described state transition rules is inputted.

8. The playback data detecting method of claim 7 comprising:

in a case in which a reciprocal of a probability of taking state S0 is state metric m(S0), a reciprocal of a probability of taking state S1 is state metric m(S1), a reciprocal of a probability of taking state S2 is state metric m(S2), a reciprocal of a probability of taking state S3 is state metric m(S3), and the three-value playback signal is "y" ($-1 \leq y \leq 1$), a step of calculating "y+0.5" and "−y+0.5";

a step of judging merge 0, merge 1, merge 2, and merge 3 as follows:
  (a) when state metric m(S2)<state metric m(S1) and state metric m(S0)<state metric m(S3), merge 0 is judged by carrying out the following calculations,
    state metric m(S3)=state metric m(S2),
    state metric m(S2)=state metric m(S2)+y+0.5,
    state metric m(S1)=state metric m(S0), and
    state metric m(S0)=state metric m(S0)−y+0.5;
  (b) when state metric m(S2)<state metric m(S1) and state metric m(S0)≧state metric m(S3), merge 1 is judged by carrying out the following calculations,
    state metric m(S3)=state metric m(S2),
    state metric m(S2)=state metric m(S2)+y+0.5,
    state metric m(S1)=state metric m(S0), and
    state metric m(S0)=state metric m(S3)−y+0.5;
  (c) when state metric m(S2)≧state metric m(S1) and state metric m(S0)<state metric m(S3), merge 2 is judged by carrying out the following calculations,
    state metric m(S3)=state metric m(S2),
    state metric m(S2)=state metric m(S1)+y+0.5,
    state metric m(S1)=state metric m(S0), and
    state metric m(S0)=state metric m(S0)−y+0.5;
  (d) and when state metric m(S2)≧state metric m(S1) and state metric m(S0)≧state metric m(S3), merge 3 is judged by carrying out the following calculations,
    state metric m(S3)=state metric m(S2),
    state metric m(S2)=state metric m(S1)+y+0.5,
    state metric m(S1)=state metric m(S0), and
    state metric m(S0)=state metric m(S3)−y+0.5:

a step of merging a path as follows:
  (a) the path is merged to state S2 when the path connecting three successive states is (merge 0 or merge 1)—merge 1—merge 0 or merge 1),
  (b) and the path is merged to state S0 when the path connecting three successive states is (merge 0 or merge 2)—merge 2—(merge 0 or merge 2): and a step of producing the output signal as follows:
  (a) the value of the output signal is made "0" when a state decided as described above is state S0 or state S2;
  (b) and the value of the output signal is made "1" when the state being state S1 or state S3.

9. A playback data detecting method for producing an NRZI playback data according to a Viterbi decoding method using a three-value playback signal having a value of "1," "0," or "−1" obtained by converting according to a partial response (1, 1) encoding method a binary playback signal played back from a recording medium, for an NRZI recording data recorded to the recording medium after having been converted to channel bits while constraining the number of continuous non-inverse bits within a range of a minimum of "2," and using four playback states which are state S0, state S1, state S2, and state S3 comprising:

a step of making a state transition and producing an output signal as follows:
  when the three-value playback signal of "1" is inputted during state S0, the transition is made to state S0 and the value of the output signal is made "0,"
  when the three-value playback signal of "0" is inputted during state S0, the transition is made to state S1 and the value of the output signal is made "1,"
  when the three-value playback signal of "−1" is inputted during state S1, the transition is made to state S2 and the value of the output signal is made "1,"
  when the three-value playback signal of "−1" is inputted during state S2, the transition is made to state S2 and the value of the output signal is made "1,"
  when the three-value playback signal of "0" is inputted during state S2, the transition is made to state S3 and the value of the output signal is made "0,"
  and when the three-value playback signal of "1" is inputted during state S3, the transition is made to state S0 and the value of the output signal is made "0;" and a step of performing bit error correcting by detecting an incorrect state and judging an original state when the three-value playback signal violating the above-described state transition rules is inputted.

10. The playback data detecting method of claim 9 comprising:

in a case in which a reciprocal of a probability of taking state S0 is state metric m(S0), a reciprocal of a probability of taking state S1 is state metric m(S1), a reciprocal of a probability of taking state S2 is state metric m(S2), a reciprocal of a probability of taking state S3 is state metric m(S3), and the three-value playback signal is "y" ($-1 \leq y \leq 1$), a step of calculating "y+0.5" and "−y+0.5";

a step of judging merge 0, merge 1, merge 2, and merge 3 as follows:
  (a) when state metric m(S2)<state metric m(S1) and state metric m(S0)<state metric m(S3), merge 0 is judged by carrying out the following calculations,
    state metric m(S3)=state metric m(S2),
    state metric m(S2)=state metric m(S2)+y+0.5,
    state metric m(S1)=state metric m(S0), and
    state metric m(S0)=state metric m(S0)−y+0.5;
  (b) when state metric m(S2)<state metric m(S1) and state metric m(S0)≧state metric m(S3), merge 1 is judged by carrying out the following calculations,
    state metric m(S3)=state metric m(S2),
    state metric m(S2)=state metric m(S2)+y+0.5,
    state metric m(S1)=state metric m(S0), and
    state metric m(S0)=state metric m(S3)−y+0.5;
  (c) when state metric m(S2)≧state metric m(S1) and state metric m(S0)<state metric m(S3), merge 2 is judged by carrying out the following calculations,
    state metric m(S3)=state metric m(S2),
    state metric m(S2)=state metric m(S1)+y+0.5,
    state metric m(S1)=state metric m(S0), and
    state metric m(S0)=state metric m(S0)−y+0.5;
  (d) and when state metric m(S2)≧state metric m(S1) and state metric m(S0)≧state metric m(S3), merge 3 is judged by carrying out the following calculations,
    state metric m(S3)=state metric m(S2),
    state metric m(S2)=state metric m(S1)+y+0.5,
    state metric m(S1)=state metric m(S0), and
    state metric m(S0)=state metric m(S3)−y+0.5:

a step of merging a path as follows:
(a) the path is merged to state S2 when the path connecting three successive states is (merge 0 or merge 1)—merge 1—(merge 0 or merge 1),
(b) and the path is merged to state S0 when the path connecting three successive states is (merge 0 or merge 2)—merge 2—(merge 0 or merge 2): and a step of producing the output signal as follows:
(a) the value of the output signal is made "0" when a state decided as described above is state S0 or state S3,
(b) and the value of the output signal is made "1" when the state being state S1 or state S2.

11. A Viterbi decoder having four playback states which are state S0, state S1, state S2, and state S3 and producing an NRZ playback data according to a Viterbi decoding method using a three-value playback signal having a value of "1," "0" or "−1" that is obtained by converting by a partial response (1, 1) encoding method a binary playback signal played back from a recording medium, for an NRZI recording data recorded to the recording medium after having been converted to channel bits while constraining the number of continuous non-inverse bits within a range of a minimum of "2" comprising:

condition calculation means for calculating a three-valve inverted playback signal −y, a first calculation result signal which indicates "y+0.5", and a second calculation result signal which indicates "−y+0.5" from the three-value playback signal "y" in a case in which the three-value playback signal is "y" (−1≦y≦1);

merge calculation means for calculating state metric m(S0) which is a reciprocal of a probability of taking state S0, state metric m(S1) which is a reciprocal of a probability of taking state S1, state metric m(S2) which is a reciprocal of a probability of taking state S2, and state metric m(S3) which is a reciprocal of a probability of taking state S3 using the three-value playback signal y, the three-value inverted playback signal −y, the first calculation result signal "y+0.5," and the second calculation result signal "−y+0.5" all of which are sent thereto from the condition calculation means and for judging merge 0, merge 1, merge 2, and merge 3 as follows:
(a) when state metric m(S2)<state metric m(S1) and state metric m(S0)<state metric m(S3), merge 0 is judged by carrying out the following calculations,
state metric m(S3)=state metric m(S2),
state metric m(S2)=state metric m(S2)+y+0.5,
state metric m(S1)=state metric m(S0), and
state metric m(S0)=state metric m(S0)−y+0.5;
(b) when state metric m(S2)<state metric m(S1) and state metric m(S0)≧state metric m(S3), merge 1 is judged by carrying out the following calculations,
state metric m(S3)=state metric m(S2),
state metric m(S2)=state metric m(S2)+y+0.5,
state metric m(S1)=state metric m(S0), and
state metric m(S0)=state metric m(S3)−y+0.5;
(c) when state metric m(S2)≧state metric m(S1) and state metric m(S0)<state metric m(S3), merge 2 is judged by carrying out the following calculations,
state metric m(S3)=state metric m(S2),
state metric m(S2)=state metric m(S1)+y+0.5,
state metric m(S1)=state metric m(S0), and
state metric m(S0)=state metric m(S0)−y+0.5;
(d) and when state metric m(S2)≧state metric m(S1) and state metric m(S0)≧state metric m(S3), merge 3 is judged by carrying out the following calculations,
state metric m(S3)=state metric m(S2),
state metric m(S2)=state metric m(S1)+y+0.5,
state metric m(S1)=state metric m(S0), and
state metric m(S0)=state metric m(S3)−y+0.5:

path merge calculation means for producing a signal to merge a path to state S2 when the path connecting three successive states is (merge 0 or merge 1)—merge 1—(merge 0 or merge 1) and a signal to merge a path to state S0 when the path connecting three successive states is (merge 0 or merge 2)—merge 2—(merge 0 or merge 2) based on a judging result of the merge calculation means; and path memory means for merging the path based on the signals sent thereto from the path merge calculation means and for making the value of the output signal "0" when a resulting judged state is state S0 or state S2 and making the value of the output signal "1" when the judged state is state S1 or state S3.

12. A Viterbi decoder having four playback states which are state S0, state S1, state S2, and state S3 and producing an NRZI playback data according to a Viterbi decoding method using a three-value playback signal having a value of "1," "0" or "−1" that is obtained by converting by a partial response (1, 1) encoding method a binary playback signal played back from a recording medium, for an NRZI recording data recorded to the recording medium after having been converted to channel bits while constraining the number of continuous non-inverse bits within a range of a minimum of "2" comprising:

condition calculation means for calculating a three-value inverted playback signal −y, a first calculation result signal which indicates "y+0.5," and a second calculation result signal which indicates "−y+0.5" from the three-value playback signal "y" in a case in which the three-value playback signal is "y" (−1≦y≦1), merge calculation means for calculating state metric m(S0) which is a reciprocal of a probability of taking state S0, state metric m(S1) which is a reciprocal of a probability of taking state S1, state metric m(S2) which is a reciprocal of a probability of taking state S2, and state metric m(S3) which is a reciprocal of a probability of taking state S3 using the three-value playback signal y, the three-value inverted playback signal −y, the first calculation result signal "y+0.5," and the second calculation result signal "−y+0.5" all of which are sent thereto from the condition calculation means and for judging merge 0, merge 1, merge 2, and merge 3 as follows:
(a) when state metric m(S2)<state metric m(S1) and state metric m(S0)<state metric m(S3), merge 0 is judged by carrying out the following calculations,
state metric m(S3)=state metric m(S2),
state metric m(S2)=state metric m(S2)+y+0.5,
state metric m(S1)=state metric m(S0), and
state metric m(S0)=state metric m(S0)−y+0.5;
(b) when state metric m(S2)<state metric m(S1) and state metric m(S0)≧state metric m(S3), merge 1 is judged by carrying out the following calculations,
state metric m(S3)=state metric m(S2),
state metric m(S2)=state metric m(S2)+y+0.5,
state metric m(S1)=state metric m(S0), and
state metric m(S0)=state metric m(S3)−y+0.5;
(c) when state metric m(S2)≧state metric m(S1) and state metric m(S0)<state metric m(S3), merge 2 is judged by carrying out the following calculations,
state metric m(S3)=state metric m(S2), state metric m(S2)=state metric m(S1)+y+0.5,
state metric m(S1)=state metric m(S0), and
state metric m(S0)=state metric m(S0)−y+0.5;

(d) and when state metric m(S2)≧state metric m(S1) and state metric m(S0)≧state metric m(S3), merge 3 is judged by carrying out the following calculations,
state metric m(S3)=state metric m(S2),
state metric m(S2)=state metric m(S1)+y+0.5,
state metric m(S1)=state metric m(S0), and
state metric m(S0)=state metric m(S3)−y+0.5:

path merge calculation means for producing a signal to merge a path to state S2 when the path connecting three successive states is (merge 0 or merge 1)—merge 1—(merge 0 or merge 1) and a signal to merge a path to state S0 when the path connecting three successive states is (merge 0 or merge 2)—merge 2—(merge 0 or merge 2) based on a judging result of the merge calculation means; and path memory means for merging the path based on the signals sent thereto from the path merge calculation means and for making the value of the output signal "0" when a resulting judged state is state S0 or state S3 and making the value of the output signal "1" when the judged state is state S1 or state S2.

13. A playback data detecting method for producing an NRZ playback data according to a Viterbi decoding method using a three-value playback signal obtained by converting according to a partial response (1, 1) encoding method a binary playback signal played back from a recording medium, for an NRZI recording data recorded to the recording medium after having been converted to channel bits while constraining the number of continuous non-inverse bits within a range of a minimum of "3," and using six playback states which are state S0, state S1, state S2, state S3, state S4, and state S5 comprising:

a step of making a state transition and producing an output signal as follows:
when the three-value playback signal of "1" is inputted during state S0, the transition is made to state S0 and the value of the output signal is made "0,"
when the three-value playback signal of "0" is inputted during state S0, the transition is made to state S1 and the value of the output signal is made "1,"
when the three-value playback signal of "−1" is inputted during state S1, the transition is made to state S2 and the value of the output signal is made "0,"
when the three-value playback signal of "−1" is inputted during state S2, the transition is made to state S3 and the value of the output signal is made "0,"
when the three-value playback signal of "−1" is inputted during state S3, the transition is made to state S3 and the value of the output signal is made "0,"
when the three-value playback signal of "0" is inputted during state S3, the transition is made to state S4 and the value of the output signal is made "1,"
when the three-value playback signal of "1" is inputted during state S4, the transition is made to state S5 and the value of the output signal is made "0,"
and when the three-value playback signal of "1" is inputted during state S5, the transition is made to state S0 and the value of the output signal is made "0:" and a step of performing bit error correcting by detecting an incorrect state and judging an original state when the three-value playback signal violating the above-described state transition rules is inputted.

14. The playback data detecting method of claim 13 comprising:

in a case in which a reciprocal of a probability of taking state S0 is state metric m(S0), a reciprocal of a probability of taking state S1 is state metric m(S1), a reciprocal of a probability of taking state S2 is state metric m(S2), a reciprocal of a probability of taking state S3 is state metric m(S3), a reciprocal of a probability of taking state S4 is state metric m(S4), and a reciprocal of a probability of taking state S5 is state metric m(S5), and the three-value playback signal is "y" (−1≦y≦1), a step of calculating "y+0.5" and "−y+0.5;"

a step of judging merge 0, merge 1, merge 2, and merge 3 as follows:

(a) when state metric m(S3)<state metric m(S2) and state metric m(S0)<state metric m(S5), merge 0 is judged by carrying out the following calculations,
state metric m(S5)=state metric m(S4)−y+0.5,
state metric m(S4)=state metric m(S3),
state metric m(S3)=state metric m(S3)+y+0.5,
state metric m(S2)=state metric m(S1)+y+0.5,
state metric m(S1)=state metric m(S0), and
state metric m(S0)=state metric m(S0)−y+0.5;

(b) when state metric m(S3)<state metric m(S2) and state metric m(S0)≧state metric m(S5), merge 1 is judged by carrying out the following calculations,
state metric m(S5)=state metric m(S4)−y+0.5,
state metric m(S4)=state metric m(S3),
state metric m(S3)=state metric m(S3)+y+0.5,
state metric m(S2)=state metric m(S1)+y+0.5,
state metric m(S1)=state metric m(S0), and
state metric m(S0)=state metric m(S5)−y+0.5;

(c) when state metric m(S3)≧state metric m(S2) and state metric m(S0)<state metric m(S5), merge 2 is judged by carrying out the following calculations,
state metric m(S5)=state metric m(S4)−y+0.5,
state metric m(S4)=state metric m(S3),
state metric m(S3)=state metric m(S2)+y+0.5,
state metric m(S2)=state metric m(S1)+y+0.5,
state metric m(S1)=state metric m(S0); and
state metric m(S0)=state metric m(S0)−y+0.5;

(d) and when state metric m(S3)≧state metric m(S2) and state metric m(S0)≧state metric m(S5), merge 3 is judged by carrying out the following calculations,
state metric m(S5)=state metric m(S4)−y+0.5,
state metric m(S4)=state metric m(S3),
state metric m(S3)=state metric m(S2)+y+0.5,
state metric m(S2)=state metric m(S1)+y+0.5,
state metric m(S1)=state metric m(S0), and
state metric m(S0)=state metric m(S5)−y+0.5:

a step of merging a path as follows:
(a) the path is merged to state S2 when the path connecting five successive states is (merge 0 or merge 1)—(merge 0 or merge 1)—merge 1—(merge 0 or merge 1)—(merge 0 or merge 1),
(b) and the path is merged to state S0 when the path connecting five successive states is (merge 0 or merge 2)—(merge 0 or merge 2)—merge 2—(merge 0 or merge 2)—(merge 0 or merge 2): and a step of producing the output signal as follows:
(a) the value of the output signal is made "0" when a state decided as described above is state S0, state S2, state S3, or state S5,
(b) and the value of the output signal is made "1" when the state is state S1 or state S4.

15. A playback data detecting method for producing an NRZI playback data according to a Viterbi decoding method using a three-value playback signal obtained by converting according to a partial response (1, 1) encoding method a binary playback signal played back from a recording medium, for an NRZI recording data recorded to the recording medium after having been converted to channel bits while constraining the number of continuous non-inverse bits within a range of a minimum of "3," and using six playback states which are state S0, state S1, state S2, state S3, state S4, and state S5 comprising:

a step of making a state transition and producing an output signal as follows:
when the three-value playback signal of "1" is inputted during state S0, the transition is made to state S0 and the value of the output signal is made "0,"
when the three-value playback signal of "0" is inputted during state S0, the transition is made to state S1 and the value of the output signal is made "1,"
when the three-value playback signal of "−1" is inputted during state S1, the transition is made to state S2 and the value of the output signal is made "1,"
when the three-value playback signal of "−1" is inputted during state S2, the transition is made to state S3 and the value of the output signal is made "1,"
when the three-value playback signal of "−1" is inputted during state S3, the transition is made to state S3 and the value of the output signal is made "1,"
when the three-value playback signal of "0" is inputted during state S3, the transition is made to state S4 and the value of the output signal is made "0,"
when the three-value playback signal of "1" is inputted during state S4, the transition is made to state S5 and the value of the output signal is made "0,"
and when the three-value playback signal of "1" is inputted during state S5, the transition is made to state S0 and the value of the output signal is made "0:" and a step of performing bit error correcting by detecting an incorrect state and judging an original state when the three-value playback signal violating the above-described state transition rules is inputted.

16. The playback data detecting method of claim 15 comprising:

in a case in which a reciprocal of a probability of taking state S0 is state metric m(S0), a reciprocal of a probability of taking state S1 is state metric m(S1), a reciprocal of a probability of taking state S2 is state metric m(S2), a reciprocal of a probability of taking state S3 is state metric m(S3), a reciprocal of a probability of taking state S4 is state metric m(S4), and a reciprocal of a probability of taking state S5 is state metric m(S5), and the three-value playback signal is "y" ($-1 \leq y \leq 1$), a step of calculating "y+0.5" and "−y+0.5;"

a step of judging merge 0, merge 1, merge 2, and merge 3 as follows:
(a) when state metric m(S3)<state metric m(S2) and state metric m(S0)<state metric m(S5), merge 0 is judged by carrying out the following calculations,
state metric m(S5)=state metric m(S4)−y+0.5,
state metric m(S4)=state metric m(S3),
state metric m(S3)=state metric m(S3)+y+0.5,
state metric m(S2)=state metric m(S1)+y+0.5,
state metric m(S1)=state metric m(S0), and
state metric m(S0)=state metric m(S0)−y+0.5;
(b) when state metric m(S3)<state metric m(S2) and state metric m(S0)≧state metric m(S5), merge 1 is judged by carrying out the following calculations,
state metric m(S5)=state metric m(S4)−y+0.5,
state metric m(S4)=state metric m(S3),
state metric m(S3)=state metric m(S3)+y+0.5,
state metric m(S2)=state metric m(S1)+y+0.5,
state metric m(S1)=state metric m(S0), and
state metric m(S0)=state metric m(S5)−y+0.5;
(c) when state metric m(S3)≧state metric m(S2) and state metric m(S0)<state metric m(S5), merge 2 is judged by carrying out the following calculations,
state metric m(S5)=state metric m(S4)−y+0.5,
state metric m(S4)=state metric m(S3),
state metric m(S3)=state metric m(S2)+y+0.5,
state metric m(S2)=state metric m(S1)+y+0.5,
state metric m(S1)=state metric m(S0), and
state metric m(S0)=state metric m(S0)−y+0.5;
(d) and when state metric m(S3)≧state metric m(S2) and state metric m(S0)≧state metric m(S5), merge 3 is judged by carrying out the following calculations,
state metric m(S5)=state metric m(S4)−y+0.5,
state metric m(S4)=state metric m(S3),
state metric m(S3)=state metric m(S2)+y+0.5,
state metric m(S2)=state metric m(S1)+y+0.5,
state metric m(S1)=state metric m(S0), and
state metric m(S0)=state metric m(S5)−y+0.5:

a step of merging a path as follows:
(a) the path is merged to state S2 when the path connecting five successive states is (merge 0 or merge 1)—(merge 0 or merge 1)—merge 1—(merge 0 or merge 1)—(merge 0 or merge 1),
(b) the path is merged to state S0 when the path connecting five successive states is (merge 0 or merge 2)—(merge 0 or merge 2)—merge 2—(merge 0 or merge 2)—(merge 0 or merge 2): and a step of producing the output signal as follows:
(a) the value of the output signal is made "0" when the state decided as described above is state S0, state S4 or state S5,
(b) the value of the output signal is made "1" when the state is state S1, state 2 or state S3.

17. A Viterbi decoder having six playback states which are state S0, state S1, state S2, state S3, state S4, and state S5 and producing an NRZ playback data according to a Viterbi decoding method using a three-value playback signal having the value "1," "0," or "−1" obtained by converting a binary playback signal according to a partial response (1, 1) encoding method and played back from a recording medium, for an NRZI recording data recorded to the recording medium after having been converted to channel bits while constraining the number of continuous non-inverse bits within a range of a minimum of "3" comprising:

condition calculation means for calculating a three-value inverted playback signal −y, a first calculation result signal which indicates "y+0.5," and a second calculation result signal which indicates "−y+0.5" from the three-value playback signal "y" in a case in which the three-value playback signal is "y" ($-1 \leq y \leq 1$);

merge calculation means for calculating state metric m(S0) which is a reciprocal of a probability of taking state S0, state metric m(S1) which is a reciprocal of a probability of taking state S1, state metric m(S2) which is a reciprocal of a probability of taking state S2, state metric m(S3) which is a reciprocal of a probability of taking state S3, state metric m(S4) which is a reciprocal of a probability of taking state S4, and state metric m(S5) which is a reciprocal of a probability of taking state S5 using the three-value playback signal y, the three-value inverted playback signal −y, the first calculation result signal "y+0.5," and the second calculation result signal "−y+0.5" all of which are sent thereto from the condition calculation means and for judging merge 0, merge 1, merge 2, and merge 3 as follows:

(a) when state metric m(S3)<state metric m(S2) and state metric m(S0)<state metric m(S5), merge 0 is judged by carrying out the following calculations,
state metric m(S5)=state metric m(S4)−y+0.5,
state metric m(S4)=state metric m(S3),
state metric m(S3)=state metric m(S3)+y+0.5,
state metric m(S2)=state metric m(S1)+y+0.5,
state metric m(S1)=state metric m(S0), and
state metric m(S0)=state metric m(S0)−y+0.5;

(b) when state metric m(S3)<state metric m(S2) and state metric m(S0)≧state metric m(S5), merge 1 is judged by carrying out the following calculations,
state metric m(S5)=state metric m(S4)−y+0.5,
state metric m(S4)=state metric m(S3),
state metric m(S3)=state metric m(S3)+y+0.5,
state metric m(S2)=state metric m(S1)+y+0.5,
state metric m(S1)=state metric m(S0), and
state metric m(S0)=state metric m(S5)−y+0.5;

(c) when state metric m(S3)≧state metric m(S2) and state metric m(S0)<state metric m(S5), merge 2 is judged by carrying out the following calculations,
state metric m(S5)=state metric m(S4)−y+0.5,
state metric m(S4)=state metric m(S3),
state metric m(S3)=state metric m(S2)+y+0.5,
state metric m(S2)=state metric m(S1)+y+0.5,
state metric m(S1)=state metric m(S0), and
state metric m(S0)=state metric m(S0)−y+0.5;

(d) and when state metric m(S3)≧state metric m(S2) and state metric m(S0)≧state metric m(S5), merge 3 is judged by carrying out the following calculations,
state metric m(S5)=state metric m(S4)−y+0.5,
state metric m(S4)=state metric m(S3),
state metric m(S3)=state metric m(S2)+y+0.5,
state metric m(S2)=state metric m(S1)+y+0.5,
state metric m(S1)=state metric m(S0), and
state metric m(S0)=state metric m(S5)−y+0.5:

path merge calculation means for producing a signal to merge a path to state S2 when the path connecting five successive states is (merge 0 or merge 1)—(merge 0 or merge 1)—merge 1—(merge 0 or merge 1)—(merge 0 or merge 1) and a signal to merge a path to state S0 when the path connecting five successive states is (merge 0 or merge 2)—(merge 0 or merge 2)—merge 2—(merge 0 or merge 2)—(merge 0 or merge 2) based on a judging result of the merge calculation means; and path memory means for merging the path based on the signals sent thereto from the path merge calculation means and making the value of the output signal "0" when the resulting judged state is state S0, state S2, state S3, or state S5 and making the value of the output signal "1" when the judged state is state S1 or state S4.

18. A Viterbi decoder having six playback states which are state S0, state S1, state S2, state S3, state S4, and state S5 and producing an NRZI playback data according to a Viterbi decoding method using a three-value playback signal having the value "1," "0," or "−1" obtained by converting a binary playback signal according to a partial response (1, 1) encoding method and played back from a recording medium, for an NRZI recording data recorded to the recording medium after having been converted to channel bits while constraining the number of continuous non-inverse bits within a range of a minimum of "3" comprising:

condition calculation means for calculating, a three-value inverted playback signal −y, a first calculation result signal which indicates "y+0.5," and a second calculation result signal which indicates "−y+0.5" from the three-value playback signal "y" in a case in which the three-value playback signal is "y" (−1≦y≦1);

merge calculation means for calculating state metric m(S0) which is a reciprocal of a probability of taking state S0, state metric m(S1) which is a reciprocal of a probability of taking state S1, state metric m(S2) which is a reciprocal of a probability of taking state S2, state metric m(S3) which is a reciprocal of a probability of taking state S3, state metric m(S4) which is a reciprocal of a probability of taking state S4, and state metric m(S5) which is a reciprocal of a probability of taking state S5 using the three-value playback signal y, the three-value inverted playback signal −y, the first calculation result signal "y+0.5," and the second calculation result signal "−y+0.5" sent from the condition calculation means and for judging merge 0, merge 1, merge 2, and merge 3 as follows:

(a) when state metric m(S3)<state metric m(S2) and state metric m(S0)<state metric m(S5), merge 0 is judged by carrying out the following calculations,
state metric m(S5)=state metric m(S4)−y+0.5,
state metric m(S4)=state metric m(S3),
state metric m(S3)=state metric m(S3)+y+0.5,
state metric m(S2)=state metric m(S1)+y+0.5,
state metric m(S1)=state metric m(S0), and
state metric m(S0)=state metric m(S0)−y+0.5;

(b) when state metric m(S3)<state metric m(S2) and state metric m(S0)≧state metric m(S5), merge 1 is judged by carrying out the following calculations,
state metric m(S5)=state metric m(S4)−y+0.5,
state metric m(S4)=state metric m(S3),
state metric m(S3)=state metric m(S3)+y+0.5,
state metric m(S2)=state metric m(S1)+y+0.5,
state metric m(S1)=state metric m(S0), and
state metric m(S0)=state metric m(S5)−y+0.5;

(c) when state metric m(S3)≧state metric m(S2) and state metric m(S0)<state metric m(S5), merge 2 is judged by carrying out the following calculations,
state metric m(S5)=state metric m(S4)−y+0.5,
state metric m(S4)=state metric m(S3),
state metric m(S3)=state metric m(S2)+y+0.5,
state metric m(S2)=state metric m(S1)+y+0.5,
state metric m(S1)=state metric m(S0), and
state metric m(S0)=state metric m(S0)−y+0.5;

(d) and when state metric m(S3)≧state metric m(S2) and state metric m(S0)≧state metric m(SS), merge 3 is judged by carrying out the following calculations,
state metric m(S5)=state metric m(S4)−y+0.5,
state metric m(S4)=state metric m(S3),
state metric m(S3)=state metric m(S2)+y+0.5,
state metric m(S2)=state metric m(S1)+y+0.5,
state metric m(S1)=state metric m(S0), and
state metric m(S0)=state metric m(S5)−y+0.5:

path merge calculation means for producing a signal to merge a path to state S2 when the path connecting five successive states is (merge 0 or merge 1)—(merge 0 or merge 1) —merge 1—(merge 0 or merge 1)—(merge 0 or merge 1) and a signal to merge a path to state S0 when the path connecting five successive states is (merge 0 or merge 2)—(merge 0 or merge 2)—merge 2—(merge 0 or merge 2)—(merge 0 or merge 2) based on a judging result of the merge calculation means; and path memory means for merging the path based on the signals sent thereto from the path merge calculation means and for making the value of the output signal "0"

when a resulting judged state is state S0, state S4, or state S5 and making the value of the output signal "1" when the judged state is state S1, state 2, or state S3.

19. A playback data detecting method for producing playback data by using a three-value conversion signal having a value of "1," "0," or "−1" which is obtained by sampling a signal, which is obtained by converting a binary playback signal according to a partial response (1, 1) encoding method and played back from a recording medium, with a first sampling clock synchronous with a recording data and a binary conversion signal having a value of "1" or "−1" which is obtained by sampling the signal with a second sampling clock with phase shifted by one half period with relation to the first sampling clock, for the recording data recorded to the recording medium after having been converted to channel bits while constraining the number of continuous non-inverse bits within a range of a minimum of "2" comprising:

a step of decoding the playback signal using four playback states.

20. A playback data detecting method for producing an NRZ playback data according to a Viterbi decoding method using a three-value conversion signal having a value of "1," "0," or "−1" which is obtained by sampling a signal, which is obtained by converting a binary playback signal according to a partial response (1, 1) encoding method and played back from a recording medium, with a first sampling clock synchronous with an NRZI recording data and a binary conversion signal having a value of "1" or "−1" which is obtained by sampling the signal with a second sampling clock with phase shifted by one half period with relation to the first sampling clock, for the NRZI recording data recorded to the recording medium after having been converted to channel bits while constraining the number of continuous non-inverse bits within a range of a minimum of "2," and using four states which are state S0, state S1, state S2, and state S3 comprising;

a step for making a state transition and producing an output signal as follows:

when the three-value conversion signal of "−1" and the binary conversion signal of "−1" are continuously inputted during state S0, the transition is made to state S0 and the value of the output signal is made "0,"

when the three-value conversion signal of "0" and the binary conversion signal of "1" are continuously inputted during state S0, the transition is made to state S1 and the value of the output signal is made "1,"

when the three-value conversion signal of "1" and the binary conversion signal of "1" are continuously inputted during state S1, the transition is made to state S2 and the value of the output signal is made "0,"

when the three-value conversion signal of "1" and the binary conversion signal of "1" are continuously inputted during state S2, the transition is made to state S2 and the value of the output signal is made "0,"

when the three-value conversion signal of "0" and the binary conversion signal of "−1" are continuously inputted during state S2, the transition is made to state S3 and the value of the output signal is made "1,"

and when the three-value conversion signal of "−1" and the binary conversion signal of "−1" are continuously inputted during state S3, the transition is made to state S0 and the value of the output signal is made "0;" and a step of performing bit error correcting by detecting an incorrect state and judging an original state when the three-value conversion signal and the binary conversion signal violating the above-described state transition rules are continuously inputted.

21. The playback data detecting method of claim 20 comprising:

in a case in which a reciprocal of a probability of taking state S0 is state metric m(S0), a reciprocal of a probability of taking state S1 is state metric m(S1), a reciprocal of a probability of taking state S2 is state metric m(S2), a reciprocal of a probability of taking state S3 is state metric m(S3), the three-value conversion signal is "$y_3$" ($-1 \leq y_3 \leq 1$) and the binary conversion signal is "$y_2$" ($-1 \leq y_2 \leq 1$), a step of calculating "$-y_2$," "$-y_3+0.5$," and "$y_3+0.5$;"

a step of judging merge 0, merge 1, merge 2, and merge 3 as follows:

(a) when state metric m(S2)<state metric m(S1) and state metric m(S0)<state metric m(S3), merge 0 is judged by carrying out the following calculations,
state metric m(S3)=state metric m(S2)+$y_2$,
state metric m(S2)=state metric m(S2)−$y_3$+0.5−$y_2$,
state metric m(S1)=state metric m(S0)−$y_2$, and
state metric m(S0)=state metric m(S0)+$y_3$+0.5+$y_2$;

(b) when state metric m(S2)<state metric m(S1) and state metric m(S0)≧state metric m(S3), merge 1 is judged by carrying out the following calculations,
state metric m(S3)=state metric m(S2)+$y_2$,
state metric m(S2)=state metric m(S2)−$y_3$+0.5−$y_2$,
state metric m(S1)=state metric m(S0)−$y_2$, and
state metric m(S0)=state metric m(S3)+$y_3$+0.5+$y_2$;

(c) when state metric m(S2)≧state metric m(S1) and state metric m(S0)<state metric m(S3), merge 2 is judged by carrying out the following calculations,
state metric m(S3)=state metric m(S2)+$y_2$,
state metric m(S2)=state metric m(S1)−$y_3$+0.5−$y_2$,
state metric m(S1)=state metric m(S0)−$y_2$, and
state metric m(S0)=state metric m(S0)+$y_3$+0.5+$y_2$;

(d) and when state metric m(S2)≧state metric m(S1) and state metric m(S0)≧state metric m(S3), merge 3 is judged by carrying out the following calculations,
state metric m(S3)=state metric m(S2)+$y_2$,
state metric m(S2)=state metric m(S1)−$y_3$+0.5−$y_2$,
state metric m(S1)=state metric m(S0)−$y_2$, and
state metric m(S0)=state metric m(S3)+$y_3$+0.5+ $y_2$:

a step of merging a path as follows:
(a) the path is merged to state S2 when the path connecting three successive states is (merge 0 or merge 1)—merge 1—(merge 0 or merge 1); and
(b) the path is merged to state S0 when the path joining three successive states is (merge 0 or merge 2)—merge 2—(merge 0 or merge 2): and a step of producing the output signal as follows:
(a) the value of the output data is made "0" when a state decided as described above is state S0 or state S2; and
(b) the value of the output data is made "1" when the state is state S1 or state S3.

22. A playback data detecting method for producing an NRZI playback data according to a Viterbi decoding method using a three-value conversion signal having a value of "1," "0," or "−1" which is obtained by sampling a signal, which is obtained by converting a binary playback signal according to a partial response (1, 1) encoding method and played back from a recording medium, with a first sampling clock synchronous with an NRZI recording data and a binary conversion signal having a value of "1" or "−1" which is obtained by sampling the signal with a second sampling clock with phase shifted by one half period with relation to the first sampling clock, for the NRZI recording data recorded to the recording medium after having been converted to channel bits while constraining the number of continuous non-inverse bits within a range of a minimum of "2," and using four states which are state S0, state S1, state S2, and state S3 comprising;

a step for making a state transition and producing an output signal as follows:
when the three-value conversion signal of "−1" and the binary conversion signal of "−1" are continuously inputted during state S0, the transition is made to state S0 and the value of the output signal is made "0,"
when the three-value conversion signal of "0" and the binary conversion signal of "1" are continuously inputted during state S0, the transition is made to state S1 and the value of the output signal is made "1,"
when the three-value conversion signal of "1" and the binary conversion signal of "1" are continuously inputted during state S1, the transition is made to state S2 and the value of the output signal is made "1,"
when the three-value conversion signal of "1" and the binary conversion signal of "1" are continuously inputted during state S2, the transition is made to state S2 and the value of the output signal is made "1,"
when the three-value conversion signal of "0" and the binary conversion signal of "−1" are continuously inputted during state S2, the transition is made to state S3 and the value of the output signal is made "0,"
and when the three-value conversion signal of "−1" and the binary conversion signal of "−1" are continuously inputted during state S3, the transition is made to state S0 and the value of the output signal is made "0;" and a step of performing bit error correcting by detecting an incorrect state and judging an original state when the three-value conversion signal and the binary conversion signal violating the above-described state transition rules are continuously inputted.

23. The playback data detecting method of claim 22 comprising:

in a case in which a reciprocal of a probability of taking state S0 is state metric m(S0), a reciprocal of a probability of taking state S1 is state metric m(S1), a reciprocal of a probability of taking state S2 is state metric m(S2), a reciprocal of a probability of taking state S3 is state metric m(S3), the three-value conversion signal is "$y_3$" ($-1 \leq y_3 \leq 1$) and the binary conversion signal is "$y_2$" ($-1 \leq y_2 \leq 1$), a step of calculating "$-y_2$," "$-y_3+0.5$," and "$y_3+0.5$;"

a step of judging merge 0, merge 1, merge 2, and merge 3 as follows:
(a) when state metric m(S2)<state metric m(S1) and state metric m(S0)<state metric m(S3), merge 0 is judged by carrying out the following calculations,
state metric m(S3)=state metric m(S2)+$y_2$,
state metric m(S2)=state metric m(S2)−$y_3$+0.5−$y_2$,
state metric m(S1)=state metric m(S0)−$y_2$, and
state metric m(S0)=state metric m(S0)+$y_3$+0.5+$y_2$;

(b) when state metric m(S2)<state metric m(S1) and state metric m(S0)≧state metric m(S3), merge 1 is judged by carrying out the following calculations,
state metric m(S3)=state metric m(S2)+$y_2$,
state metric m(S2)=state metric m(S2)−$y_3$+0.5−$y_2$,
state metric m(S1)=state metric m(S0)−$y_2$, and
state metric m(S0)=state metric m(S3)+$y_3$+0.5+$y_2$;

(c) when state metric m(S2)≧state metric m(S1) and state metric m(S0)<state metric m(S3), merge 2 is judged by carrying out the following calculations,
state metric m(S3)=state metric m(S2)+$y_2$,
state metric m(S2)=state metric m(S1)−$y_3$+0.5−$y_2$,
state metric m(S1)=state metric m(S0)−$y_2$, and
state metric m(S0)=state metric m(S0)+$y_3$+0.5+ $y_2$;

(d) and when state metric m(S2)≧state metric m(S1) and state metric m(S0)≧state metric m(S3), merge 3 is judged by carrying out the following calculations,
state metric m(S3)=state metric m(S2)+$y_2$,
state metric m(S2)=state metric m(S1)−$y_3$+0.5−$y_2$,
state metric m(S1)=state metric m(S0)−$y_2$, and
state metric m(S0)=state metric m(S3)+$y_3$+0.5+$y_2$:

a step of merging a path as follows:
(a) the path is merged to state S2 when the path connecting three successive states is (merge 0 or merge 1)—merge 1—(merge 0 or merge 1); and
(b) the path is merged to state S0 when the path joining three successive states is (merge 0 or merge 2)__merge 2__(merge 0 or merge 2): and a step of producing the output signal as follows:
(a) the value of the output data is made "0" when a state decided as described above is state S0 or state S3; and
(b) the value of the output data is made "1" when the state is state S1 or state S2.

24. A Viterbi decoder having four playback states which are state S0, state S1, state S2, and state S3 and producing an NRZ playback data according to a Viterbi decoding method using a playback signal obtained by converting a binary playback signal according to a partial response (1, 1) encoding method and played back from a recording medium, for an NRZI recording data recorded to the recording medium after having been converted to channel bits while constraining the number of continuous non-inverse bits within a range of a minimum of "2," comprising:

sampling means for obtaining a three-value conversion signal having a value of "1," "0," or "−1" by sampling the signal with a first sampling clock which is synchronous with the recording data and a binary conversion signal having a value of "1" or "−1" by sampling the signal with a second sampling clock which has phase shifted by one half period with relation to the first sampling clock;

condition calculation means for calculating a binary inverted conversion signal "$-y_2$," a first calculation result signal which indicates "$-y_3+0.5-y_2$," and a second calculation result signal which indicates "$y_3+0.5-y_2$" from the three-value conversion signal $y_3$ and the binary conversion signal $y_2$ in a case in which the three-value conversion signal is "$y_3$" ($-1 \leq y_3 \leq 1$) and the binary conversion signal is "$y_2$" ($-1 \leq y_2 \leq 1$);

merge calculation means for calculating state metric m(S0) which is a reciprocal of a probability of taking state S0, state metric m(S1) which is a reciprocal of a probability of taking state S1, state metric m(S2) which is a reciprocal of a probability of taking state S2, and state metric m(S3) which is a reciprocal of a probability of taking state S3 using the three-value conversion signal $y_3$, the binary inverted conversion signal $-y_2$, the first calculation result signal "$-y_3+0.5-y_2$," and the second calculation result signal "$y_3+0.5-y_2$" all of which are sent thereto from the condition calculation means, and for judging merge 0, merge 1, merge 2, and merge 3 as follows:

(a) when state metric m(S2)<state metric m(S1) and state metric m(S0)<state metric m(S3), merge 0 is judged by carrying out the following calculations,
state metric m(S3)=state metric m(S2)+$y_2$,
state metric m(S2)=state metric m(S2)−$y_3$+0.5−$y_2$,
state metric m(S1)=state metric m(S0)−$y_2$, and
state metric m(S0)=state metric m(S0)+$y_3$+0.5+$y_2$;

(b) when state metric m(S2)<state metric m(S1) and state metric m(S0)≧state metric m(S3), merge 1 is judged by carrying out the following calculations,
state metric m(S3)=state metric m(S2)+$y_2$,
state metric m(S2)=state metric m(S2)−$y_3$+0.5−$y_2$,
state metric m(S1)=state metric m(S0)−$y_2$, and
state metric m(S0)=state metric m(S3)+$y_3$+0.5+$y_2$;

(c) when state metric m(S2)≧state metric m(S1) and state metric m(S0)<state metric m(S3), merge 2 is judged by carrying out the following calculations,
state metric m(S3)=state metric m(S2)+$y_2$,
state metric m(S2)=state metric m(S1)−$y_3$+0.5−$y_2$,
state metric m(S1)=state metric m(S0)−$y_2$, and
state metric m(S0)=state metric m(S0)+$y_3$+0.5+$y_2$;

(d) and when state metric m(S2)≧state metric m(S1) and state metric m(S0)≧state metric m(S3), merge 3 is judged by carrying out the following calculations,
state metric m(S3)=state metric m(S2)+$y_2$,
state metric m(S2)=state metric m(S1)−$y_3$+0.5−$y_2$,
state metric m(S1)=state metric m(S0)−$y_2$, and
state metric m(S0)=state metric m(S3)+$y_3$+0.5+$y_2$:

path merge calculation means for producing a signal to merge a path to state S2 when the path connecting three successive states is (merge 0 or merge 1)—merge 1—(merge 0 or merge 1) and a signal to merge a path to state S0 when the path connecting three successive states is (merge 0 or merge 2)—merge 2—(merge 0 or merge 2) based on a judging result of the merge calculation means; and path memory means for merging the path based on the signals sent thereto from the path merge calculation means and for producing the output signal by making the value of the output signal "0" when a resulting judged state is state S0 or state S2 and making the value of the output signal "1" when the judged state is state S1 or state S3.

25. A Viterbi decoder having four playback states which are state S0, state S1, state S2, and state S3 and producing an NRZI playback data according to a Viterbi decoding method using a playback signal obtained by converting a binary playback signal according to a partial response (1, 1) encoding method and played back from a recording medium, for an NRZI recording data recorded to the recording medium after having been converted to channel bits while constraining the number of continuous non-inverse bits within a range of a minimum of "2," comprising:

sampling means for obtaining a three-value conversion signal having a value of "1," "0," or "−1" by sampling the signal with a first sampling clock which is synchronous with the recording data and a binary conversion signal having a value of "1" or "−1" by sampling the signal with a second sampling clock which has phase shifted by one half period with relation to the first sampling clock;

condition calculation means for calculating a binary inverted conversion signal "−$y_2$," a first calculation result signal which indicates "−$y_3$+0.5−$y_2$," and a second calculation result signal which indicates "$y_3$+0.5−$y_2$" from the three-value conversion signal $y_3$ and the binary conversion signal $y_2$ in a case in which the three-value conversion signal is "$y_3$" ($-1 \leq y_3 \leq 1$) and the binary conversion signal is "$y_2$" ($-1 \leq y_2 \leq 1$);

merge calculation means for calculating state metric m(S0) which is a reciprocal of a probability of taking state S0, state metric m(S1) which is a reciprocal of a probability of taking state S1, state metric m(S2) which is a reciprocal of a probability of taking state S2, and state metric m(S3) which is a reciprocal of a probability of taking state S3 using the three-value conversion signal $y_3$, the binary inverted conversion signal −$y_2$, the first calculation result signal "−$y_3$+0.5−$y_2$," and the second calculation result signal "$y_3$+0.5−$y_2$" all of which are sent thereto from the condition calculation means, and for judging merge 0, merge 1, merge 2, and merge 3 as follows:

(a) when state metric m(S2)<state metric m(S1) and state metric m(S0)<state metric m(S3), merge 0 is judged by carrying out the following calculations,
state metric m(S3)=state metric m(S2)+$y_2$,
state metric m(S2)=state metric m(S2)−$y_3$+0.5−$y_2$,
state metric m(S1)=state metric m(S0)−$y_2$, and
state metric m(S0)=state metric m(S0)+$y_3$+0.5+$y_2$;

(b) when state metric m(S2)<state metric m(S1) and state metric m(S0)≧state metric m(S3), merge 1 is judged by carrying out the following calculations,
state metric m(S3)=state metric m(S2)+$y_2$,
state metric m(S2)=state metric m(S2)−$y_3$+0.5−$y_2$,
state metric m(S1)=state metric m(S0)−$y_2$, and
state metric m(S0)=state metric m(S3)+$y_3$+0.5+$y_2$;

(c) when state metric m(S2)≧state metric m(S1) and state metric m(S0)<state metric m(S3), merge 2 is judged by carrying out the following calculations,
state metric m(S3)=state metric m(S2)+$y_2$,
state metric m(S2)=state metric m(S1)−$y_3$+0.5−$y_2$,
state metric m(S1)=state metric m(S0)−$y_2$, and
state metric m(S0)=state metric m(S0)+$y_3$+0.5+$y_2$;

(d) and when state metric m(S2)≧state metric m(S1) and state metric m(S0)≧state metric m(S3), merge 3 is judged by carrying out the following calculations,
state metric m(S3)=state metric m(S2)+$y_2$,
state metric m(S2)=state metric m(S1)−$y_3$+0.5−$y_2$,
state metric m(S1)=state metric m(S0)−$y_2$, and
state metric m(S0)=state metric m(S3)+$y_3$+0.5+$y_2$:

path merge calculation means for producing a signal to merge a path to state S2 when the path connecting three successive states is (merge 0 or merge 1)—merge 1—(merge 0 or merge 1) and a signal to merge a path to state S0 when the path connecting three successive states is (merge 0 or merge 2)—merge 2—(merge 0 or merge 2) based on a judging result of the merge calculation means; and path memory means for merging the path based on the signals sent thereto from the path merge calculation means and for producing the output signal by making the value of the output signal "0" when a resulting judged state is state S0 or state S3 and making the value of the output signal "1" when the judged state is state S1 or state S2.

* * * * *